(12) United States Patent
Ratnam et al.

(10) Patent No.: US 9,859,337 B2
(45) Date of Patent: Jan. 2, 2018

(54) THREE-DIMENSIONAL MEMORY DEVICE WITH VERTICAL SEMICONDUCTOR BIT LINES LOCATED IN RECESSES AND METHOD OF MAKING THEREOF

(71) Applicant: SANDISK TECHNOLOGIES LLC, Plano, TX (US)

(72) Inventors: Perumal Ratnam, Fremont, CA (US); Abhijit Bandyopadhyay, San Jose, CA (US); Christopher J. Petti, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/207,042

(22) Filed: Jul. 11, 2016

(65) Prior Publication Data
US 2017/0250224 A1 Aug. 31, 2017

Related U.S. Application Data

(60) Provisional application No. 62/300,262, filed on Feb. 26, 2016.

(51) Int. Cl.
*H01L 27/24* (2006.01)
*H01L 45/00* (2006.01)
(Continued)

(52) U.S. Cl.
CPC ........ *H01L 27/2481* (2013.01); *H01L 21/225* (2013.01); *H01L 23/528* (2013.01);
(Continued)

(58) Field of Classification Search
None
See application file for complete search history.

(56) References Cited

U.S. PATENT DOCUMENTS

2013/0043455 A1 2/2013 Bateman
2015/0263069 A1 9/2015 Jo
(Continued)

FOREIGN PATENT DOCUMENTS

WO WO 2007/004843 A1 1/2007

OTHER PUBLICATIONS

U.S. Appl. No. 14/715,562, filed May 18, 2015, SanDisk 3D LLC.
U.S. Appl. No. 14/715,566, filed May 18, 2015, SanDisk 3D LLC.

*Primary Examiner* — Whitney T Moore
(74) *Attorney, Agent, or Firm* — The Marbury Law Group PLLC

(57) ABSTRACT

A three-dimensional memory device includes an alternating stack of electrically conductive layers and insulating layers located over a top surface of a substrate, semiconductor local bit lines extending perpendicular to the top surface of the substrate, and resistivity switching memory elements located at each overlap region between the electrically conductive layers and the semiconductor local bit lines. Each of the semiconductor local bit lines includes a plurality of drain regions located at each level of the electrically conductive layers, and having a doping of a first conductivity type, and a semiconductor channel vertically extending from a level of a bottommost electrically conductive layer within the alternating stack to a level of a topmost electrically conductive layer within the alternating stack, and contacting the plurality of drain regions within the semiconductor local bit line.

28 Claims, 48 Drawing Sheets

(51) Int. Cl.
    *H01L 23/528*     (2006.01)
    *H01L 29/08*     (2006.01)
    *H01L 29/10*     (2006.01)
    *H01L 29/66*     (2006.01)
    *H01L 21/225*     (2006.01)

(52) U.S. Cl.
    CPC ...... *H01L 27/2454* (2013.01); *H01L 29/0847* (2013.01); *H01L 29/1033* (2013.01); *H01L 29/66666* (2013.01); *H01L 45/1233* (2013.01); *H01L 45/16* (2013.01)

(56) References Cited

U.S. PATENT DOCUMENTS

| | | | |
|---|---|---|---|
| 2016/0019952 A1* | 1/2016 | Ratnam | G11C 13/004 365/148 |
| 2016/0020255 A1* | 1/2016 | Ratnam | G11C 13/004 257/4 |
| 2017/0077184 A1* | 3/2017 | Kikuchi | H01L 27/2436 |

\* cited by examiner

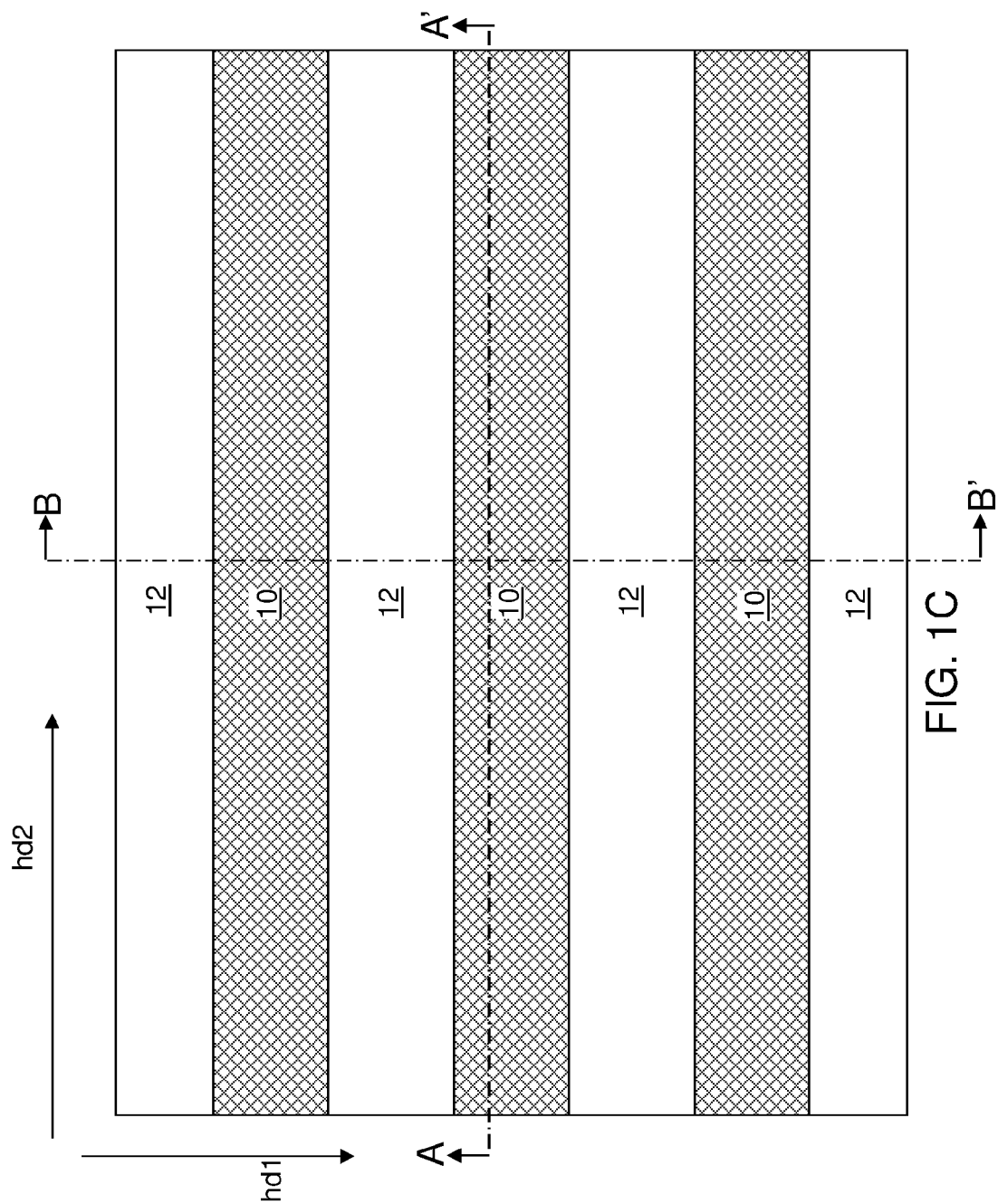

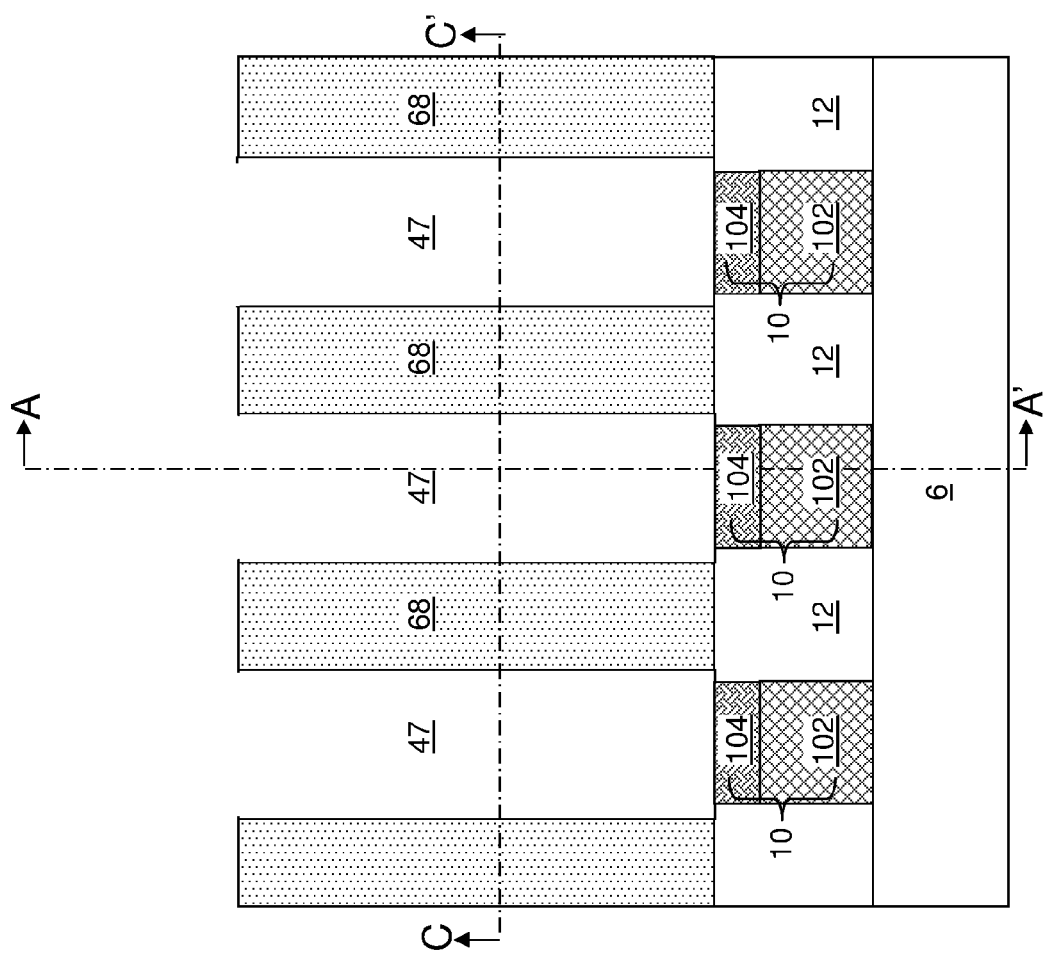

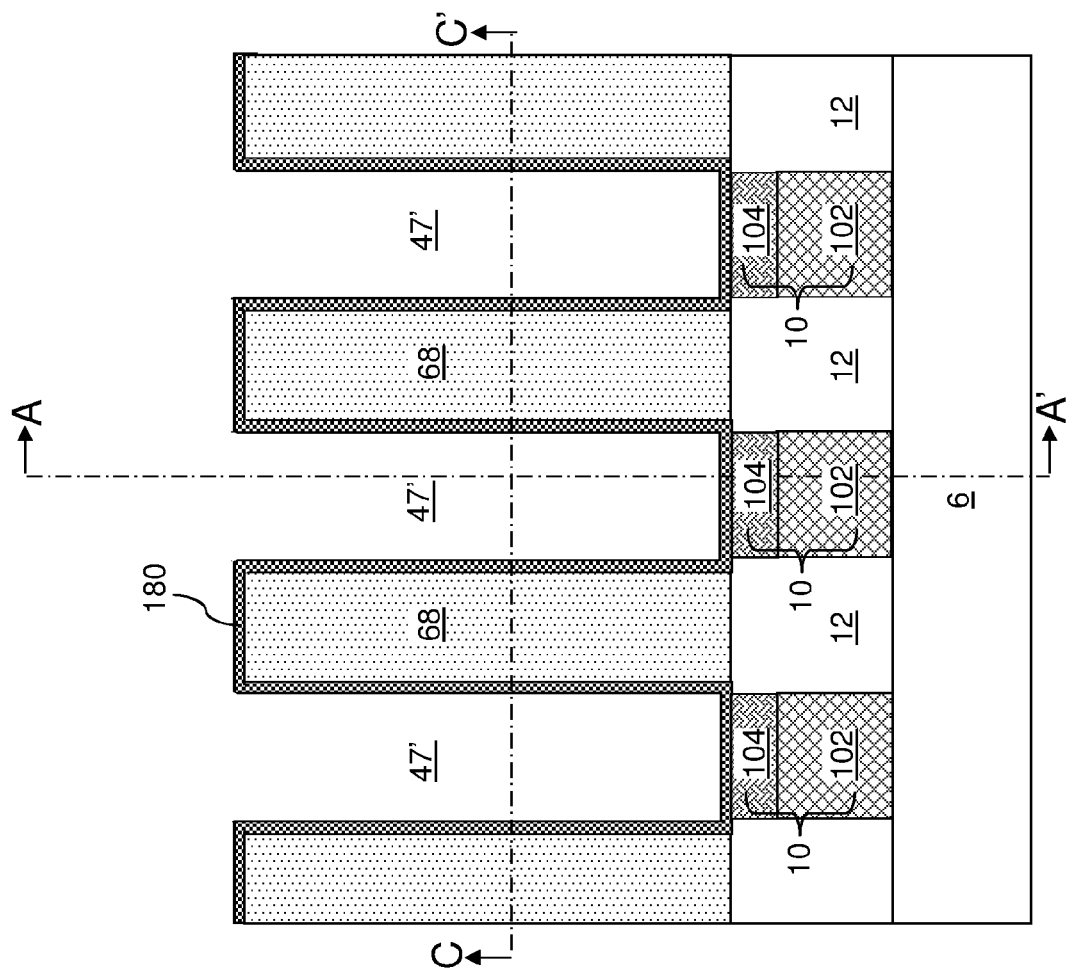

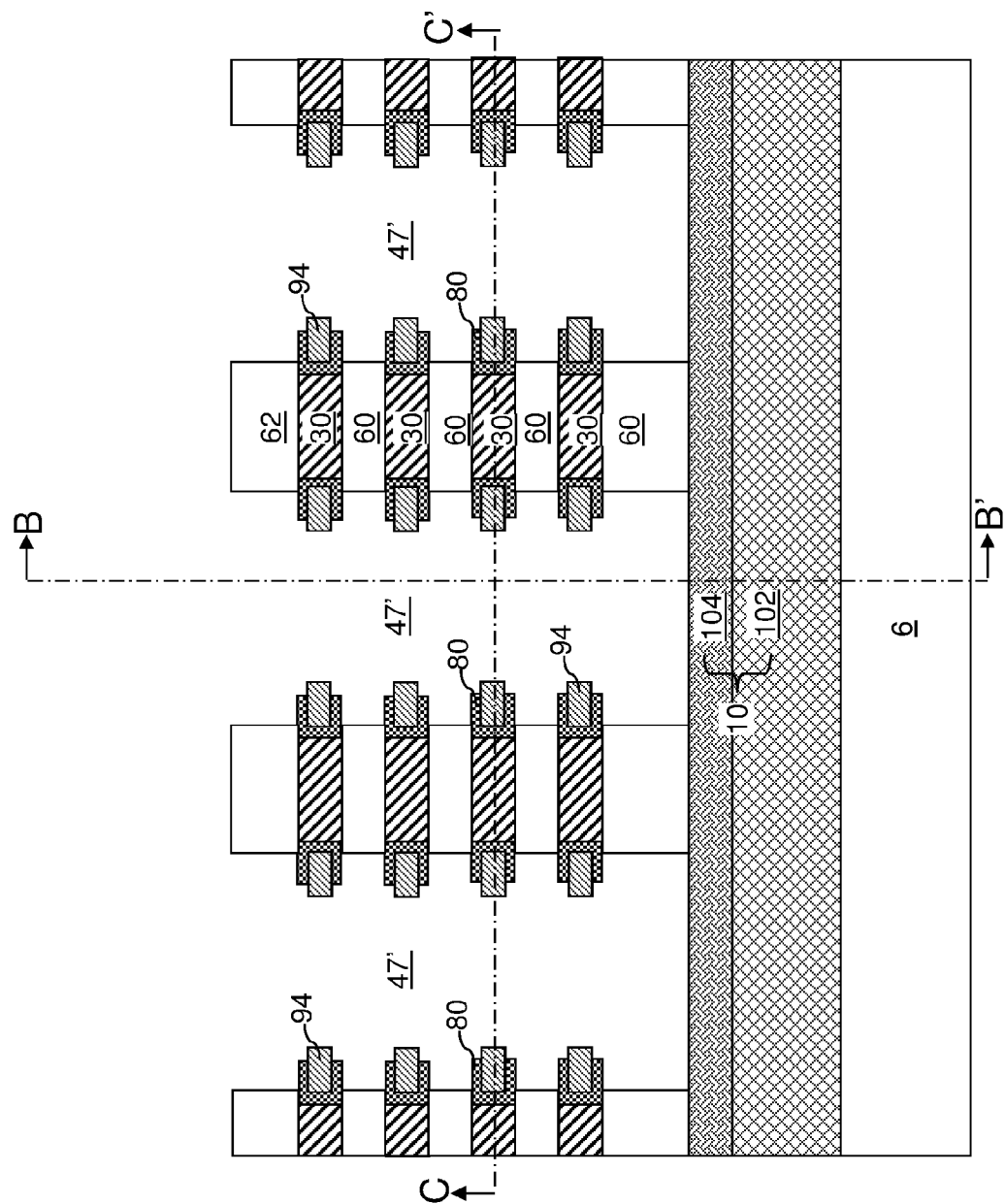

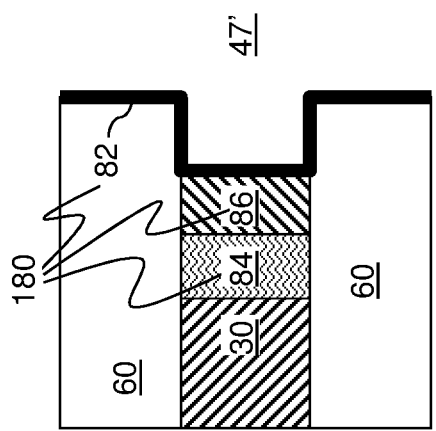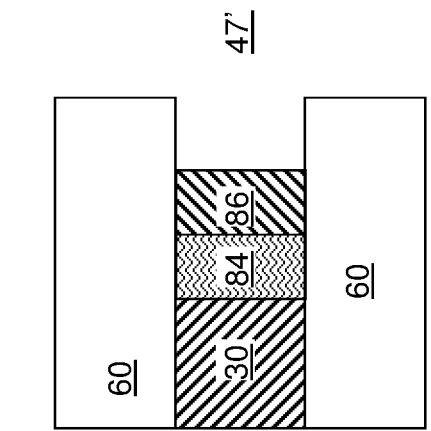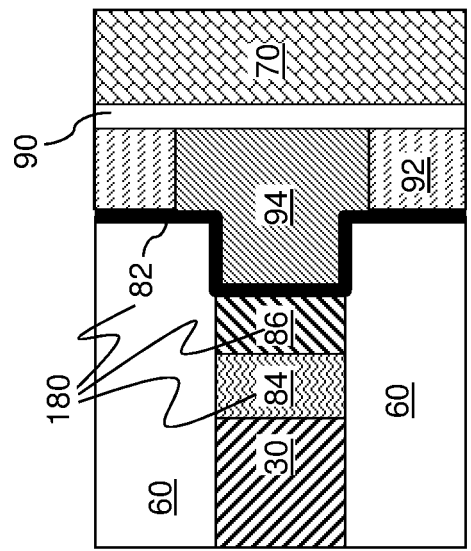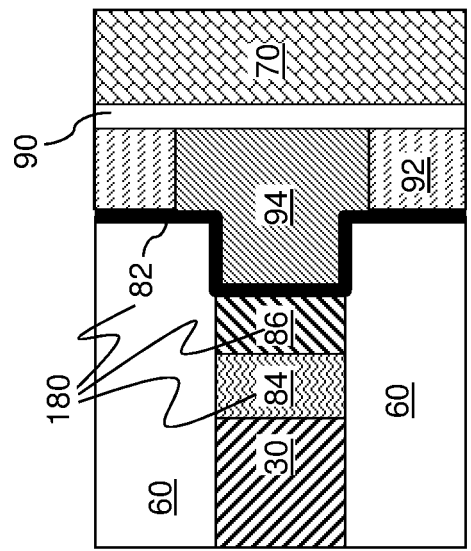

THREE-DIMENSIONAL MEMORY DEVICE WITH VERTICAL SEMICONDUCTOR BIT LINES LOCATED IN RECESSES AND METHOD OF MAKING THEREOF

FIELD

The present disclosure relates generally to the field of semiconductor devices and specifically to three-dimensional memory devices including recessed semiconductor local bit lines, and methods of making the same.

BACKGROUND

A resistance random access memory, or a "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a three-dimensional memory device includes an alternating stack of electrically conductive layers and insulating layers located over a top surface of a substrate, semiconductor local bit lines extending perpendicular to the top surface of the substrate, and resistivity switching memory elements located at each overlap region between the electrically conductive layers and the semiconductor local bit lines. Each of the semiconductor local bit lines includes a plurality of drain regions located at each level of the electrically conductive layers, and having a doping of a first conductivity type, and a semiconductor channel vertically extending from a level of a bottommost electrically conductive layer within the alternating stack to a level of a topmost electrically conductive layer within the alternating stack, and contacting the plurality of drain regions within the semiconductor local bit line.

According to another aspect of the present disclosure, a method of making a three-dimensional memory device comprises forming an alternating stack of insulating layers and spacer material layers over a substrate, patterning the alternating stack to form bit line cavities extending through the alternating stack, laterally recessing sidewalls of the spacer material layers in the bit line cavities with respect to sidewalls of the insulating layers to form lateral recesses, forming drain regions in the lateral recesses, each of the drain regions being a doped semiconductor region having a doping of a first conductivity type, and forming a semiconductor channel layer in the bit line cavities over the drain regions and over the sidewalls of the insulating layers.

According to another aspect of the present disclosure a three-dimensional memory device comprises an alternating stack of electrically conductive word line layers and insulating layers located over a top surface of a substrate, an adjustable resistance semiconductor local vertical bit line extending perpendicular to the top surface of the substrate, resistivity switching memory elements located at each overlap region between the electrically conductive word line layers and the adjustable resistance semiconductor local vertical bit line, a gate dielectric located on the adjustable resistance semiconductor local vertical bit line, and a gate electrode located on the gate dielectric. First portions of the adjustable resistance semiconductor local vertical bit line are located in lateral recesses between adjacent insulating layers in the alternating stack.

BRIEF DESCRIPTION OF THE DRAWINGS

In the figures including one or more planes of cross-sectional views, the letters represent the plane of the cross-sectional view for the figure having the same prefix numeral as the respective figure and having the same suffix letter as the letter represented by the respective plane. For example, the plane A-A' in FIG. 1B represents the plane of the cross-sectional view for FIG. 1A, the plane C-C' in FIG. 1A represents the plane of the cross-sectional view for FIG. 1C, etc.

FIG. 1C is a horizontal cross-sectional view of the first exemplary structure of FIGS. 1A and 1B along the horizontal plane C-C'.

FIG. 5B is a second vertical cross-sectional view of the first exemplary structure of FIG. 5A along the vertical plane B-B'.

FIG. 7B is a second vertical cross-sectional view of the first exemplary structure of FIG. 6A along the vertical plane B-B'.

FIG. 13A is a first vertical cross-sectional view of a second exemplary structure after patterning the memory-material-containing layer stack and laterally recessing sidewalls of the insulating layers according to a second embodiment of the present disclosure.

FIGS. 16A-16D are sequential vertical cross-sectional views of a portion of the first or second exemplary structure during formation of a second exemplary memory-material-containing stack, a drain region, a semiconductor channel layer, a gate dielectric, and a gate electrode according to an embodiment of the present disclosure.

DETAILED DESCRIPTION

Figure 1A:
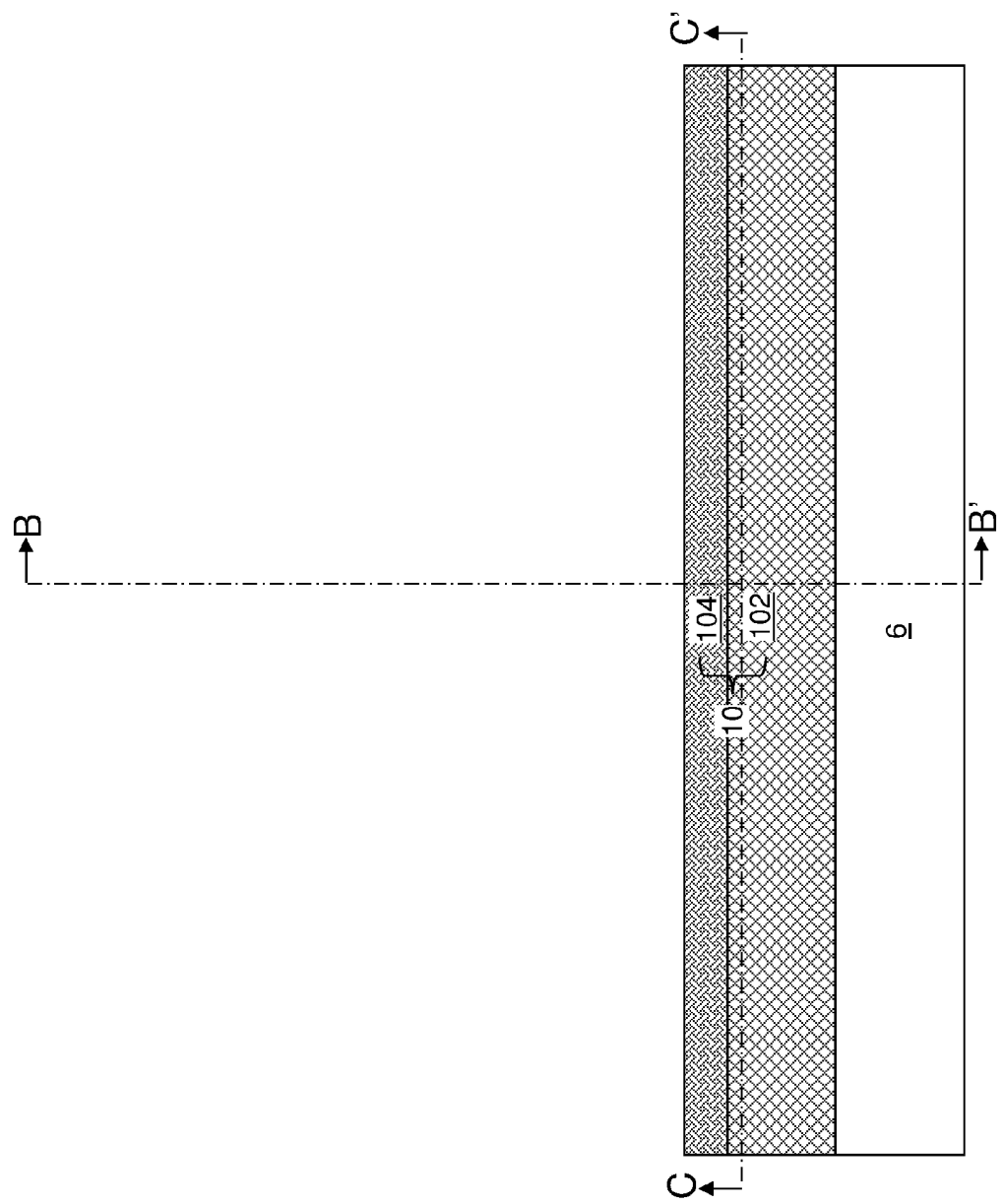
FIG. 1A is a first vertical cross-sectional view of a first exemplary structure for forming a three-dimensional memory device after forming global bit lines according to a first embodiment of the present disclosure.

As discussed above, the present disclosure is directed to a memory device, such as a non-volatile memory device employing a resistive storage element, and methods of making the same, the various aspects of which are described below. The embodiments of the disclosure can be employed to form various semiconductor devices including at least one resistive memory element. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. A "semiconducting material" refers to a material having electrical conductivity in a range from $1.0 \times 10^{-6}$ S/cm to $1.0 \times 10^{5}$ S/cm. All measurements for electrical conductivities are made at the standard condition.

As used herein, a "resistivity switching memory material" or a "reversibly resistance-switching material" is a material of which the resistivity can be altered by application of a voltage across the material. As used herein, a "resistivity switching memory material layer" refers to a layer including a resistivity switching memory material. As used herein, a "resistive memory element" refers to an element that includes a portion of a resistivity switching memory material in a configuration that enables programming of the resistivity switching memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Figure 1B:
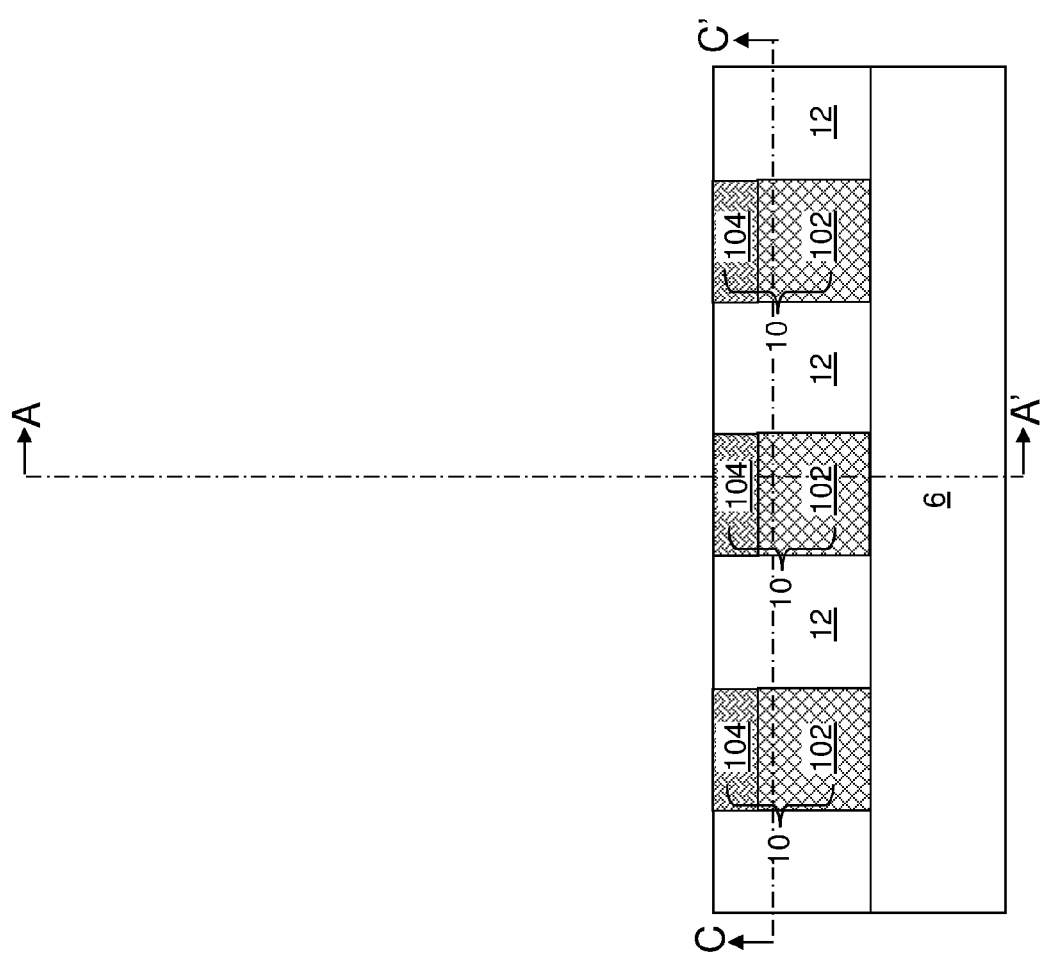
FIG. 1B is a second vertical cross-sectional view of the first exemplary structure of FIG. 1A along the vertical plane B-B'.

Referring to FIGS. 1A-1C, a first exemplary structure for forming a three-dimensional memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer includes a planar doped semiconductor material layer having a doping of a first conductivity type, and may additionally include one or more underlying metallic material layer. Each of the one or more underlying metallic material layer can include, for example, at least one elemental metal (such as W, Co, Cu, and Al), an intermetallic alloy including at least two elemental metals, a conductive metallic nitride, or a conductive metallic carbide. For example, the at least one conductive material layer can include an optional metallic barrier layer (such as a layer of TiN, TaN, or WN), an optional metal layer (such as a layer of W, Ti, Ta, Cu, Al, or an alloy thereof), and a planar doped semiconductor material layer. In this case, each global bit line 10 can include an optional metallic rail 102 and a doped semiconductor rail 104. If a metallic rail 102 is present within a global bit line 10, an overlying doped semiconductor rail 104 can contact a top surface of the metallic rail. In one embodiment, each global bit line 10 can have a uniform width throughout. In one embodiment, the global bit lines 10 can form a one-dimensional array that is repeated along the first horizontal direction hd1 with a periodicity.

The first conductivity type of the doped semiconductor rails 104 can be n-type or p-type. In one embodiment, the dopant concentration in the doped semiconductor rails 104 can be sufficiently high to render the doped semiconductor rails 104 conductive, in which case the doped semiconductor rails 104 are referred to be "heavily doped." In one embodiment, the doped semiconductor rails 104 can have a dopant concentration greater than $1.0 \times 10^{19}/cm^3$, and preferably greater than $5.0 \times 10^{19}/cm^3$, and even more preferably greater than $2.0 \times 10^{20}/cm^3$, although lesser dopant concentration may also be employed. The thickness of the doped semiconductor rails 104 can be in a range from 10 nm to 300 nm, although lesser and greater thicknesses can also be employed.

The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

Figure 2A:
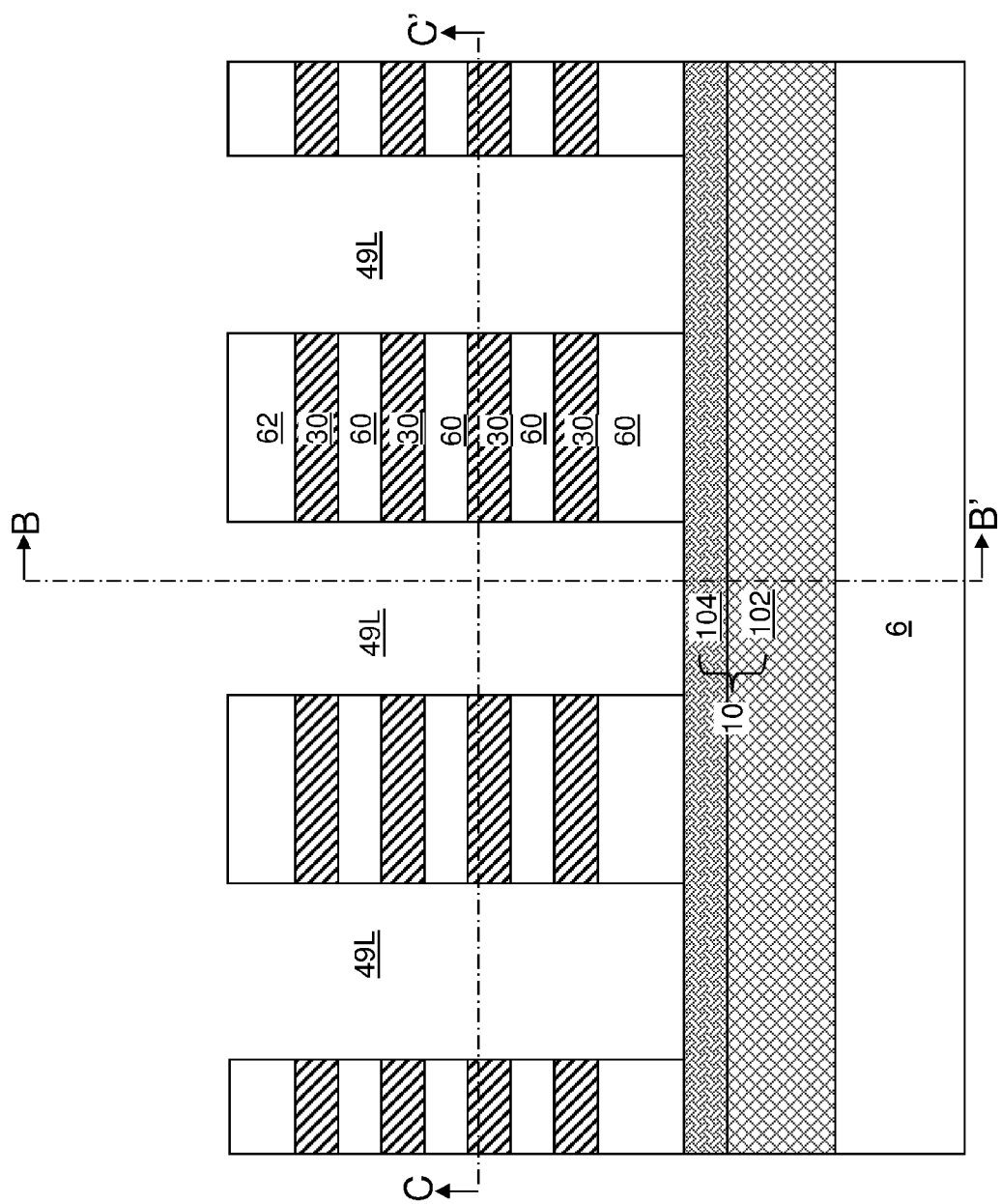
FIG. 2A is a first vertical cross-sectional view of the first exemplary structure after forming alternating stacks of insulating layers and spacer material layers and line trenches that divide the alternating stacks according to the first embodiment of the present disclosure.
Figure 2B:
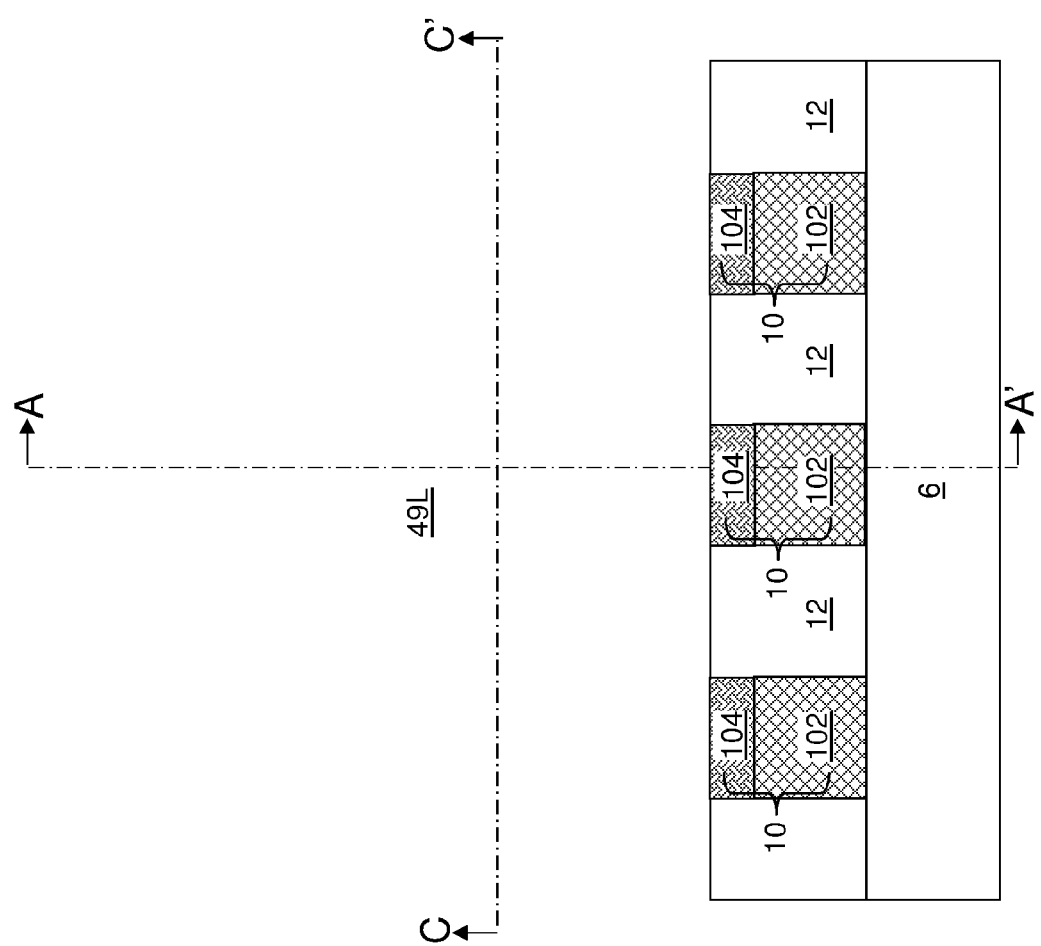
FIG. 2B is a second vertical cross-sectional view of the first exemplary structure of FIG. 2A along the vertical plane B-B'.
Figure 2C:
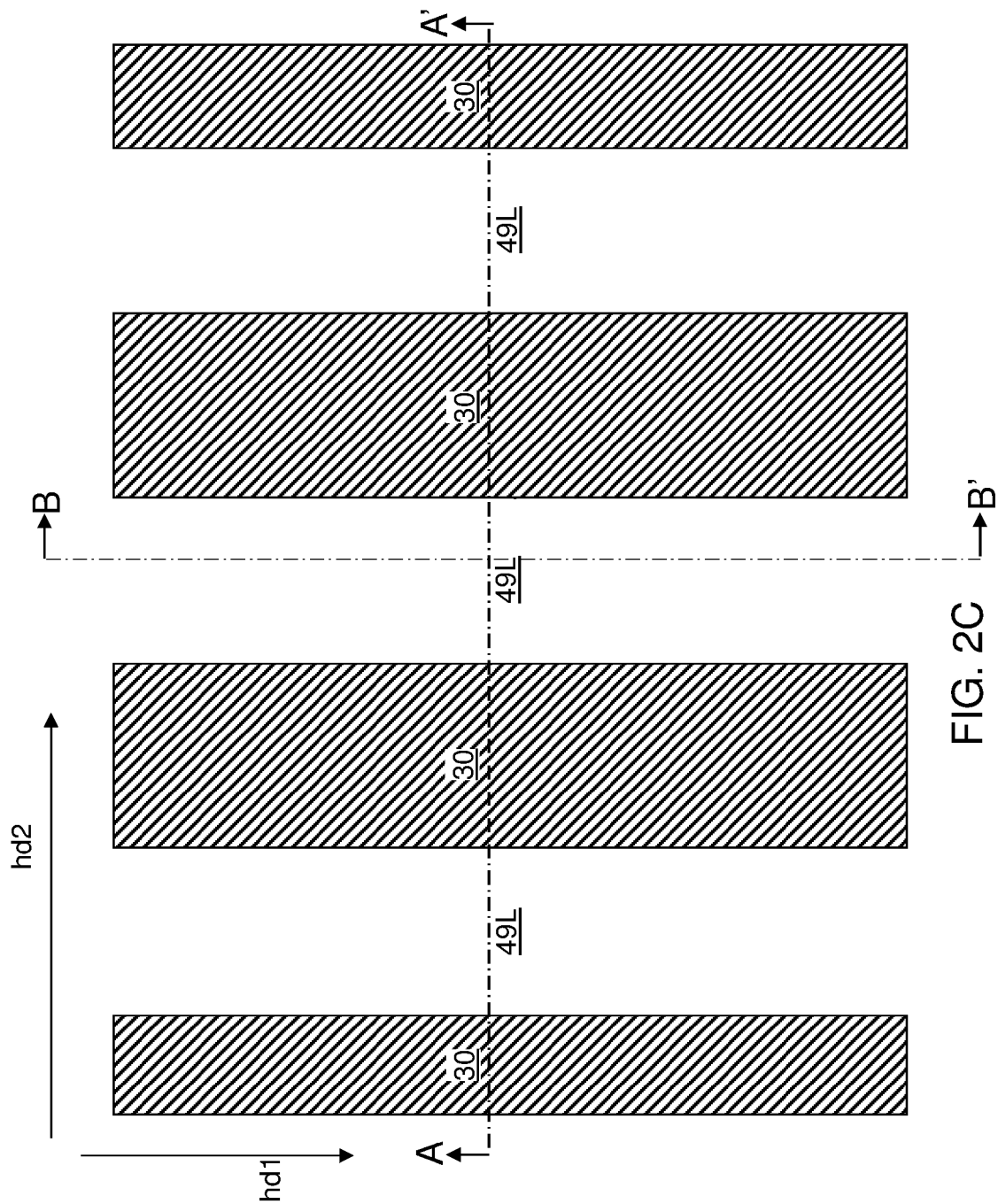
FIG. 2C is a horizontal cross-sectional view of the first exemplary structure of FIGS. 2A and 2B along the horizontal plane C-C'.

Referring to FIGS. 2A-2C, an alternating stack of spacer material layers 30 and insulating layers 60 can be formed over the global bit lines 10 and the separator dielectric material portions 12. The alternating stack may start with a bottommost insulating layer 60 and terminate with a topmost insulating layer, which is herein referred to as an insulating cap layer 62. Alternatively, the alternating stack may start with a bottommost insulating layer 60 and terminate with a topmost spacer material layer 30. In this case, an insulating cap layer 62 can have a different composition than the insulating layers 60.

In one embodiment, the spacer material layers 30 can be a first electrically conductive material layers that remain in a final device structure and function as word lines of the three-dimensional memory device. In one embodiment, the first electrically conductive material can include an elemental metal, an intermetallic alloy, and/or a conductive metal nitride. For example, each of the spacer material layers 30 can include an optional metallic barrier layer including a conductive metallic nitride such as TiN, TaN, WN, or a combination thereof, and a metal layer including a metal such as W, Co, Ru, Mo, Cu, Al, or an intermetallic alloy thereof.

In another embodiment, the spacer material layers 30 can be sacrificial material layers that are subsequently replaced electrically conductive layers that function as word lines of the three-dimensional memory device. For example, amorphous carbon, or diamond-like carbon (DLC).

In one embodiment, the insulating layers 60 can include undoped silicate glass (e.g., silicon oxide) or doped silicate glass. All of the insulating layers 60 can include the same dielectric material such as a silicate glass. The insulating cap layer 62 can include the same material as the insulating layers 60, or can include a different material (such as silicon nitride or a dielectric metal oxide) from the material of the insulating layers 60.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

The thickness of the spacer material layers 30 can be in a range from 10 nm to 100 nm, although lesser and greater thicknesses can also be employed. The thickness of the insulating layers 60 can be in a range from 10 nm to 100 nm, although lesser and greater thicknesses can also be employed. The thickness of the insulating cap layer 62 can be in a range from 10 nm to 300 nm, although lesser and greater thicknesses can also be employed.

A pair of a spacer material layer 30 and an insulating layer 60 can constitute a unit of repetition in the alternating stack (30, 60) of the spacer material layers 30 and the insulating layers 60. The total number of repetitions can be in a range from 8 to 1,024, although lesser and greater number of repetitions can also be employed.

Subsequently, the alternating stack of the spacer material layers 30 and the insulating layers 60 as formed at the processing steps of FIGS. 1A-1C (which is herein referred to as an "initial alternating stack") is patterned to multiple alternating stacks (30, 60). The multiple alternating stacks (30, 60) are laterally spaced part by line trenches 49L that extend along the first horizontal direction hd1. Each contiguous set of remaining portions of the spacer material layers 30 and the insulating layers 60 between a pair of line trenches 49L constitutes an alternating stack (30, 60) that is a rail structure, which is also referred to as an "alternating stack rail." Thus, a plurality of alternating stacks (30, 60) of insulating layers 60 and spacer material layers 30 is formed over a substrate 6. Each of the insulating layers 60 and the spacer material layers 30 extends along the first horizontal direction (i.e., the word line direction) hd1. The alternating stacks (30, 60) are laterally spaced from one another along the second horizontal direction hd2 (i.e., the global bit line direction). In one embodiment, each patterned spacer material layer 30, as an electrically conductive layer, can constitute a word line of a resistive random access memory device. Each alternating stack (30, 60), as patterned and laterally spaced from one another by the line trenches 49L, has the same composition and the same thickness as the initial alternating stack (30, 60) as formed at the processing steps of FIGS. 2A-2C.

Figure 3A:
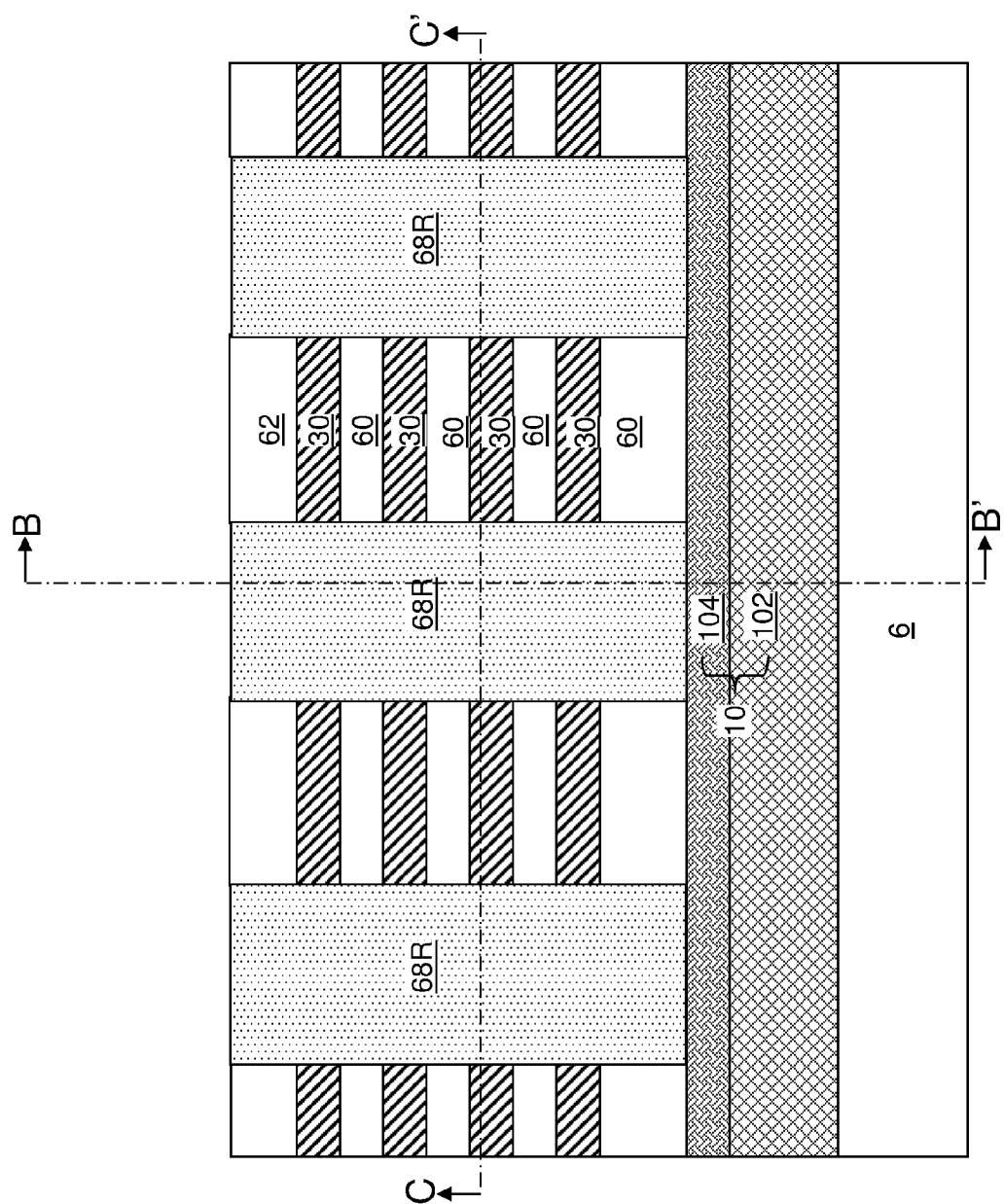
FIG. 3A is a first vertical cross-sectional view of the first exemplary structure after forming dielectric rail structures according to the first embodiment of the present disclosure.
Figure 3B:
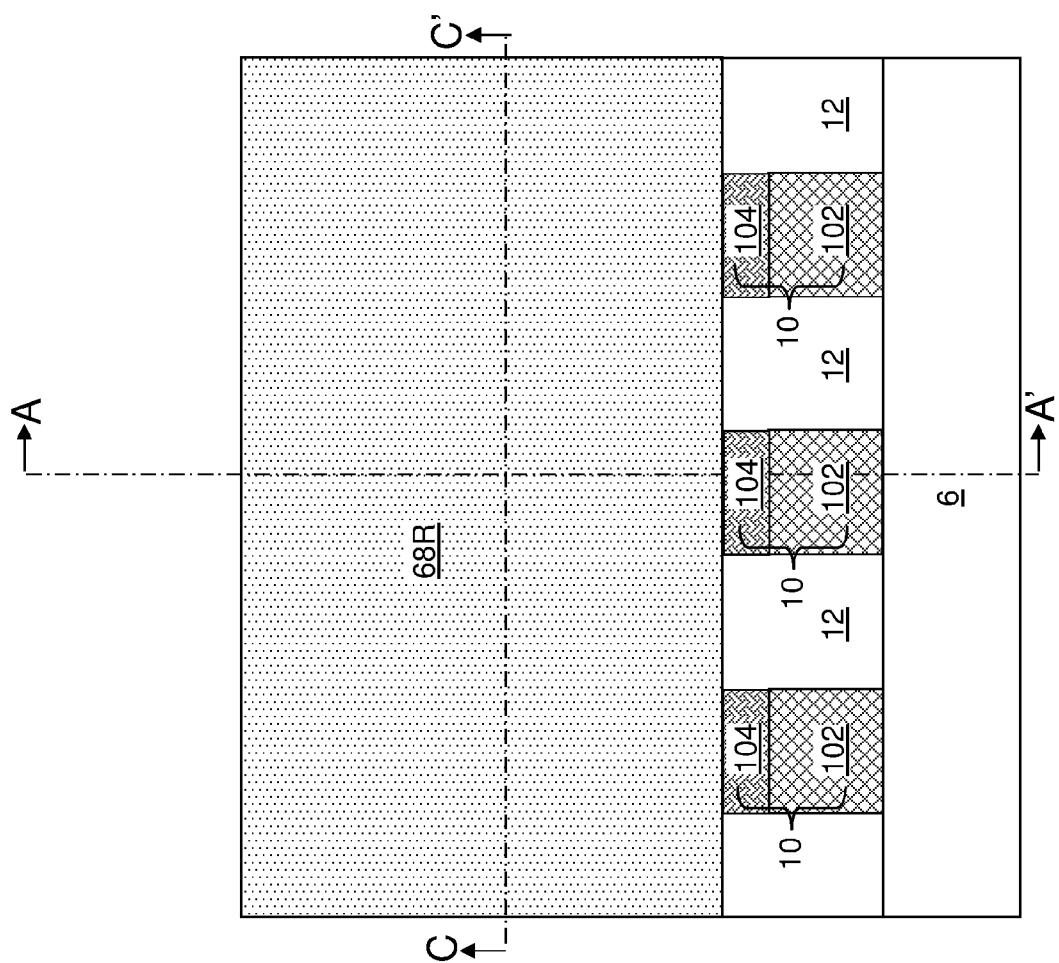
FIG. 3B is a second vertical cross-sectional view of the first exemplary structure of FIG. 3A along the vertical plane B-B'.
Figure 3C:
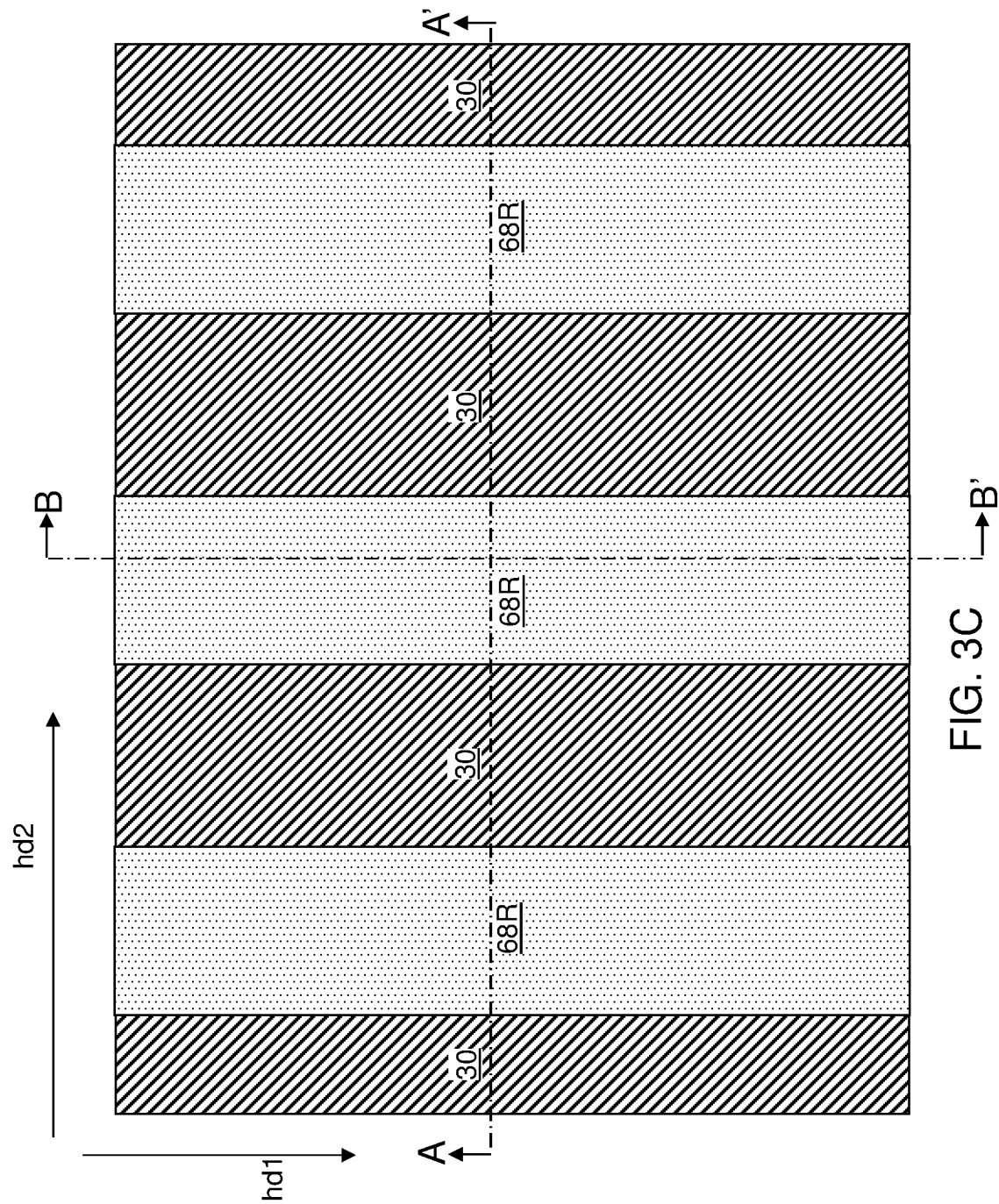
FIG. 3C is a horizontal cross-sectional view of the first exemplary structure of FIGS. 3A and 3B along the horizontal plane C-C'.

Referring to FIGS. 3A-3C, a dielectric material is deposited to fill the line trenches 49L. The dielectric material can be removed from above a horizontal plane including the top surfaces of the insulating cap layers 62. Each remaining portion of the dielectric material filling a line trench 49L constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass (e.g., $SiO_2$) or doped silicate glass, the insulating cap layers 62 can include silicon nitride or a dielectric metal oxide, and the separator rail structures 68R can include doped silicate glass, undoped silicate glass, or organosilicate glass.

Figure 4A:
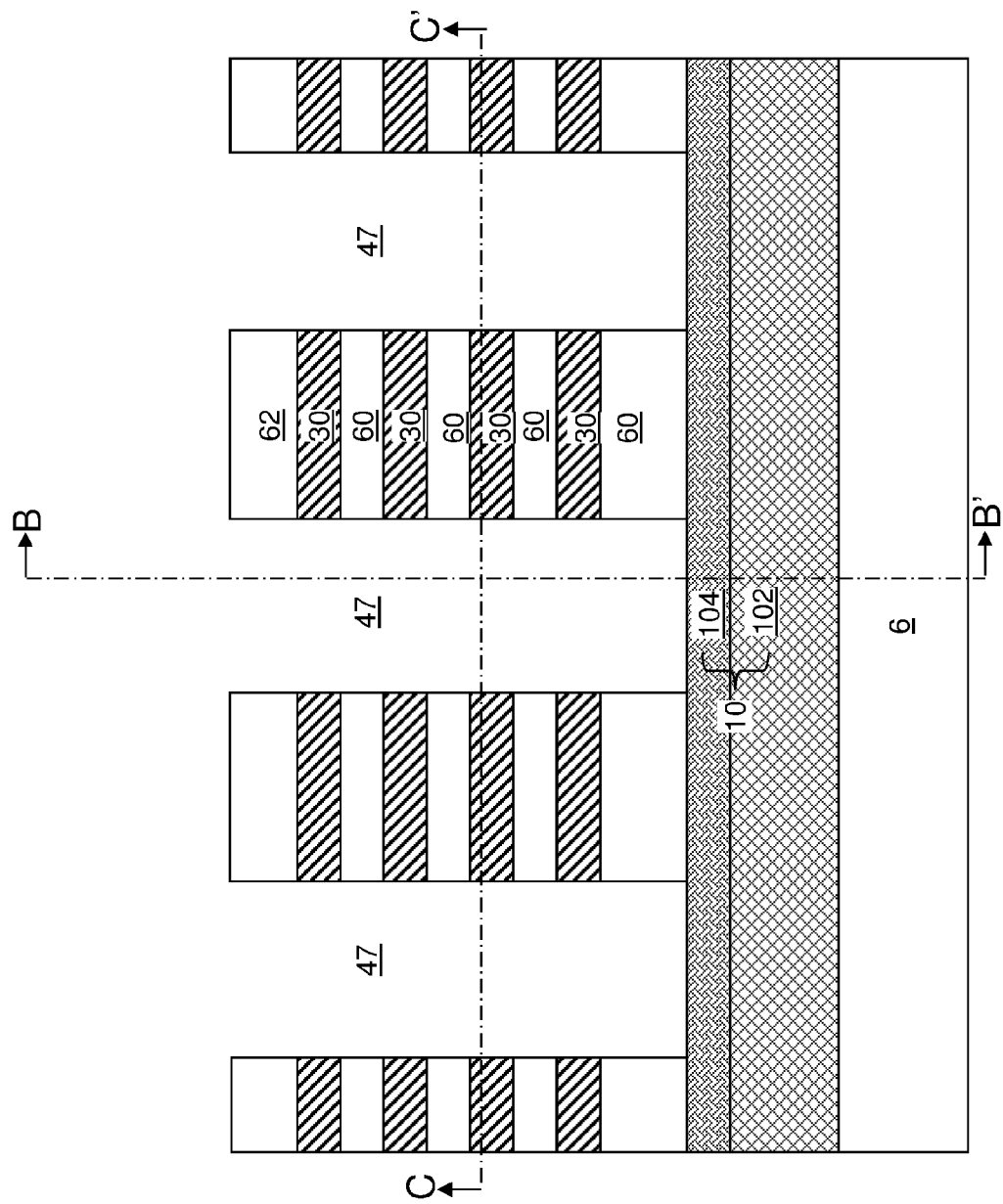
FIG. 4A is a first vertical cross-sectional view of the first exemplary structure after forming dielectric pillar structures that define bit line cavities according to the first embodiment of the present disclosure.
Figure 4B:
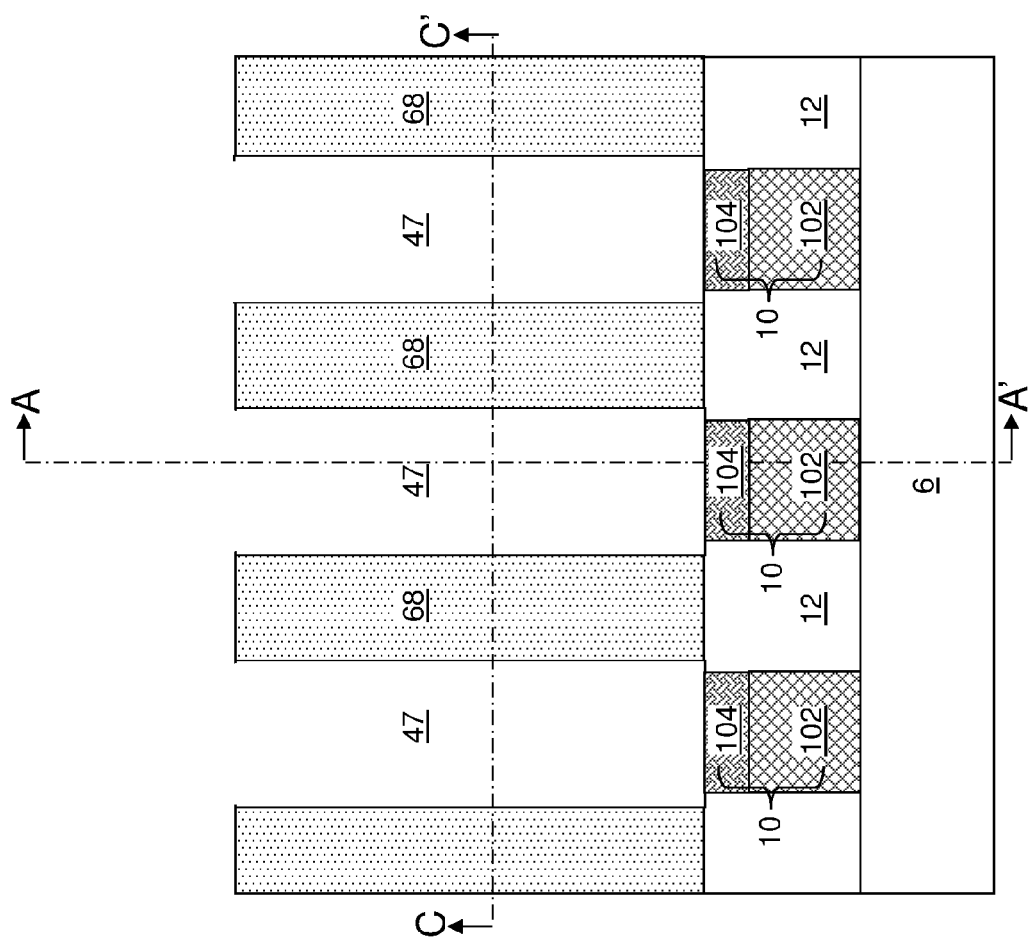
FIG. 4B is a second vertical cross-sectional view of the first exemplary structure of FIG. 4A along the vertical plane B-B'.
Figure 4C:
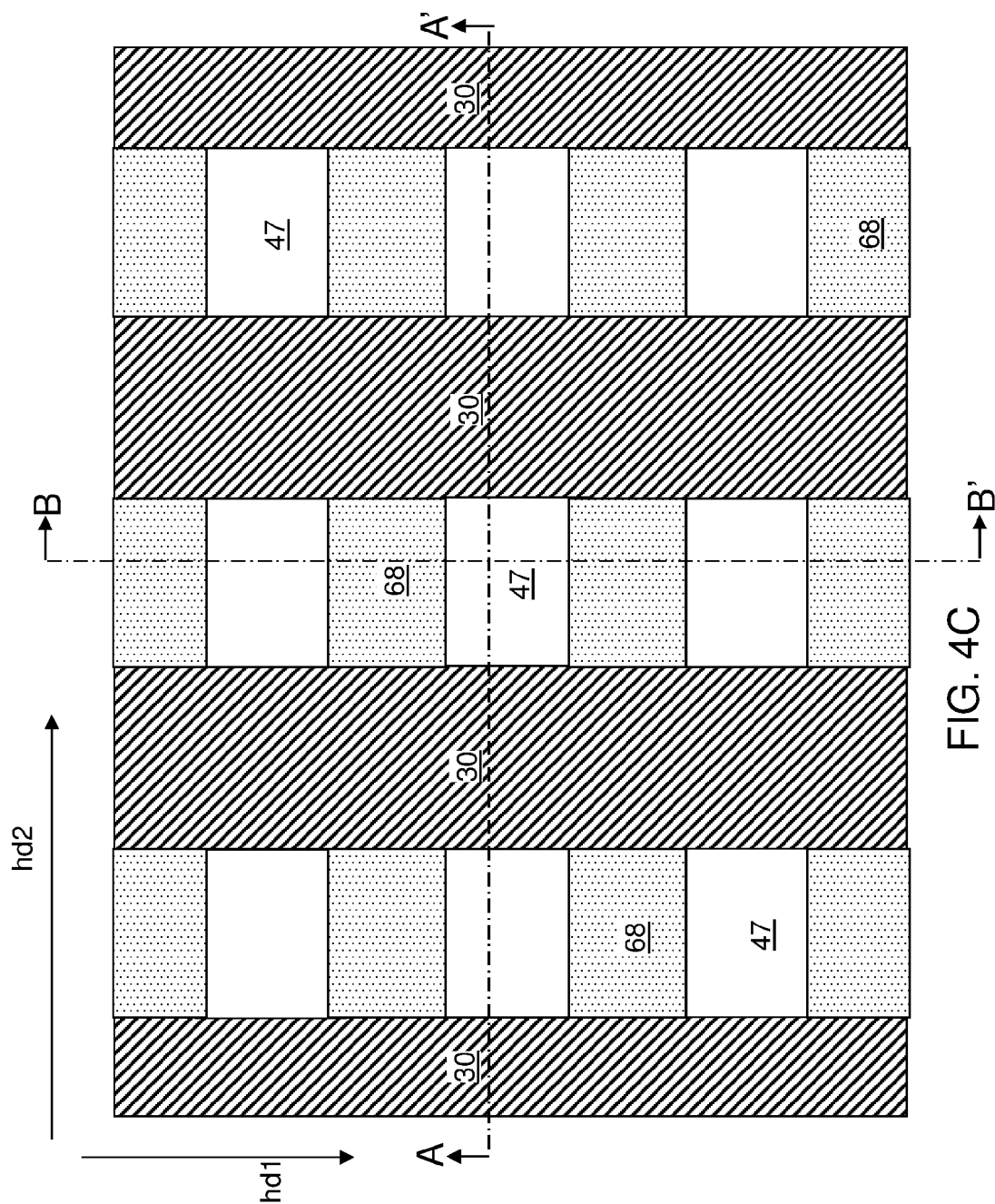
FIG. 4C is a horizontal cross-sectional view of the first exemplary structure of FIGS. 4A and 4B along the horizontal plane C-C'.

Referring to FIGS. 4A-4C, bit line cavities 47 can be formed by patterning the separator rail structures 68R into separator pillar structures 68. Specifically, a photoresist layer (not shown) can be applied over the insulating cap layers 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layers 62 can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the global bit lines 10 can be formed, thereby separating the separator rail structures 68R into separator pillar structures 68. The bit line cavities 47 can form a two-dimensional array. The separator pillar structures 68 can form another two-dimensional rectangular array having the same periodicity as the two-dimensional rectangular array of the bit line cavities 47. Each bit line cavity 47 is formed adjacent to an alternating stack (30, 60), which is a remaining portion of the initial alternating stack (30, 60) provided at the processing steps of FIGS. 2A-2D.

Figure 5A:
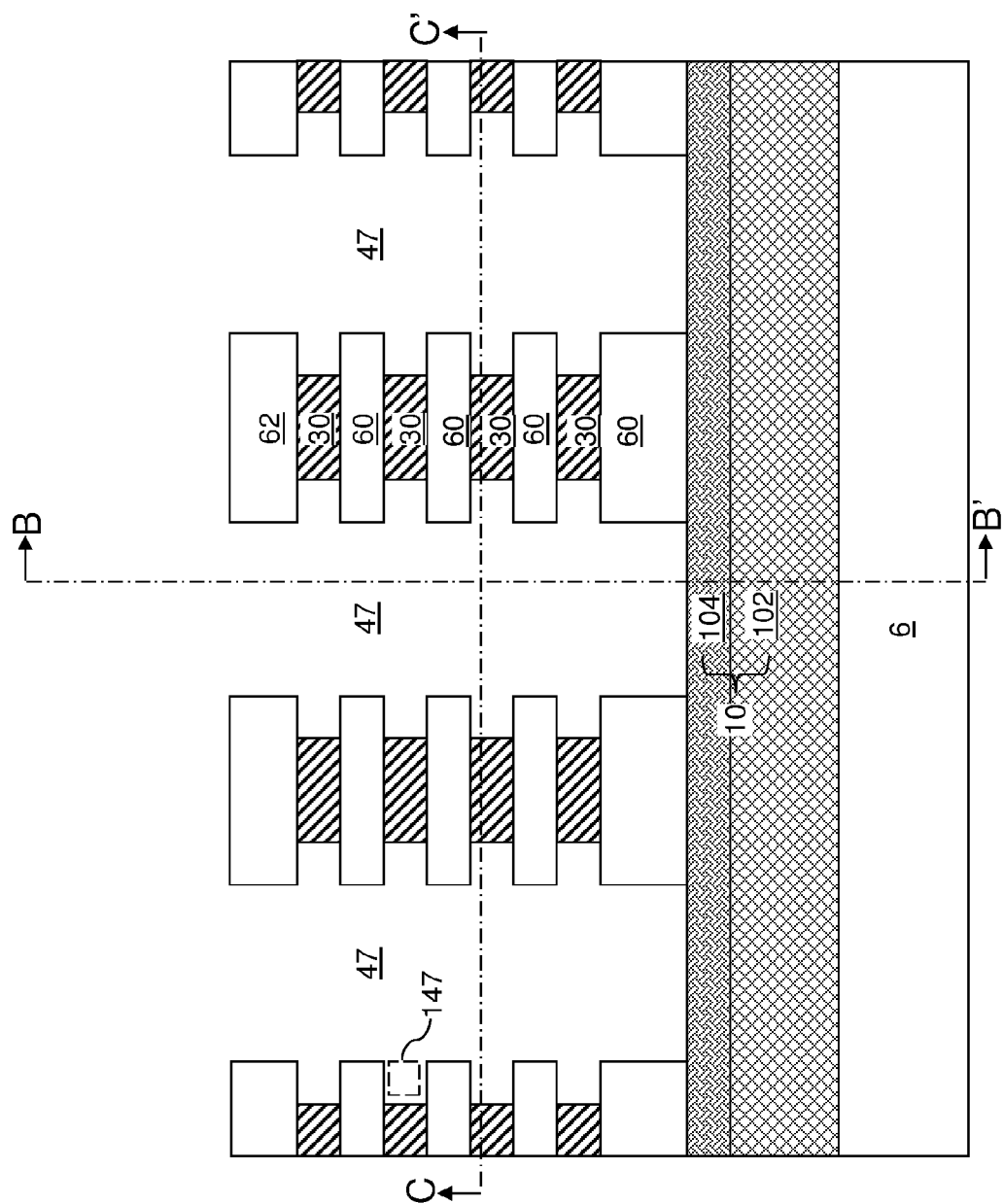
FIG. 5A is a first vertical cross-sectional view of the first exemplary structure after forming lateral recesses by laterally recessing the insulating layers with respect to the spacer material layers according to the first embodiment of the present disclosure.
Figure 5C:
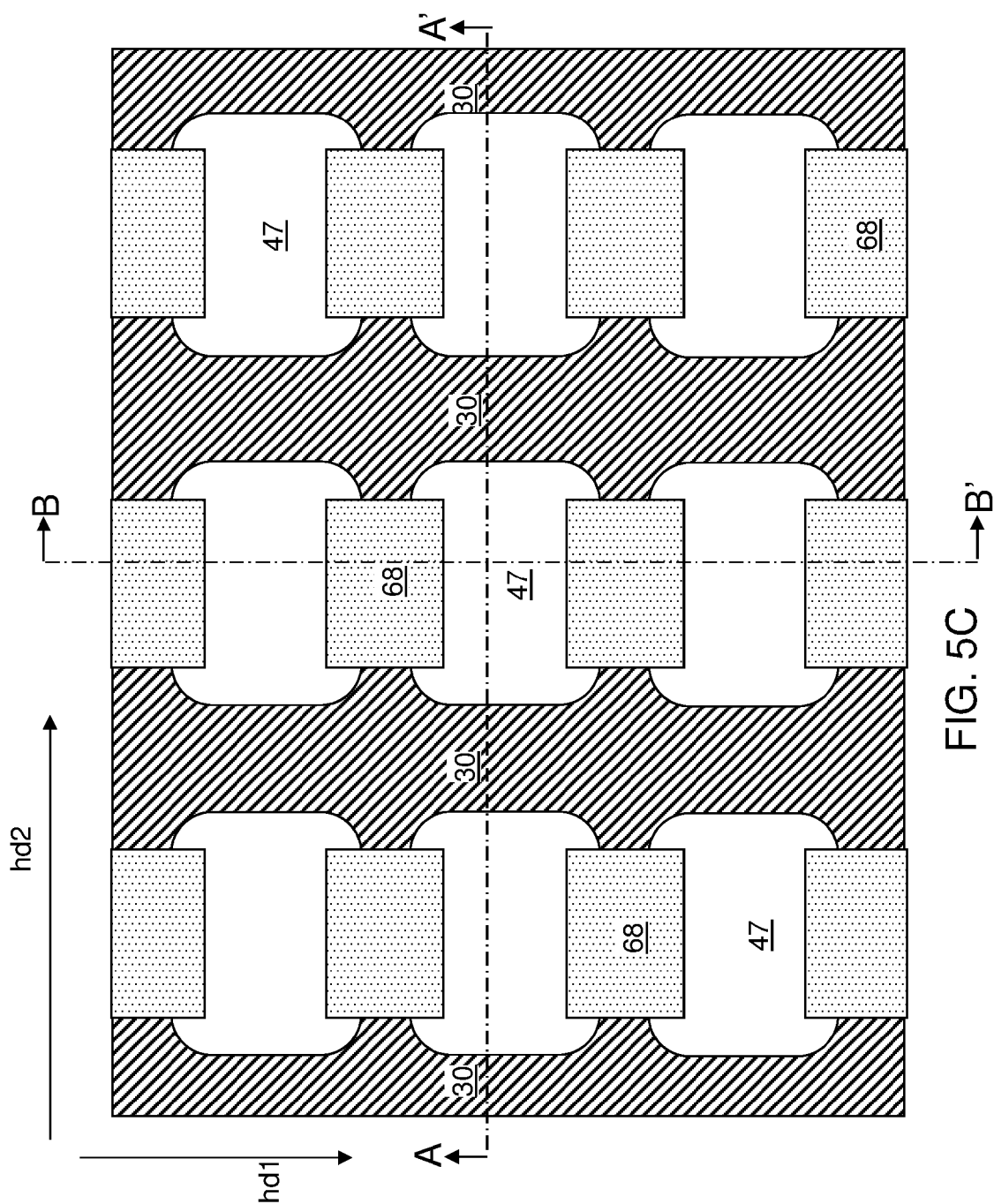
FIG. 5C is a horizontal cross-sectional view of the first exemplary structure of FIGS. 5A and 5B along the horizontal plane C-C'.

Referring to FIGS. 5A-5C, sidewalls of the spacer material layers 30 are laterally recessed with respect to sidewalls of the insulating layers 60 to form lateral recesses 147. An isotropic selective etchant that etches the material of the spacer material layers 30 with respect to the material of the insulating layers 60 can be provided into each bit line cavity 47 to partially remove surface portions of the spacer material layers 30 from around each bit line trench 47. In an illustrative example, if the spacer material layer 30 include titanium nitride and if the insulating layers 60 include silicon oxide, a solution of hydrogen peroxide and ammonium hydroxide in deionized water can be employed to etch the spacer material layer 30 selective to the insulating layers 60. In another illustrative example, if the spacer material layer 30 include a metallic material such as tungsten and if the insulating layers 60 include silicon oxide, aqua regia or a mixture of hydrofluoric acid and nitric acid can be employed to etch the spacer material layer 30 selective to the insulating layers 60. The lateral recesses 147 extend along the first horizontal direction, and can include two concave end portions that adjoin a respective separator pillar structure 68. The lateral etch distance, i.e., the lateral dimension of each lateral recess 147, can be in a range from 10 nm to 200 nm, although lesser and greater lateral etch distances can also be employed. Two sets of vertically overlapping lateral recesses 147 can be adjoined to each bit line cavity 47. Each spacer material layer 30 can have a laterally modulated width due to formation of the lateral recesses. The laterally modulated width of each spacer material layer 30 modulates along the first horizontal direction, and may be periodic.

Figure 6A:
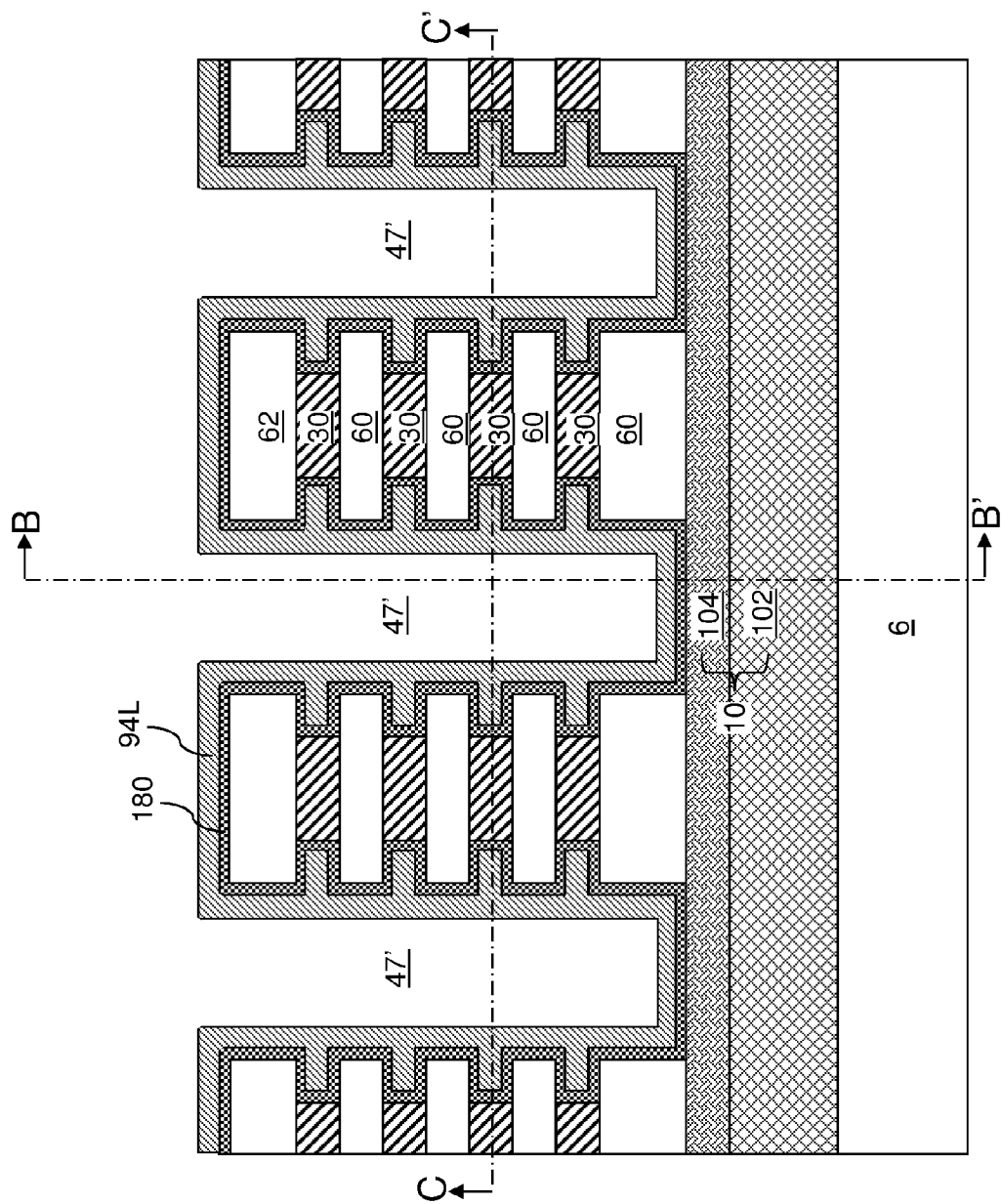
FIG. 6A is a first vertical cross-sectional view of the first exemplary structure after formation of a memory-material-containing layer stack and a doped semiconductor layer according to the first embodiment of the present disclosure.
Figure 6B:
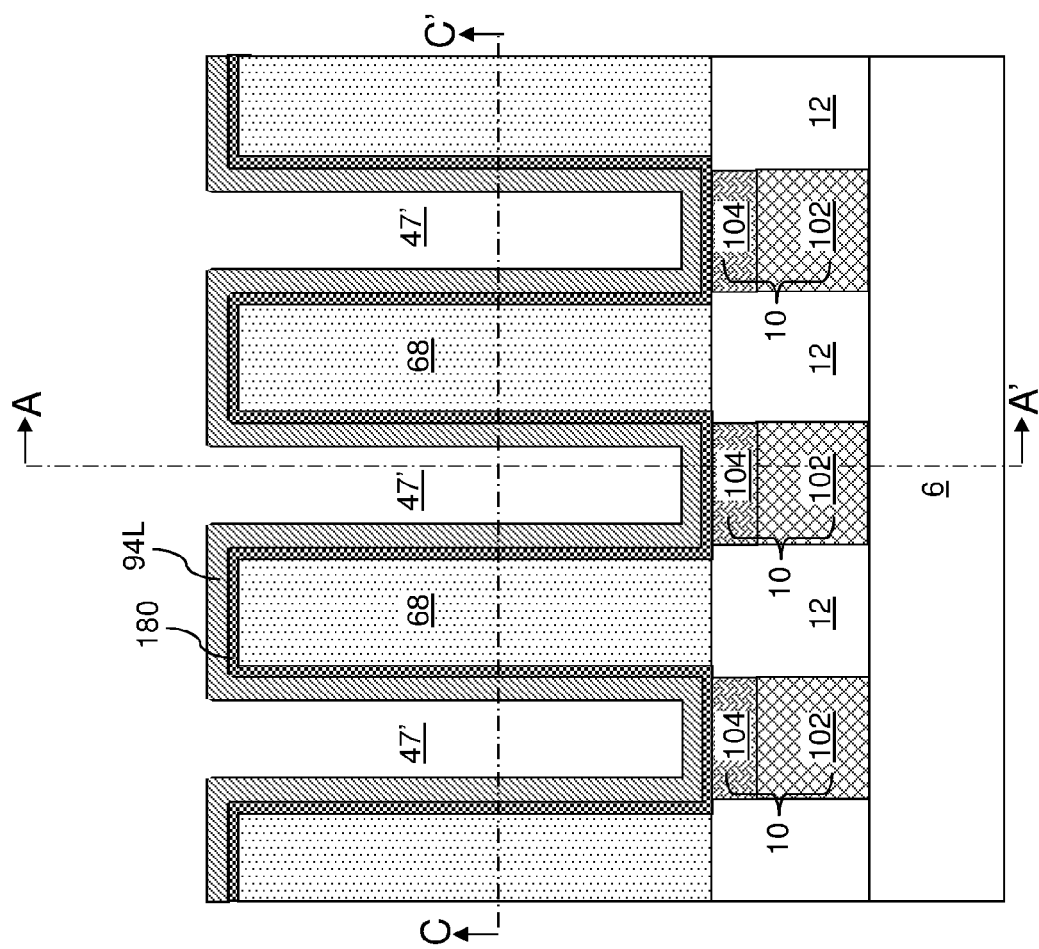
FIG. 6B is a second vertical cross-sectional view of the first exemplary structure of FIG. 6A along the vertical plane B-B'.
Figure 6C:
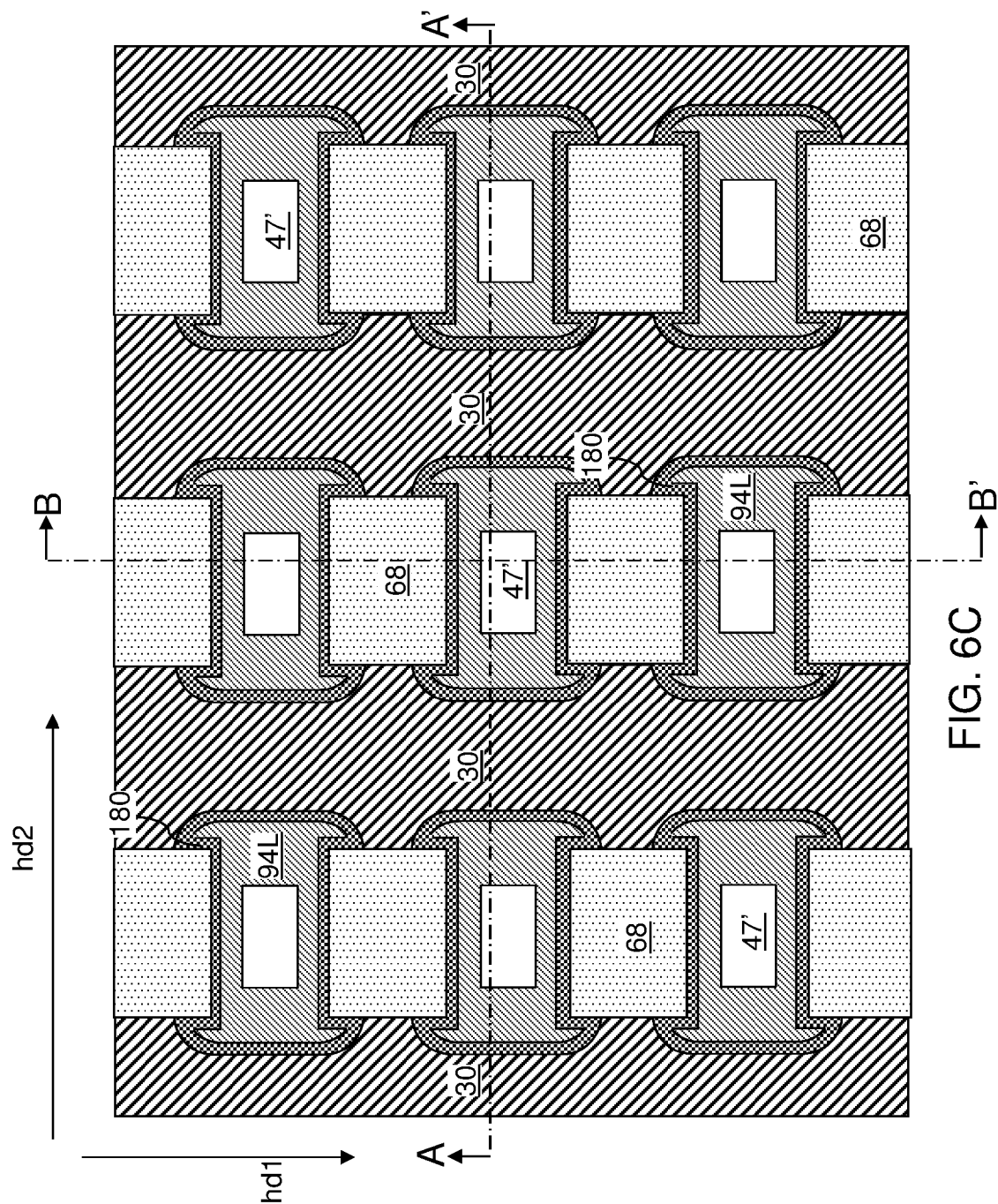
FIG. 6C is a horizontal cross-sectional view of the first exemplary structure of FIGS. 6A and 6B along the horizontal plane C-C'.

Referring to FIGS. 6A-6C, a memory-material-containing layer stack 180 can be deposited in each of the lateral recesses 147. The memory-material-containing layer stack 180 includes memory elements (e.g., storage elements) and optional selector elements within each lateral recess 147. Each memory element includes a respective memory material portion. In one embodiment, the memory elements comprise a resistivity switching memory material selected from a filament-forming dielectric material providing a reduced resistivity upon formation of conductive filaments therein (such as hafnium oxide or nickel oxide), vacancy modulated conductive oxide material providing an increased resistivity upon reduction of oxygen vacancy therein (such as a sub-stoichiometric titanium oxide), or a phase change chalcogenide material that switches between amorphous and crystalline states. The resistivity switching memory material portions may include portions of at least one continuous memory material layer located within each lateral recess 147. Alternatively, the memory material portion may include physically disjoined discrete portions of a memory material located within the lateral recesses. The memory-material-containing layer stack 180 can be deposited directly on the physically exposed surfaces of the doped semiconductor rails 104, the separator pillar structures 68, the insulator layers 60, and the spacer material layers 30.

As used herein, a selector element is a steering element that displays a non-linear voltage-current characteristic such that the element functions as an electrical insulator in a first voltage range and functions as an electrical conductor in a second voltage range. In one embodiment, each selector element may include a diode, such as a semiconductor diode (e.g., a pn junction diode, a pin junction diode, or a Schottky diode) or a metal-insulator-metal (MIM) diode. Alternatively, each selector element may include a non-Ohmic material such as a non-Ohmic oxide material. An example of a selector element comprising a sub-stoichiometric oxide material that functions as an insulator at a low electric field and functions as a conductor at a high electric field is described in U.S. Patent Application Publication 2015/0263069 A1 published on Sep. 17, 2015.

The memory-material-containing layer stack 180 may have a uniform thickness, or may have a greater thickness in the lateral recesses 147 than outside of the lateral recesses 147. The memory-material-containing layer stack 180 can include a uniform layer stack throughout, or may include additional material layers only in the lateral recesses 147. A lateral cavity connected to a respective bit line cavity 47 is present within each volume of the lateral recesses 147 after formation of the memory-material-containing layer stack 180. In one embodiment, a plurality of selector elements (not expressly shown) can be formed at each level of the spacer material layers 30 such that each of the plurality of selector elements contacts a respective resistive memory element. Non-limiting illustrative examples of memory elements and optional selector elements are described above and in subsequent sections.

A doped semiconductor layer 94L is deposited within each lateral cavity on the physically exposed surfaces of the memory-material-containing layer stack 180. The doped semiconductor layer 94L includes a doped semiconductor material having a doping of the first conductivity type, i.e., the same conductivity type as the doping of the doped semiconductor rails 104.

In one embodiment, the doped semiconductor layer 94L can be heavily doped. In one embodiment, the doped semiconductor layer 94L can have a dopant concentration greater than $1.0 \times 10^{19}/cm^3$, and preferably greater than $5.0 \times 10^{19}/cm^3$, even more preferably greater than $2.0 \times 10^{20}/cm^3$, and still more preferably greater than $4.0 \times 10^{20}/cm^3$, such as $2.0 \times 10^{19}/cm^3$ to $1.0 \times 10^{21}/cm^3$, although lesser dopant concentration may also be employed. The doped semiconductor layer 94L can be deposited by a conformal deposition process such as low pressure chemical vapor deposition (LPCVD). The thickness of the doped semiconductor layer 94L can be in a range from 4 nm to 60 nm, although lesser and greater thicknesses can also be employed. The entirety of each backside recess 147 can be filled within a combination of the memory-material-containing layer stack 180 and the doped semiconductor layer 94L. A vertical cavity 47' can be present within each volume of the bit line cavity 47 that is not filled within the memory-material-containing layer stack 180 and the doped semiconductor layer 94L. Due to pinching off of the deposited material of the doped semiconductor layer 94L upon filling of the lateral recesses 147, the doped semiconductor layer 94L can have a first lateral extent on a sidewall of a separator pillar structure 68 (which is the thickness of the deposited doped semiconductor layer 94L), and a second lateral extent on a recessed sidewalls of the memory-material-containing layer stack 180 within a lateral recess as illustrated in FIG. 6C.

Figure 7A:
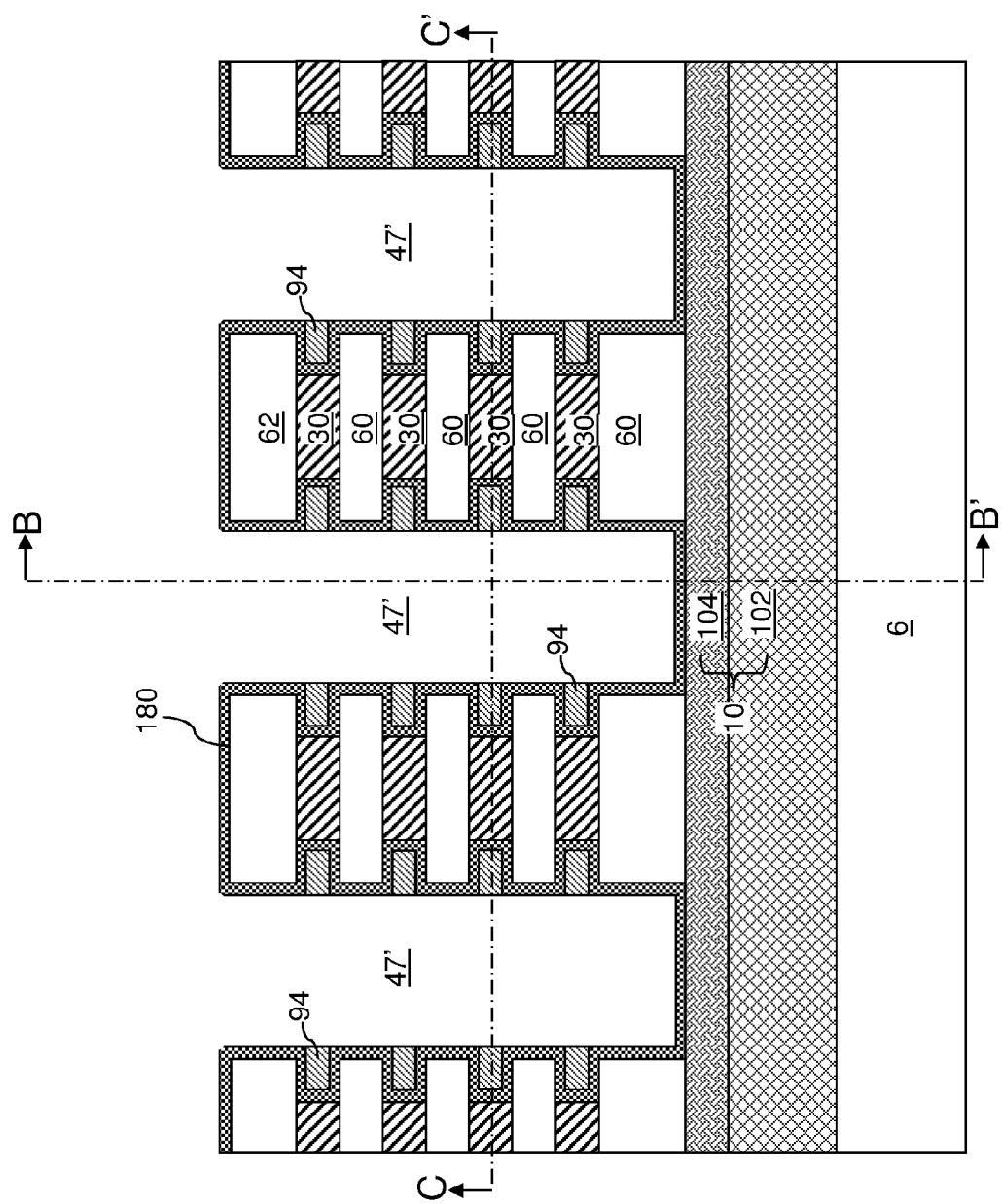
FIG. 7A is a first vertical cross-sectional view of the first exemplary structure after formation of drain regions by patterning the doped semiconductor layer according to the first embodiment of the present disclosure.
Figure 7C:
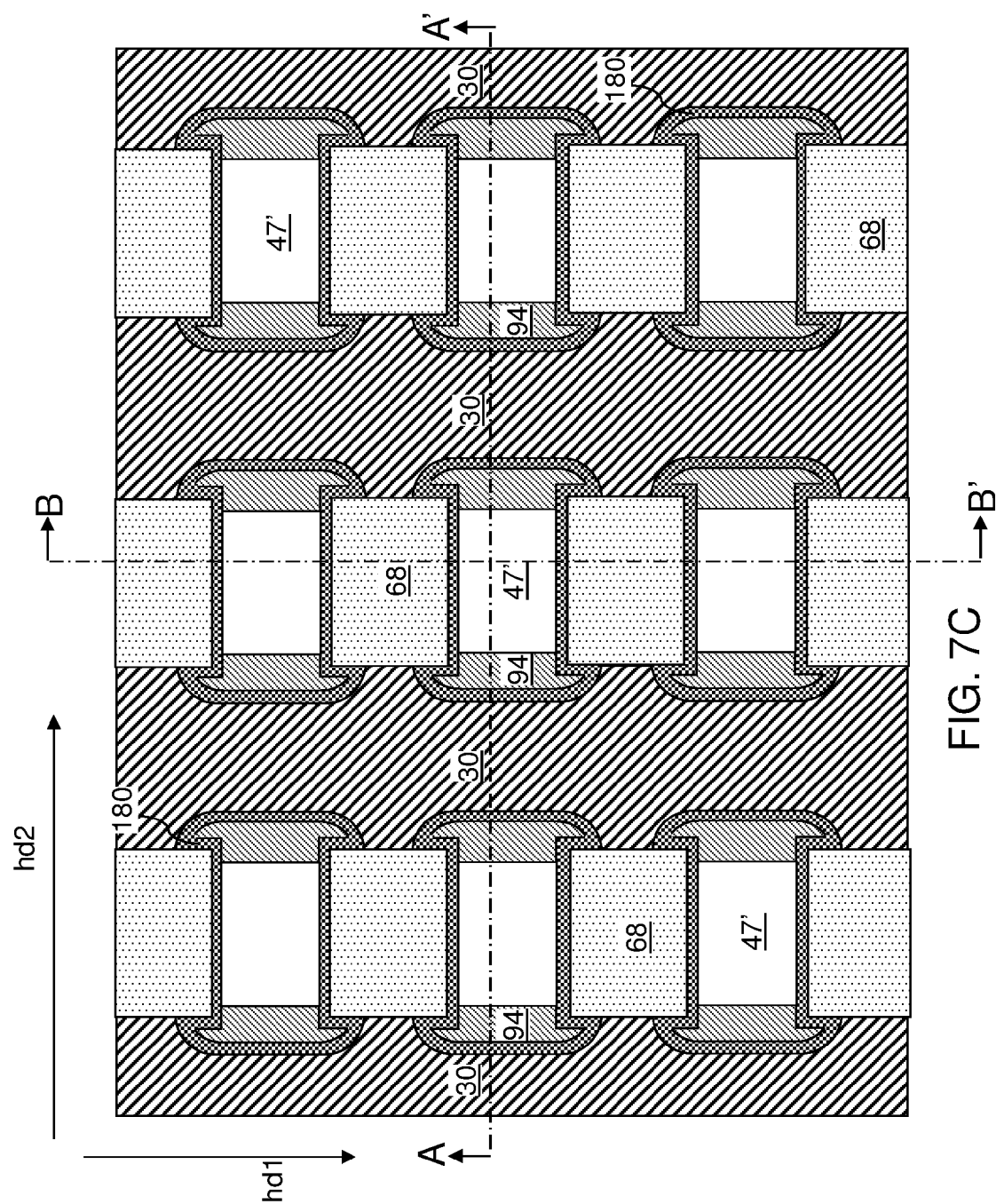
FIG. 7C is a horizontal cross-sectional view of the first exemplary structure of FIGS. 7A and 7B along the horizontal plane C-C'.

Referring to FIGS. 7A-7C, an etch process is performed to remove portions of the doped semiconductor material layer 94L that do not underlie a portion of the memory-material-containing layer stack 180. For example, an anisotropic etch process that removes the material of the doped semiconductor layer 94L selective to the memory-material-containing layer stack can be employed to remove a horizontal portion of the doped semiconductor layer 94L from above the insulating cap layer 62 and from inside inner sidewalls of the memory-material-containing layer stack 180 around each vertical cavity 47'. Alternatively, a timed isotropic etch process can be employed to remove the portions of the doped semiconductor material layer 94L that do not underlie a portion of the memory-material-containing layer stack 180 in lieu of an anisotropic etch process.

A horizontal strip of the doped semiconductor layer 94L remains within each lateral recess 147 around each vertical cavity 47'. Each remaining strip of the doped semiconductor layer 94L is herein referred to as a drain region 94, which functions as a drain region of a respective vertical field effect transistor to be subsequently formed. The doped semiconductor rails 104 can be employed as corresponding source regions in the field effect transistors to be subsequently formed. It is understood that a source region and a drain region refers to two electrically active regions of a field effect transistor, and the role of the source region and the role of the drain region can be reversed depending on the external bias settings employed on the field effect transistor. Thus, a source region and a drain region merely mean a pair of electrically active regions that contact a channel of a field effect transistor.

In one embodiment, a proximal sidewall surface of each drain region 94 (i.e., a sidewall surface that is proximal to a vertical axis passing through the geometrical center of a vertical cavity 47' to which the drain region 94 is physically exposed) can be vertically coincident with an inner sidewall of the memory-material-containing layer stack 180. As used herein, two surfaces are "vertically coincident" if there exists a vertical plane that includes both of the two surfaces.

Thus, the drain regions 94 are formed in the lateral recesses 147 by patterning the doped semiconductor layer 94L. Each of the drain regions 94 can be a doped semiconductor region having a doping of the first conductivity type. A resistive memory element alone, or a combination of a resistive memory element and a selector element, can be present at each level of the spacer material layers 30 in a respective lateral recess 147. The combinations of the resistivity switching memory elements and the selector elements can constitute a three-dimensional array, which may be a periodic three-dimensional array. In one embodiment, one of the resistive memory element and the selector element in each combination can contact a respective spacer material layer 30 (e.g., word line). In one embodiment, another of the resistive memory element and the selector element in the combination contacts a respective drain region 94.

Figure 8A:
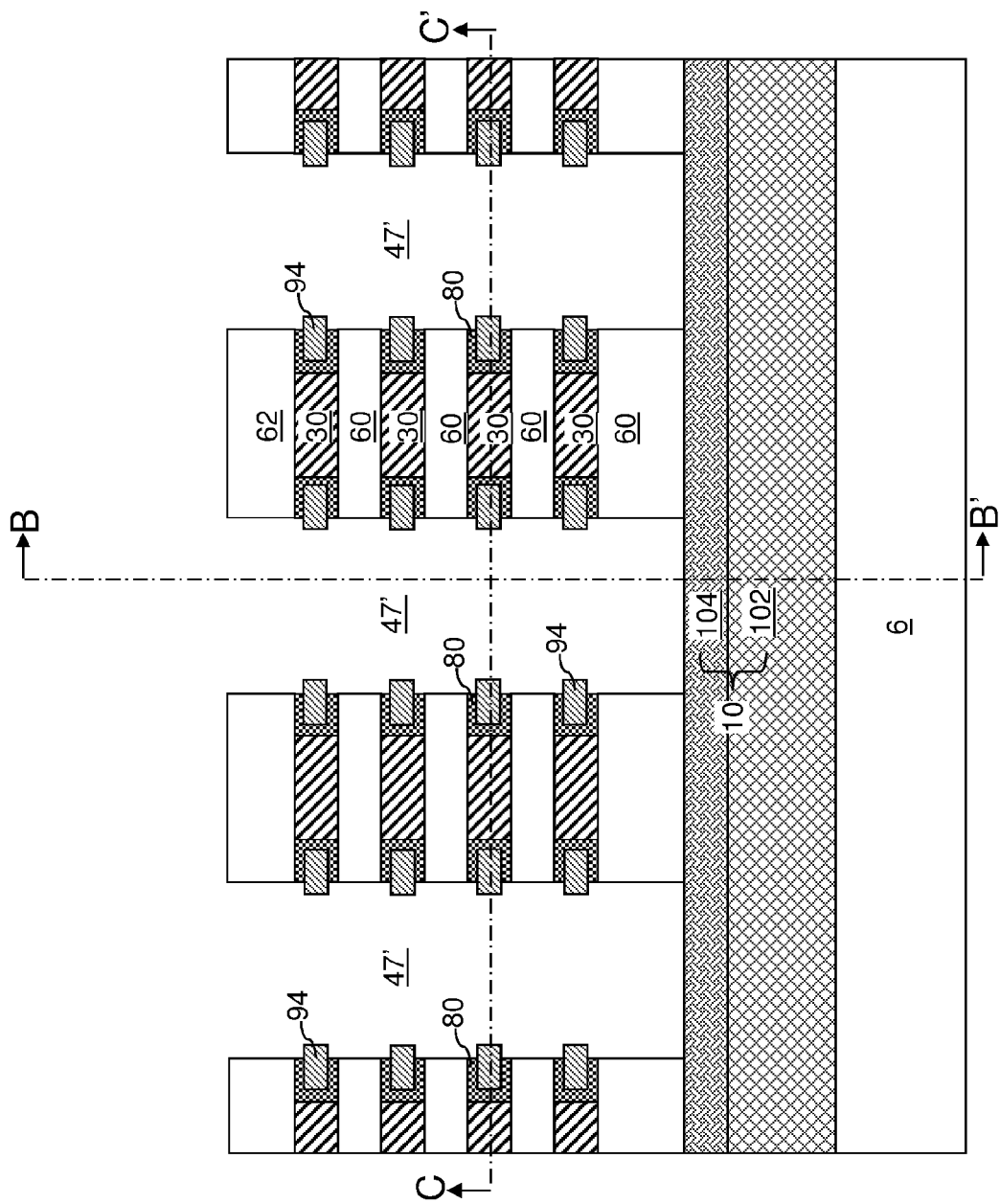
FIG. 8A is a first vertical cross-sectional view of the first exemplary structure after at least partially patterning the memory-material-containing layer stack according to the first embodiment of the present disclosure.
Figure 8B:
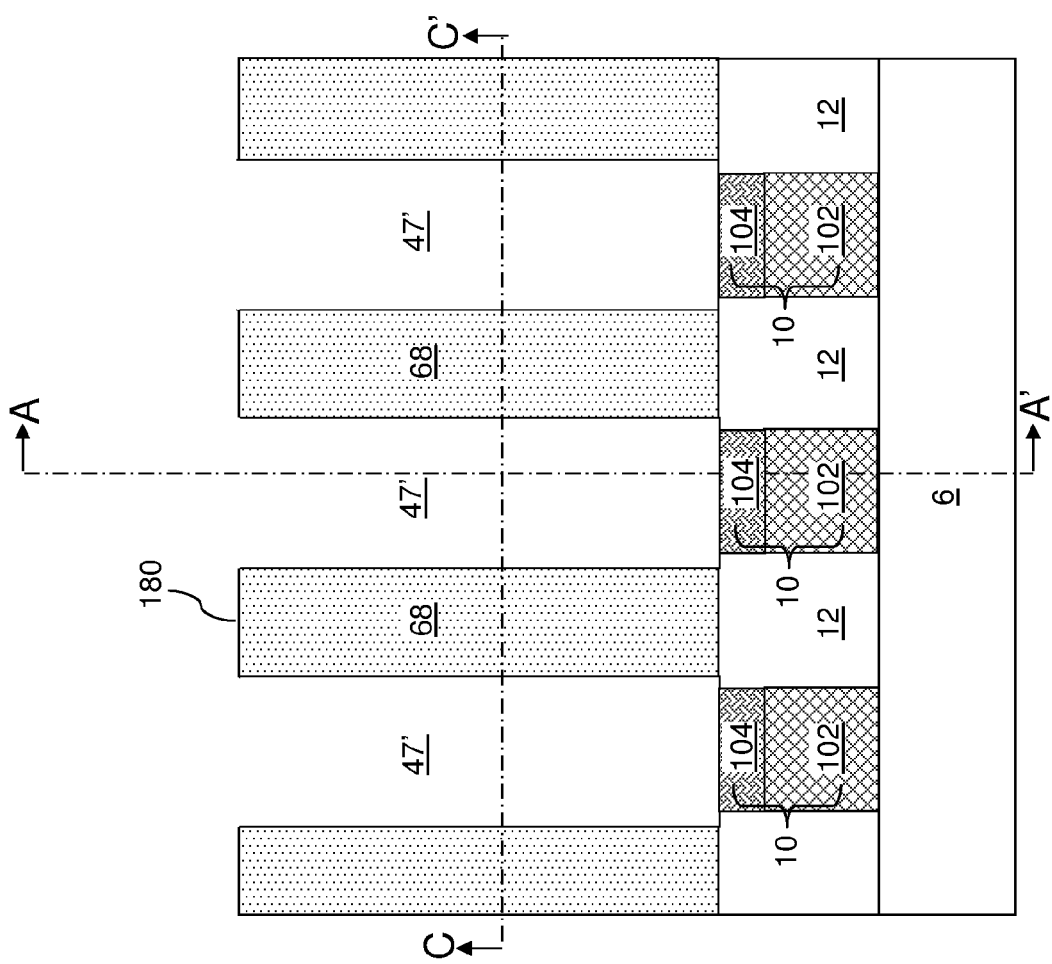
FIG. 8B is a second vertical cross-sectional view of the first exemplary structure of FIG. 8A along the vertical plane B-B'.
Figure 8C:
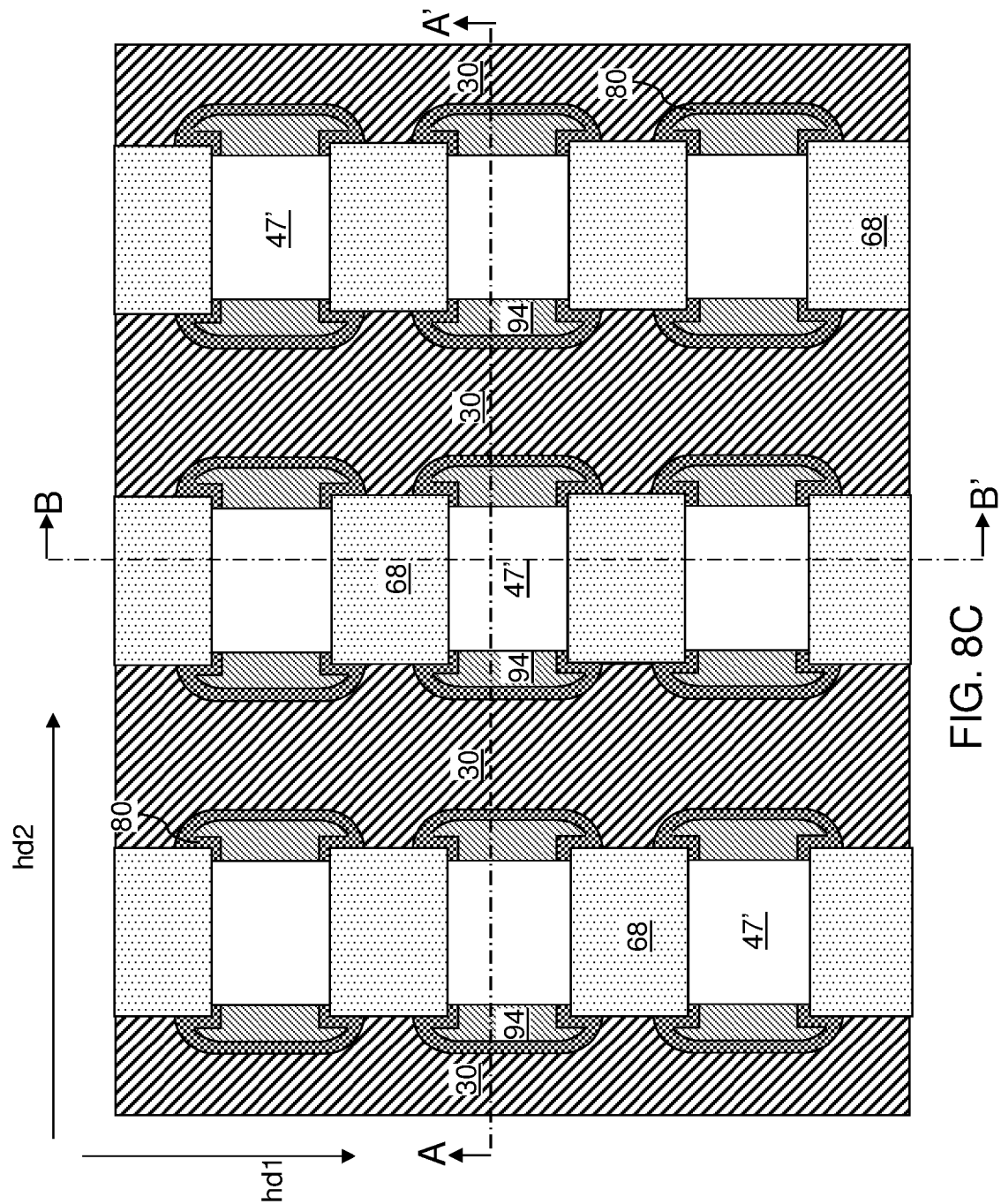
FIG. 8C is a horizontal cross-sectional view of the first exemplary structure of FIGS. 8A and 8B along the horizontal plane C-C'.

Referring to FIGS. 8A-8C, optionally and not necessarily, the memory-material-containing layer stack 180 can be at least partially patterned. Horizontal portions of the memory-material-containing layer stack 180 are removed from above top surfaces of the doped semiconductor rails 104 and from above the top surfaces of the insulating cap layers 62 by an anisotropic etch process or an isotropic etch process. In case an anisotropic etch process is employed, vertical portions of the memory-material-containing layer stack 180 outside of the lateral recesses 147 may, or may not, be removed by the anisotropic etch.

In one embodiment, the vertical portions of the memory-material-containing layer stack 180 outside of the lateral recesses 147 are removed, and the remaining portions of the memory-material-containing layer stack 180 can be located within the lateral recesses 147 as discrete material portions, and may have a clam shape. As used herein, a "clam shape" refers to a continuous shape consisting of an upper horizontal portion, a lower horizontal portion having a substantially same horizontal cross-sectional area as the upper horizontal portions, and a vertical portion connecting the upper horizontal portions and the lower horizontal portion. In this case, each remaining portion of the memory-material-containing layer stack 180 is herein referred to as a memory-material-containing discrete structure 80.

In case the proximal sidewall surfaces of the drain regions 94 are vertically coincident with inner sidewalls of the memory-material-containing layer stack 180 prior to removing the vertical portions of the memory-material-containing layer stack 180 including the inner sidewalls, the proximal sidewall surfaces of the drain regions 94 can protrude into a respective vertical cavity 47' from the vertical sidewalls of the insulating layers 60 and from the physically exposed sidewalls of the memory-material-containing discrete structures 80, as shown in FIG. 8A. Each memory-material-containing discrete structure 80 can include a resistive memory element alone, or can include a combination of a resistive memory element and a selector element.

In an alternative embodiment (not shown in FIGS. 8A-8C), in case the memory-material-containing layer stack 180 can include multiple component layers, at least one isotropic etch process may be employed in combination with at least one anisotropic etch process. Less than all of the component layers of the memory-material-containing layer stack 180 may be removed from around the vertical cavities 47'. In this case, the remaining portions of the memory-material-containing layer stack 180 may form a single continuous structure in which portions within the lateral recesses 147 include more component layers than vertical portions located on the sidewalls of the insulating layers 60.

Figure 9A:
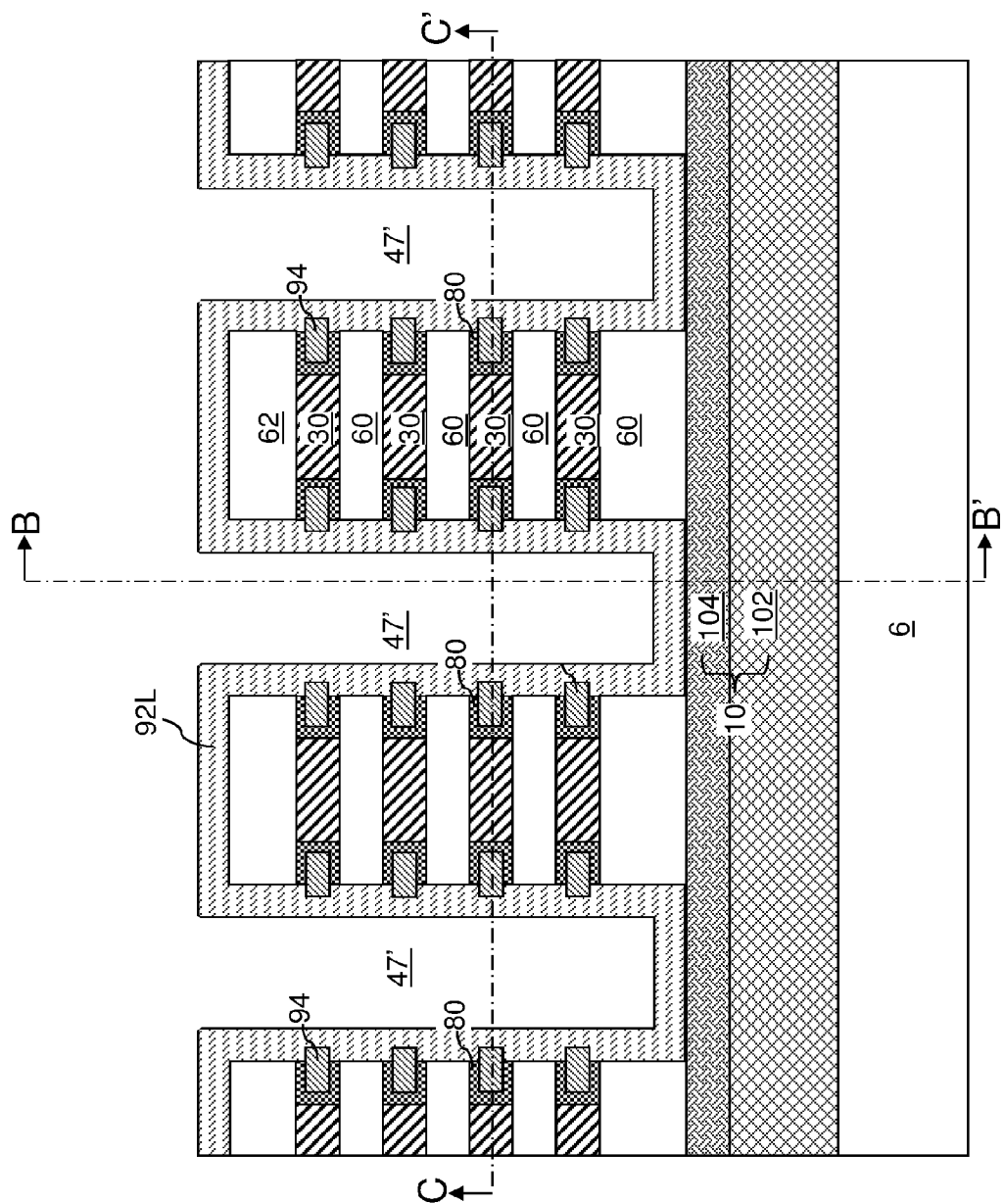
FIG. 9A is a first vertical cross-sectional view of the first exemplary structure after formation of a semiconductor channel layer according to the first embodiment of the present disclosure.
Figure 9B:
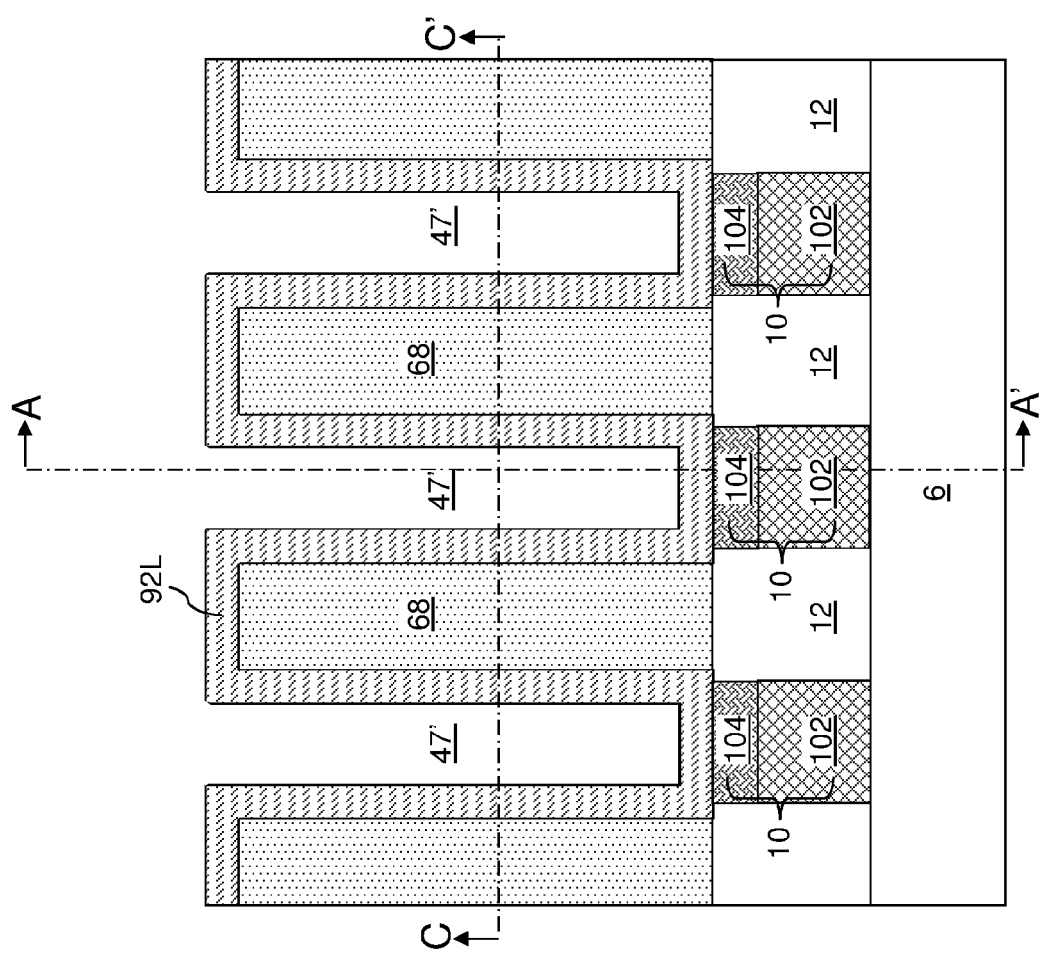
FIG. 9B is a second vertical cross-sectional view of the first exemplary structure of FIG. 9A along the vertical plane B-B'.
Figure 9C:
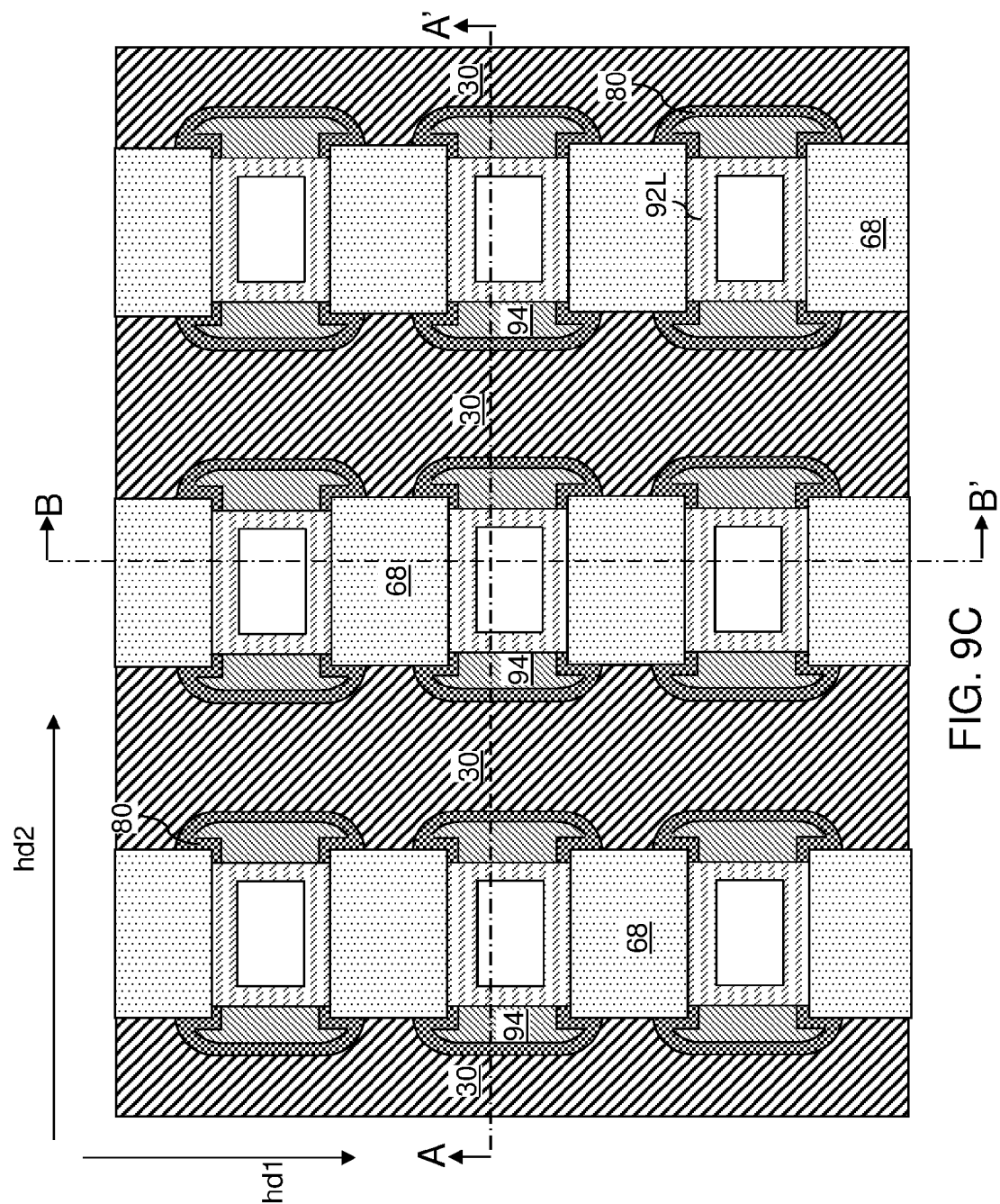
FIG. 9C is a horizontal cross-sectional view of the first exemplary structure of FIGS. 9A and 9B along the horizontal plane C-C'.

Referring to FIGS. 9A-9C, a semiconductor channel layer 92L can be deposited on the physically exposed surfaces of the insulating layers 60, the memory-material-containing discrete structures 80 (or a continuous remaining portion of the memory-material-containing layer stack 180 in case the memory-material-containing layer stack 180 is not divided into the memory-material-containing discrete structures 80), the drain regions 94 (which are doped semiconductor portions), and the doped semiconductor rails 104. The semiconductor channel layer 92L includes an intrinsic semiconductor material, an undoped semiconductor material (i.e., a semiconductor material that is not intentionally doped but may be doped through the effect of autodoping due to electrical dopants that evaporate from the doped semiconductor rails 104 or the drain regions 94 and incorporated into the semiconductor channel layer 92L), or may be lightly doped with a doping of a second conductivity type that is the opposite of the first conductivity type. In case the semiconductor channel layer 92L is doped with electrical dopants, the concentration of the electrical dopants in the semiconductor channel layer 92L can be in a range from $1.0 \times 10^{12}/cm^3$ to $1.0 \times 10^{17}/cm^3$, and preferably in a range from $1.0 \times 10^{12}/cm^3$ to $1.0 \times 10^{16}/cm^3$ in order to prevent formation of a conductive material in the semiconductor channel layer 92L, i.e., in order to provide a material having electrical resistivity greater than $1.0 \times 10^2$ Ohm/cm.

The semiconductor channel layer 92L can include a semiconductor material such as an elemental semiconductor material (such as Si or Ge), an alloy of at least two elemental semiconductor materials (such as a silicon germanium alloy), a compound semiconductor material (such as GaAs, InGaAs, and SiC), an organic semiconductor material, or a combination thereof. For example, layer 92L may comprise intrinsic, undoped or lightly doped polysilicon. The semiconductor channel layer 92L can be deposited by a conformal deposition process such as chemical vapor deposition. The thickness of the semiconductor channel layer 92L can be in a range from 3 nm to 100 nm, although lesser and greater thicknesses can also be employed.

Each of the global bit lines 10 can include a respective doped semiconductor rail 104 having a doping of the first conductivity type at a dopant concentration greater than $1.0 \times 10^{19}/cm^3$, such as $2.0 \times 10^{19}/cm^3$ to $1.0 \times 10^{21}/cm^3$, and the semiconductor channel layers 92L can contact horizontal surfaces of the semiconductor channel layer 92L.

Figure 10A:
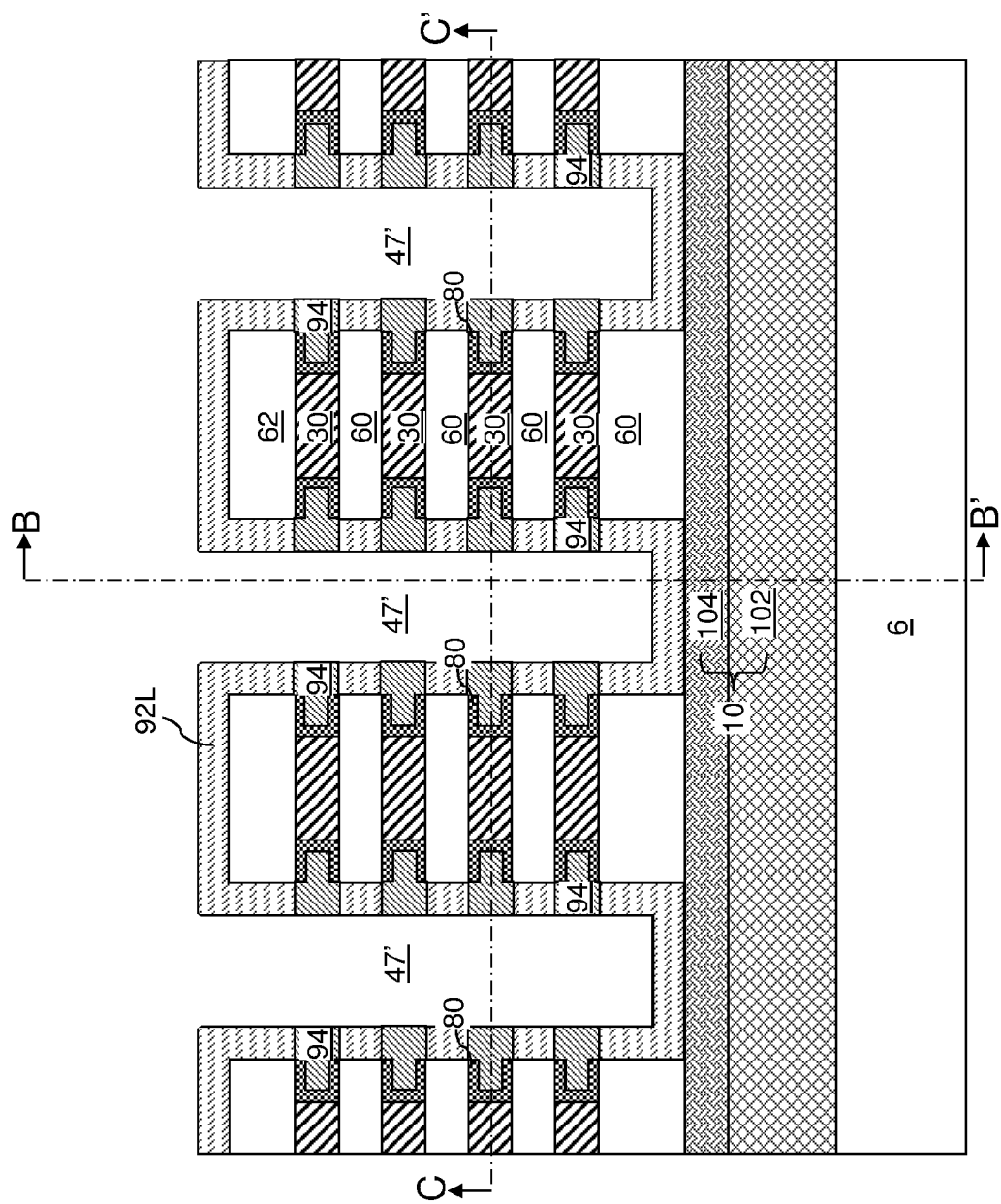
FIG. 10A is a first vertical cross-sectional view of the first exemplary structure after expanding the drain regions by diffusing electrical dopants into adjoining portions of the semiconductor channel layer according to the first embodiment of the present disclosure.
Figure 10B:
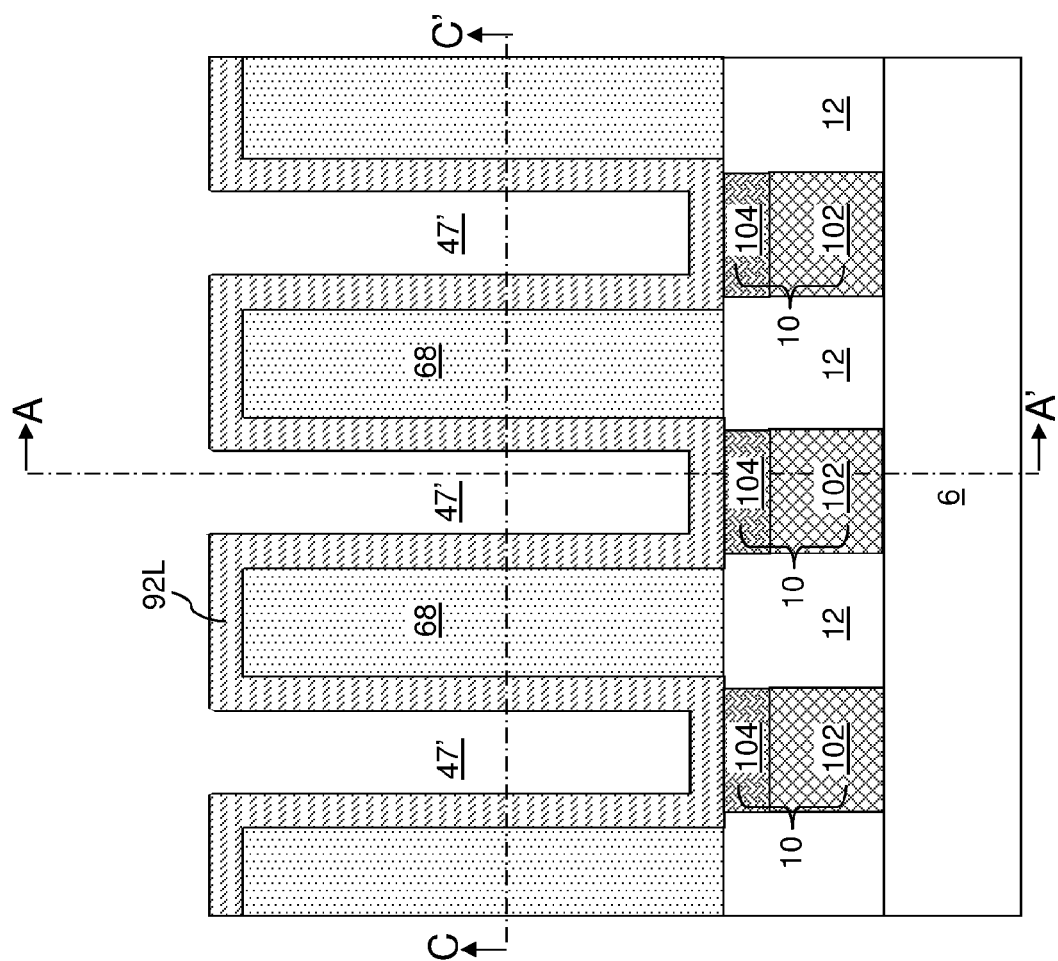
FIG. 10B is a second vertical cross-sectional view of the first exemplary structure of FIG. 10A along the vertical plane B-B'.
Figure 10C:
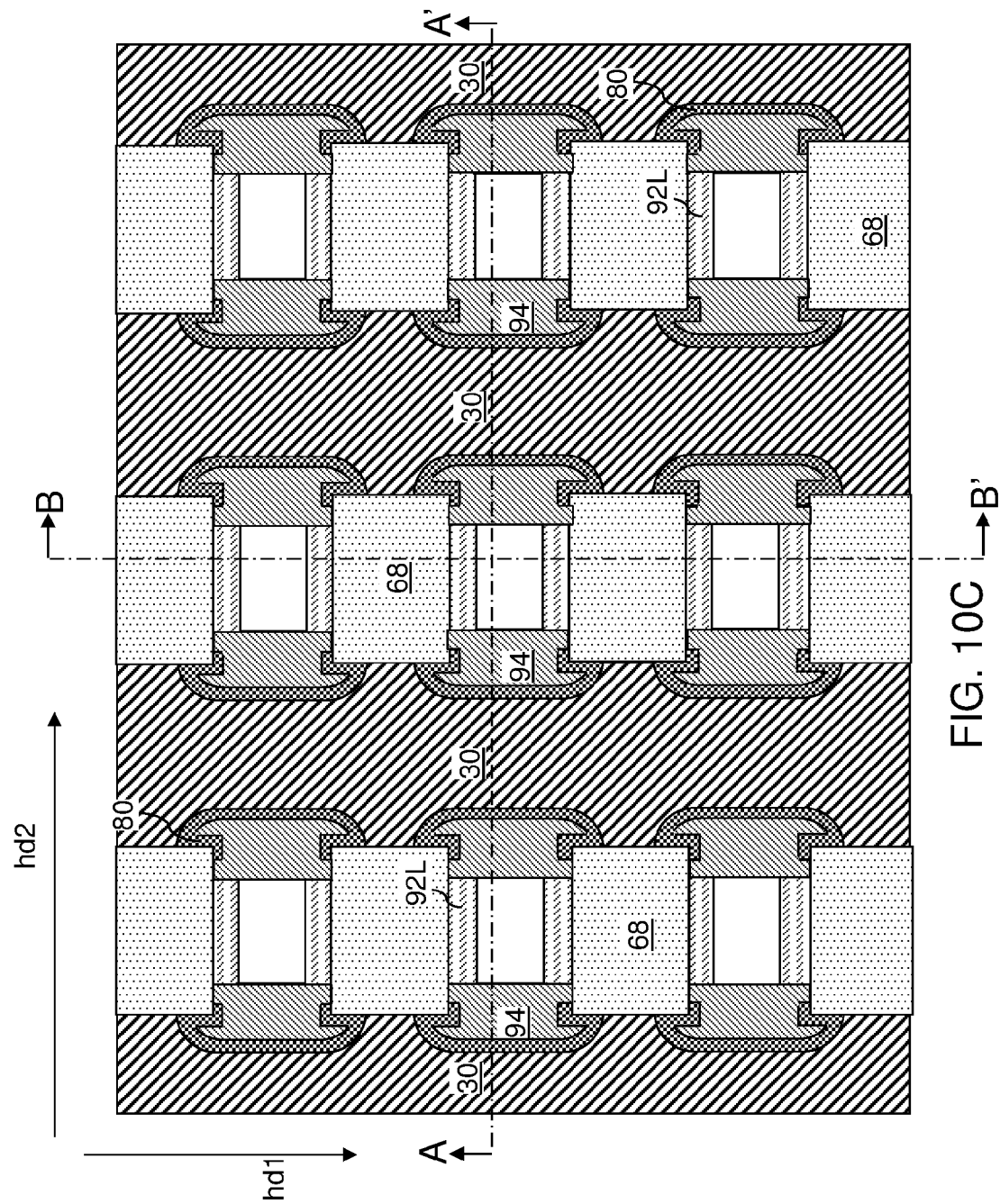
FIG. 10C is a horizontal cross-sectional view of the first exemplary structure of FIGS. 10A and 10B along the horizontal plane C-C'.

Referring to FIGS. 10A-10C, electrical dopants of the first conductivity type can be diffused out of the drain regions 94 as formed at the processing steps of FIGS. 7A-7C into adjacent portions of the semiconductor channel layer 92L. The adjacent portions of the semiconductor channel layer 92L can be converted into additional doped semiconductor regions that are incorporated into the drain regions 94. Diffusion of the electrical dopants of the first conductivity type can be effected, for example, by an anneal process at an elevated temperature using rapid thermal annealing or furnace annealing. For example, the elevated temperature can be in a range from 700 degrees Celsius to 1,050 degrees Celsius. In one embodiment, the elevated temperature can be maintained for a duration that induces the electrical dopants of the first conductivity type to reach the inner sidewalls of the semiconductor channel layer 92L, but does not inducer merger of the discrete drain regions 94. The drain regions 94 remain as vertically separated, discrete structures that do not contact one another after the anneal process. In other words, the expanded drain regions 94 are vertically spaced from one another by remaining portions of the semiconductor channel layer 92L, which is not an electrically conductive material (has electrical resistivity greater than $1.0 \times 10^2$ S/cm).

The drain regions 94 as expanded by the anneal process can be heavily doped. In one embodiment, the drain regions 94 can have a dopant concentration greater than $1.0 \times 10^{19}/cm^3$, and preferably greater than $5.0 \times 10^{19}/cm^3$, even more preferably greater than $2.0 \times 10^{20}/cm^3$, and still more preferably greater than $4.0 \times 10^{20}/cm^3$, such as $2.0 \times 10^{19}/cm^3$ to $1.0 \times 10^{21}/cm^3$, although lesser dopant concentration may also be employed.

Figure 11A:
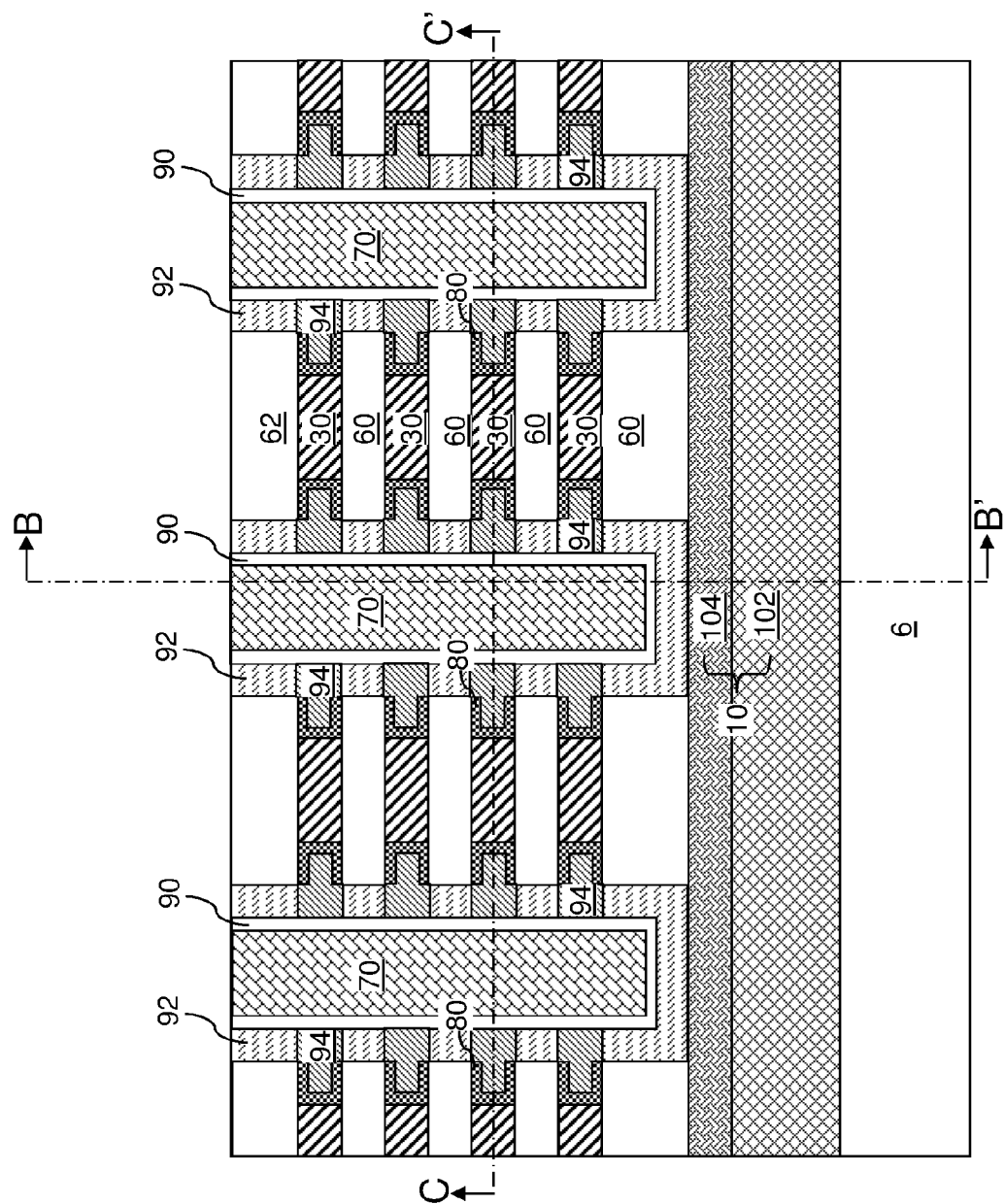
FIG. 11A is a first vertical cross-sectional view of the first exemplary structure after forming gate dielectrics and gate electrodes according to the first embodiment of the present disclosure.
Figure 11B:
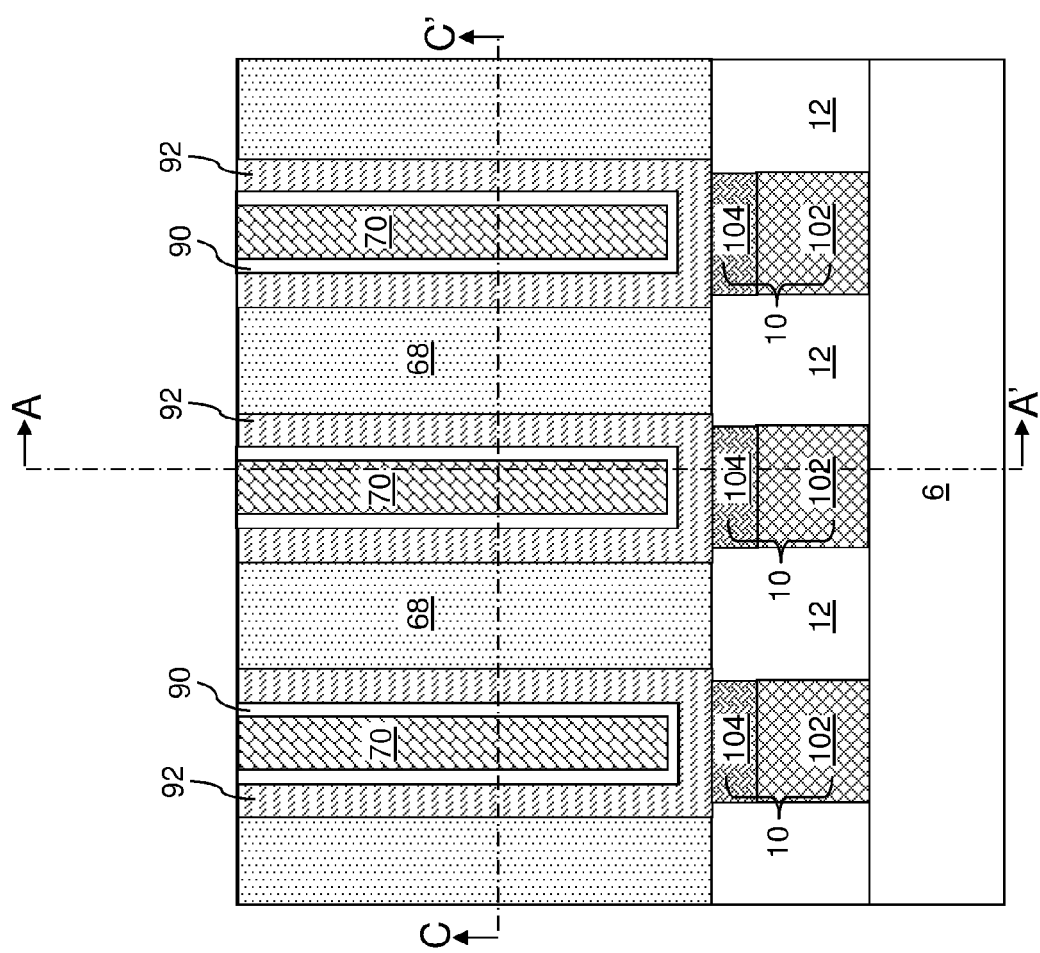
FIG. 11B is a second vertical cross-sectional view of the first exemplary structure of FIG. 11A along the vertical plane B-B'.
Figure 11C:
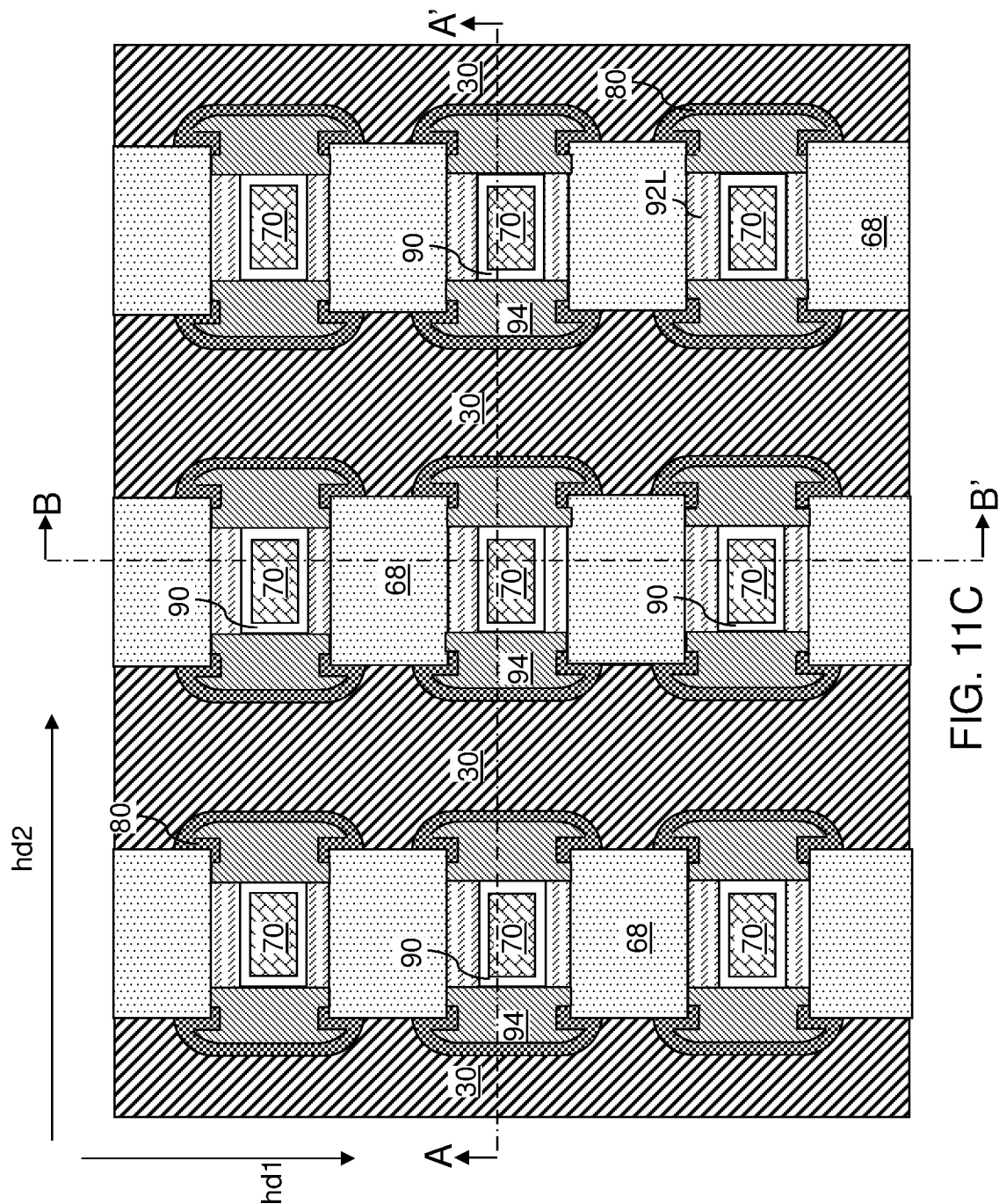
FIG. 11C is a horizontal cross-sectional view of the first exemplary structure of FIGS. 11A and 11B along the horizontal plane C-C'.

Referring to FIGS. 11A-11C, a gate dielectric layer can be formed directly on the physically exposed surfaces of the semiconductor channel layer 92L and the physically exposed surfaces of the drain regions 94. The gate dielectric layer can include at least one dielectric material layer such as a silicon oxide layer, a silicon oxynitride layer, a dielectric metal oxide layer having a dielectric constant greater than 7.9 (i.e., a high-k dielectric layer), or a combination thereof. The gate dielectric layer can be deposited by atomic layer deposition, chemical vapor deposition, thermal oxidation or thermal nitridation of the semiconductor materials of the semiconductor channel layer 92L and the drain regions 94, or a combination thereof. The thickness of the gate dielectric layer can be in a range from 1 nm to 10 nm, although lesser and greater thicknesses can also be employed.

Subsequently, a gate electrode layer including at least one conductive material can be deposited on the gate dielectric layer. The at least one conductive material of the gate electrode layer can include a metal (such as W, Co, Cu, or Al), an intermetallic compound, a metallic nitride liner, a heavily doped semiconductor material (such as polysilicon doped with dopants of the first conductivity type at a concentration of $2.0 \times 10^{19}/cm^3$ to $1.0 \times 10^{21}/cm^3$), a metal-semiconductor alloy material (such as a metal silicide), or a combination thereof. The at least one conductive material of the gate electrode layer can completely fill remaining volumes of the vertical cavities 47'.

A planarization process can be performed to remove portions of the gate electrode layer, the gate dielectric layer, and the semiconductor channel layer 92L that overlie the top surfaces of the insulating cap layer 62. Each remaining portion of the gate electrode layer constitutes a gate electrode 70. Each remaining portion of the gate dielectric layer constitutes a gate dielectric 90. Each remaining portion of the semiconductor 92L is herein referred to as a semiconductor channel 92.

Each gate dielectric 90 is formed on a respective semiconductor channel 92. Each gate dielectric 90 can be formed directly on vertical surfaces, i.e., sidewalls, of the drain regions 94. Each gate electrode 70 is formed within a respective cavity that is laterally surrounded by a respective gate dielectric 90, i.e., within the cavity defined by the inner surfaces of the respective gate dielectric 90. Each horizontal portion of the semiconductor channels 92 contacts a top surface of a respective doped semiconductor rail 104, as shown in FIG. 11B.

Referring to FIGS. 12A-12D, a contact level dielectric layer 170 can be formed over the insulating cap layer 62, the semiconductor channels 92, the gate dielectrics 90, and the gate electrodes 70. Gate contact via structures 72 including a conductive material can be formed through the contact level dielectric layer 170 directly on top surfaces of each gate electrode 70.

A line level dielectric layer 270 can be formed over the contact level dielectric layer 170. Gate lines 74 can be formed in the line level dielectric layer 270, for example, by formation of line trenches in the line level dielectric layer 270 and deposition of a conductive material in the line trenches. After removal of excess portions of the deposited conductive material from above a horizontal plane including the top surface of the line level dielectric layer 270, each remaining portion of the deposited conductive material constitutes a gate line 74. Each gate line 74 can extend along the first horizontal direction hd1 (which can be perpendicular to the second horizontal direction hd2), and can be laterally spaced among one another along the second horizontal direction hd2.

Each contiguous combination of a doped semiconductor rail 104, a semiconductor channel 92, a drain region 94, a gate dielectric 90, and a gate electrode 70 constitutes a vertical field effect transistor. The doped semiconductor rail 104 can function as a source of the vertical field effect transistor. A set of vertical field effect transistors sharing a same doped semiconductor rail 104, a same semiconductor channel 92, a same gate electrode 70, and a same gate dielectric 90 and having different drain regions 94 located around the same gate dielectric 90 are connected in a parallel connection between the node of the same doped semiconductor rail 104 (which is the source node) and the multiple nodes of the drain regions 94. Further, multiple sets of vertical field effect transistors including different gate electrodes 70 among the sets are connected in a parallel connection to the same doped semiconductor rail 104 that functions as the source region.

In one embodiment, the spacer material layers 30 can include electrically conductive layers that function as word lines, and every other word line located at the same level can be tied to a same word line driver. In this case, the total number of independent word lines can be twice the total number of the electrically conductive layers (as embodied as the spacer material layers 30). In case the spacer material layers 30 include a sacrificial material, the spacer material layers 30 can be replaced with electrically conductive layers by removing the sacrificial material selective to the materials of the insulating layers 60 and the memory-material-containing discrete structures 80 to form lateral cavities, and by depositing a conductive material in the lateral cavities.

Each combination of a semiconductor channel 92 and a plurality of drain regions 94 directly contacting the semiconductor channel 92 is herein referred to as a semiconductor local bit line (92, 94), which includes semiconductor materials and functions a local bit line of the memory device. A plurality of local bit lines (92, 94) is connected to each global bit line 10.

Each memory-material-containing discrete structure 80 (or each portion of the memory-material-containing layer stack 180 that provides the functionality of a memory-material-containing discrete structure 80) can be selected by activating the semiconductor local bit line (92, 94) that the memory-material-containing discrete structure 80 contacts, and by activating the electrically conductive layer (provided as a spacer material layer 30 or formed by replacement of the spacer material layer 30 with a layer of an electrically conductive material) that contacts the memory-material-containing discrete structure 80. Activation of the electrically conductive layer (which is a word line) can be performed by applying an electrical bias voltage to the electrically conductive layer.

Activation of the vertical semiconductor local bit line (92, 94) can be performed by applying an electrical bias to the global bit line 10 directly connected to the selected semiconductor local bit line (92, 94) and the gate electrode 70 laterally surrounded by the selected semiconductor local bit line (92, 94). The gate electrode 70 is used to turn the local vertical bit line (92, 94) on and off by being turn on and off. The gate electrode 70 applies a voltage to the local vertical bit line (92, 94) through the gate dielectric 90 to create and remove a depletion region in the semiconductor channel 92 which controls the charge carrier (e.g., electron) flow through the local vertical bit line (92, 94). Thus, the local vertical bit line (92, 94) is considered an adjustable resistance local vertical bit line (92, 94) because its resistance is switched between higher and lower values by switching the gate electrode 70 off and on.

The electrical current flows through the selected global bit line 10, through the selected semiconductor channel 92, through the drain region 94 contacting the selected memory-material-containing discrete structure 80, the selected memory-material-containing discrete structure 80, and the selected electrically conductive layer (i.e., a word line) contacting the selected memory-material-containing discrete structure 80. The selected memory-material-containing discrete structure 80 can be programmed into a high resistance state, programmed into a low resistance state, or sensed to detect the resistive state thereof depending on the electrical bias voltages applied to the selected global bit line 10, the selected gate electrode 70, and the selected word line.

Figure 13B:
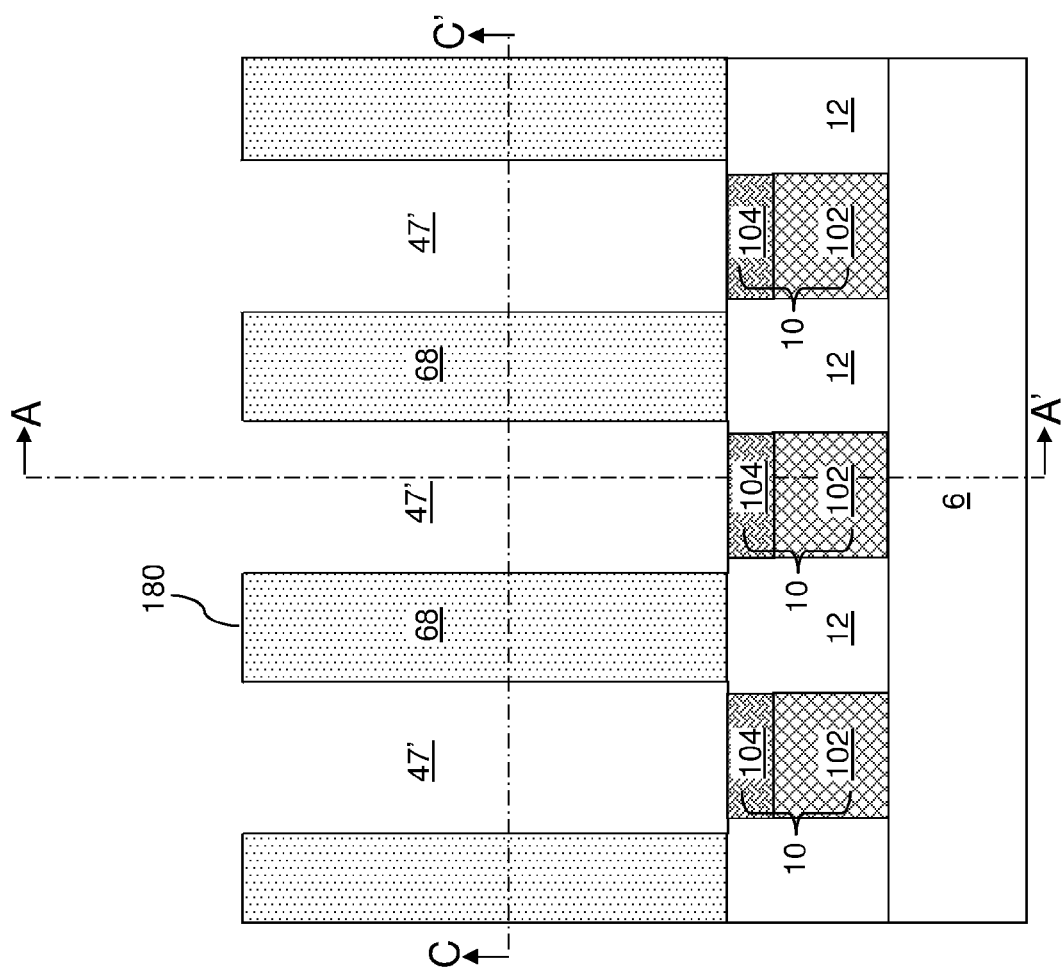
FIG. 13B is a second vertical cross-sectional view of the second exemplary structure of FIG. 13A along the vertical plane B-B'.
Figure 13C:
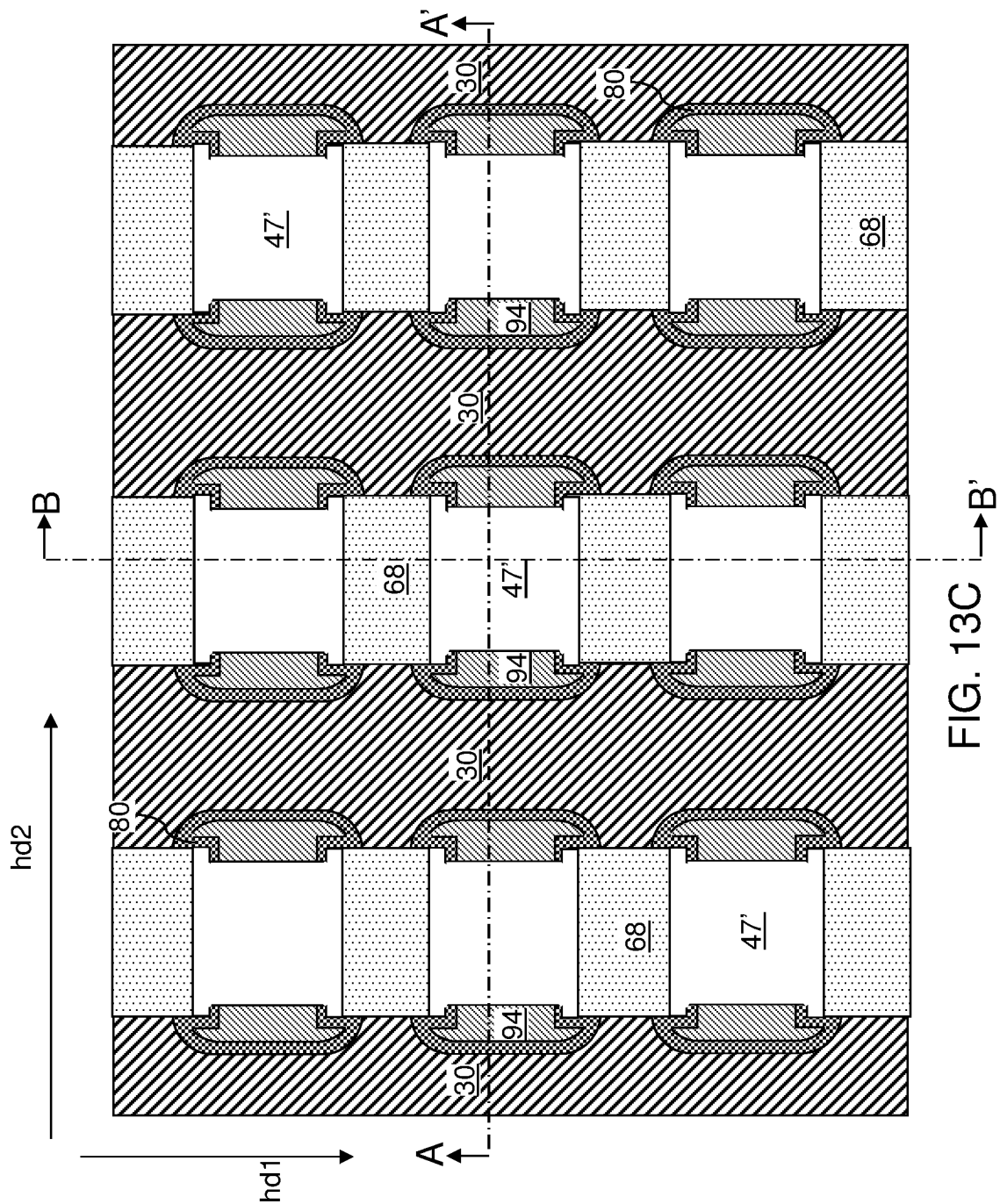
FIG. 13C is a horizontal cross-sectional view of the second exemplary structure of FIGS. 13A and 13B along the horizontal plane C-C'.

Referring to FIGS. 13A-13C, a second exemplary structure according to a second embodiment of the present disclosure can be derived from the first exemplary structure illustrated in FIGS. 8A-8C by laterally recessing the sidewalls of the insulating layers 60, and optionally the sidewalls of the insulating cap layer 62. In this case, the sidewalls of the insulating layers 60 are laterally recessed selective to the drain regions 94 prior to formation of the semiconductor channel layer 92L. Optionally, depending on the composition of the separator pillar structures 68, sidewalls of the separator pillar structures 68 that are physically exposed to the vertical cavities 47' may be collaterally recessed. The extent of the lateral recess of the sidewalls of the insulating layers 60 and of the separator pillar structures is limited to be less than the lateral dimensions of the memory-material-containing discrete structure 80 in order to prevent physical exposure of surfaces of the spacer material layers 30

(thereby avoiding physical contacts between the gate dielectrics 90 and the word lines). In one embodiment, the lateral recess distance of the insulating layers 60 is less than the lateral recess distance of the spacer material layers 30 at the processing steps of FIGS. 5A-5C.

Figure 14A:
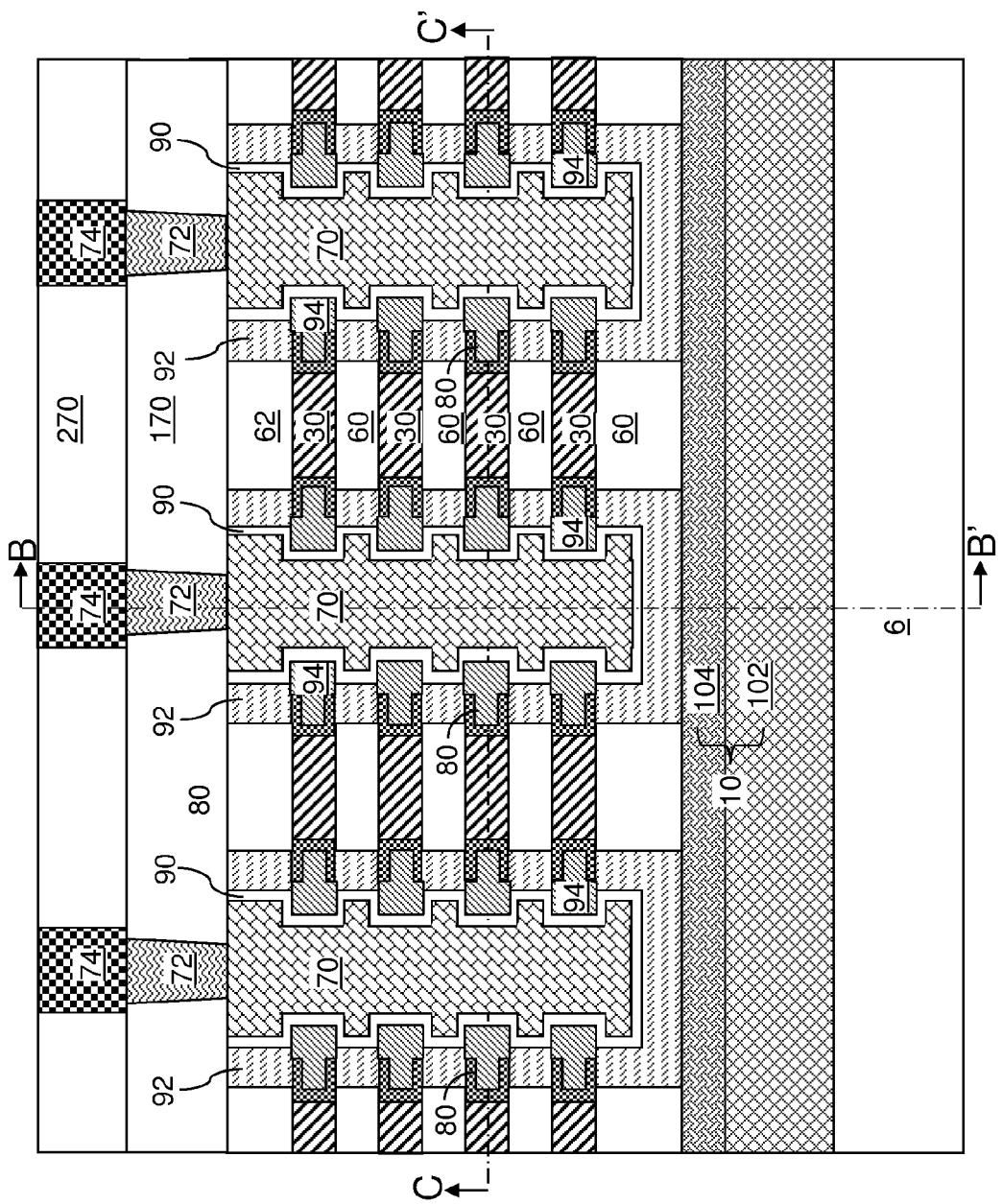
FIG. 14A is a first vertical cross-sectional view of the second exemplary structure after forming contact via structures and gate lines according to the second embodiment of the present disclosure.
Figure 14B:
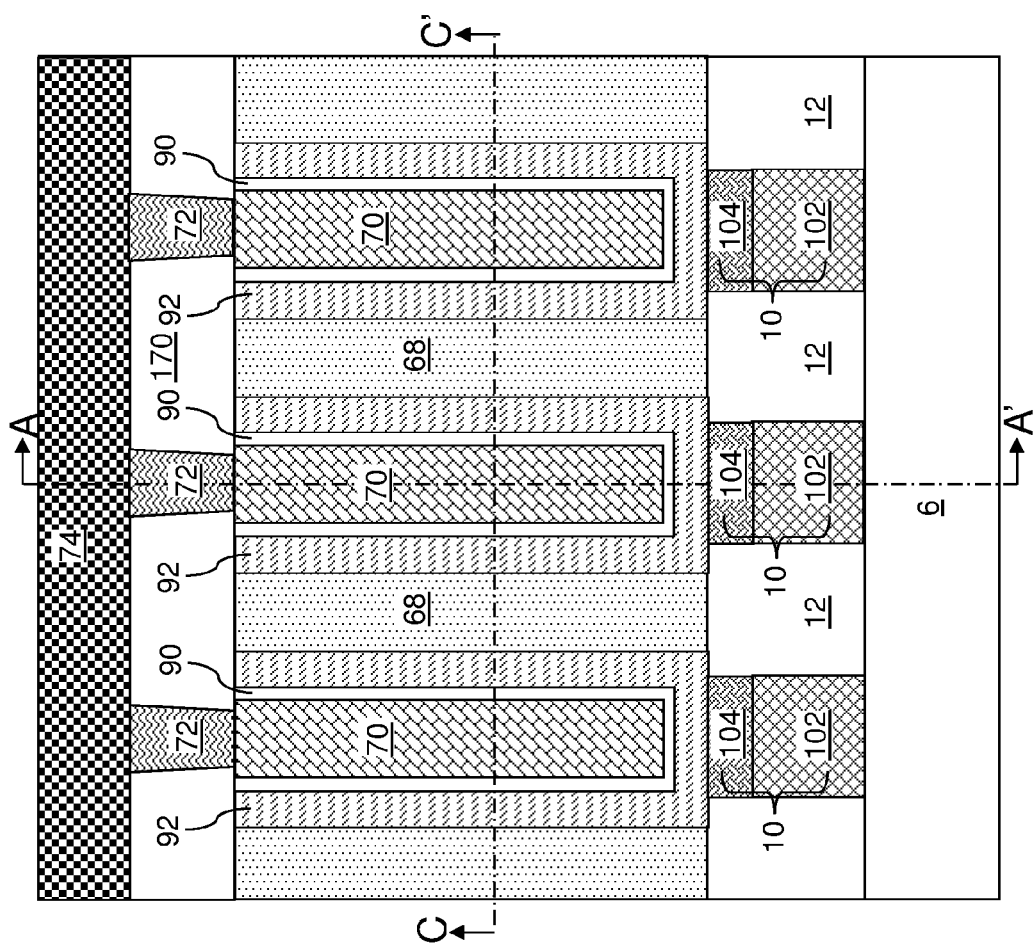
FIG. 14B is a second vertical cross-sectional view of the second exemplary structure of FIG. 14A along the vertical plane B-B'.
Figure 14C:
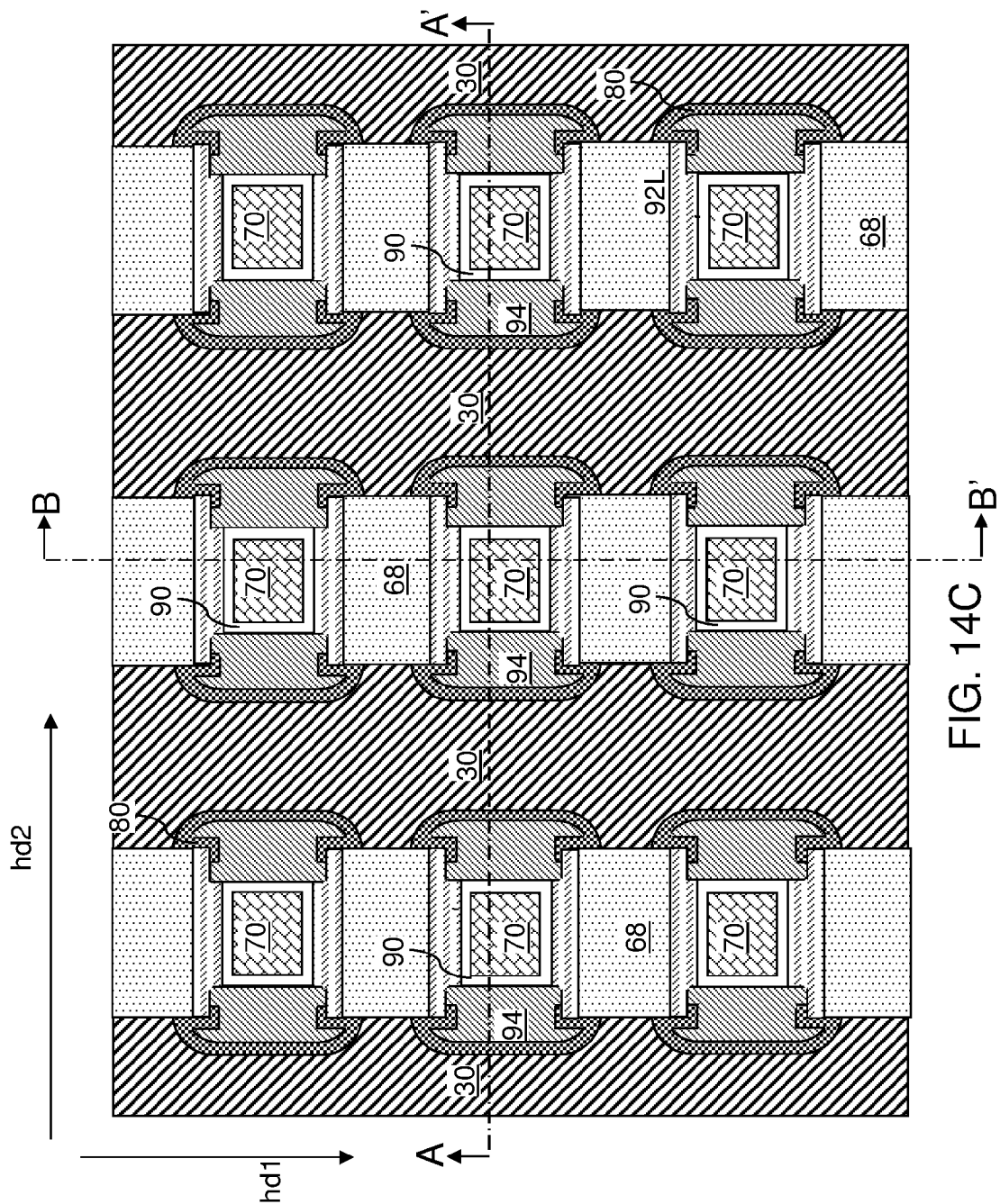
FIG. 14C is a horizontal cross-sectional view of the second exemplary structure of FIGS. 14A and 14B along the horizontal plane C-C'.

Referring to FIGS. 14A-14C, the processing steps of FIGS. 9A-9C, 10A-10C, 11A-11C, and 12A-12C can be sequentially performed to form a three-dimensional memory structure. These steps include forming the semiconductor channel layer 92L over the protruding portions of the drain regions 94 which protrude into the bit line cavity 47. This results in protruding channel portions which protrude into the bit line cavity. The protruding channel portions of the semiconductor channel layer extend into lateral recesses in the gate dielectric layer 90 and the gate electrode 70 after forming the gate dielectric layer and forming the gate electrode, as shown in FIG. 14A.

FIGS. 15A-15D illustrate a portion of the first or second exemplary structure during formation of a first exemplary memory-material-containing stack 180, a drain region 94, a semiconductor channel 92, a gate dielectric 90, and a gate electrode 70 according to an embodiment of the present disclosure.

Figure 15B:
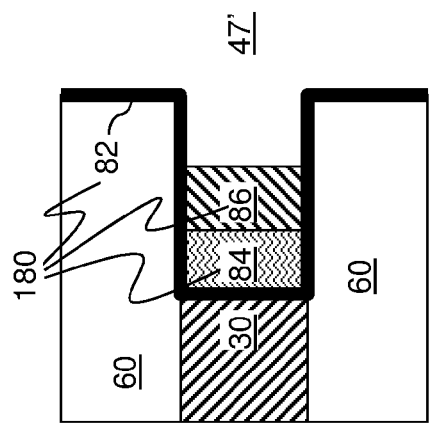
FIGS. 15A-15D are sequential vertical cross-sectional views of a portion of the first or second exemplary structure during formation of a first exemplary memory-material-containing stack, a drain region, a semiconductor channel layer, a gate dielectric, and a gate electrode according to an embodiment of the present disclosure.
Figure 15D:
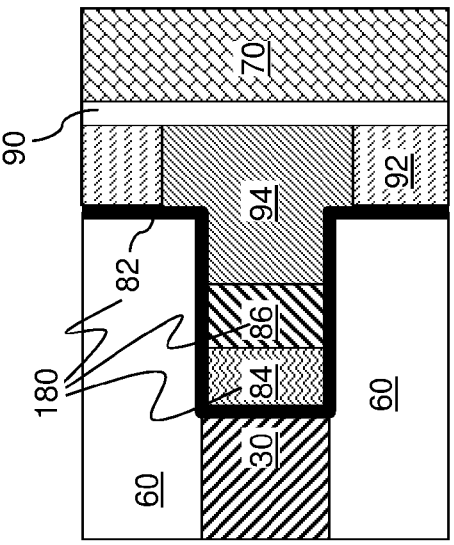
Figure 15A:
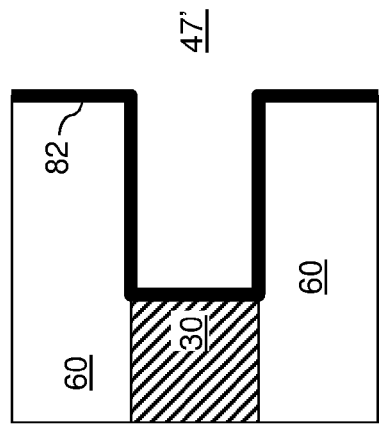

Referring to FIG. 15A, the first exemplary structure of FIGS. 5A-5C is provided. A resistivity switching memory material layer 82 is deposited on the sidewalls of the insulating layers 60, the recessed horizontal surfaces of the insulating layers 60, and the recessed vertical sidewalls of the spacer material layers 30. In one embodiment, the resistivity switching memory material layer 82 can include a filament-forming dielectric material providing a reduced resistivity upon formation of conductive filaments therein (such as a hafnium oxide layer), a vacancy modulated conductive oxide material providing an increased resistivity upon reduction of oxygen vacancy therein (such as a sub-stoichiometric titanium oxide layer) or a phase change chalcogenide material. The resistivity switching memory material layer 82 can be formed by a conformal deposition process such as atomic layer deposition or chemical vapor deposition. The resistivity switching memory material layer 82 can have a thickness in a range from 3 nm to 15 nm, although lesser and greater thicknesses can also be employed.

Referring to FIG. 15B, a selector element (84, 86) can be formed within each lateral recess around the vertical cavities 47'. Each selector element can include, for example, a barrier material portion 84 and a conductive material portion 86. The barrier material portion 84 includes a barrier material that has a suitable combination of a band gap and thickness in order to limit electrical current therethrough at low electrical fields (i.e., at lower applied voltage), while allowing a significant amount of electrical current to pass through at high electrical fields (i.e., at higher applied voltage). For example, the barrier material portion 84 can include amorphous silicon, amorphous germanium, an amorphous silicon germanium alloy, or aluminum oxide. The barrier material portion 84 can be formed, for example, by deposition of a barrier material by a conformal deposition process and a lateral recess etch that etches the barrier material from the sidewalls of the resistivity switching memory material layer 82, while leaving a portion of the deposited barrier material within each lateral recess. The barrier material portion 84 can have a lateral thickness in a range from 3 nm to 15 nm, although lesser and greater thicknesses can also be employed.

The conductive material portion 86 includes a conductive material such as a metallic nitride (e.g., TiN, TaN, or WN). The conductive material portion 86 can be formed by deposition of a conductive material by a conformal deposition process and a lateral recess etch that etches the conductive material from the sidewalls of the resistivity switching memory material layer 82, while leaving a portion of the deposited conductive material within each lateral recess. Each combination of a conductive material portion 86 and the barrier material portion 84 constitutes a selector element (84, 86). The combination of the resistivity switching memory material layer 82 and the set of all selector elements (84, 86) constitutes a memory-material-containing stack 180. The resistivity switching memory material layer 82 is located between and contacts both the respective selector element (84, 86) and the respective word line 30.

Figure 15C:
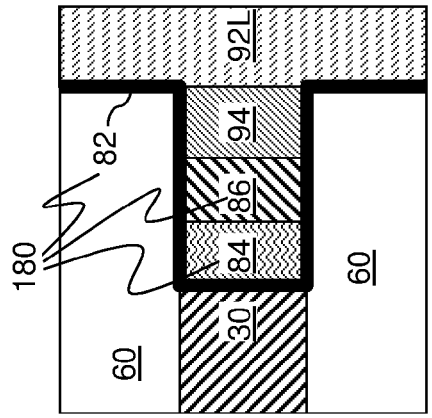

Referring to FIG. 15C, a doped semiconductor layer 94L can be deposited employing the processing steps of FIGS. 6A-6C. The processing steps of FIGS. 7A-7C can be performed to form a drain region 94 on each selector element (84, 86). Horizontal portions of the memory-material-containing stack 180 overlying the insulating cap layers 62 or the global bit lines 10 can be removed, for example, by an anisotropic etch or an isotropic etch. In case an isotropic etch is employed, vertical portions of the memory-material-containing stack 180 over the sidewalls of the insulating layers 60 may be removed as illustrated in FIGS. 8A-8C. A semiconductor channel layer 92L can be formed directly on the drain regions 94 employing the processing steps of FIGS. 9A-9C.

A selector element (84, 86) can be formed in each lateral recess. Thus, a plurality of selector elements (84, 86) can be formed at each level of the spacer material layers 30. Each of the plurality of selector elements contacts a respective resistive memory element as embodied as a portion of the resistivity switching memory material layer 82 located at the level of the respective spacer material layers 30.

Referring to FIG. 15D, the processing steps of FIGS. 10A-10C can be performed to increase the size of each drain region 94. The processing steps of FIGS. 11A-11C can be performed to pattern the semiconductor channel layer 92, thereby forming a plurality of semiconductor channels 92. A gate dielectric 90 and a gate electrode 70 can be formed on each semiconductor channel 92.

FIGS. 16A-16D illustrate a portion of the first or second exemplary structure during formation of a second exemplary memory-material-containing stack 180, a drain region 94, a semiconductor channel 92, a gate dielectric 90, and a gate electrode 70 according to an embodiment of the present disclosure.

Referring to FIG. 16A, the first exemplary structure of FIGS. 5A-5C is provided. A selector element (84, 86) can be formed within each lateral recess around the vertical cavities 47' prior to forming a resistivity switching memory material layer 82. The processing steps of FIG. 15B can be employed to form the selector elements (84, 86) in the lateral recesses.

Referring to FIG. 16B, the processing steps of FIG. 15A can be performed to form a resistivity switching memory material layer 82. Thus, the processing steps of FIG. 15A and the processing steps of FIG. 15B are reversed in order to perform the processing steps of FIGS. 16A and 16B.

Referring to FIG. 16C, a doped semiconductor layer 94L can be deposited employing the processing steps of FIGS. 6A-6C. The processing steps of FIGS. 7A-7C can be performed to form a drain region 94 on the resistivity switching memory material layer 82. Horizontal portions of the memory-material-containing stack 180 overlying the insulating cap layers 62 or the global bit lines 10 can be removed, for example, by an anisotropic etch or an isotropic etch. In case an isotropic etch is employed, vertical portions of the memory-material-containing stack 180 over the sidewalls of the insulating layers 60 may be removed as illustrated in FIGS. 8A-8C. A semiconductor channel layer 92L can be formed directly on the drain regions 94 employing the processing steps of FIGS. 9A-9C.

A selector element (84, 86) can be formed in each lateral recess. Thus, a plurality of selector elements (84, 86) can be formed at each level of the spacer material layers 30. Each of the plurality of selector elements contacts a respective resistive memory element as embodied as a portion of the resistivity switching memory material layer 82 located at the level of the respective spacer material layers 30 (i.e., word lines). The selector element (84, 86) is located between and contacts both the resistivity switching memory material layer 82 and the respective word line 30.

Referring to FIG. 16D, the processing steps of FIGS. 10A-10C can be performed to increase the size of each drain region 94. The processing steps of FIGS. 11A-11C can be performed to pattern the semiconductor channel layer 92, thereby forming a plurality of semiconductor channels 92. A gate dielectric 90 and a gate electrode 70 can be formed on each semiconductor channel 92.

FIGS. 17A-17D illustrate a portion of the first or second exemplary structure during formation of a third exemplary memory-material-containing stack 180, a drain region 94, a semiconductor channel 92, a gate dielectric 90, and a gate electrode 70 according to an embodiment of the present disclosure.

Figure 17A:
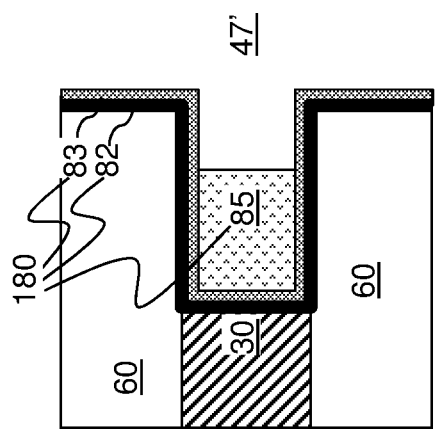
FIGS. 17A-17D are sequential vertical cross-sectional views of a portion of the first or second exemplary structure during formation of a third exemplary memory-material-containing stack, a drain region, a semiconductor channel layer, a gate dielectric, and a gate electrode according to an embodiment of the present disclosure.

Referring to FIG. 17A, the first exemplary structure of FIGS. 5A-5C is provided. A resistivity switching memory material layer 82 can be deposited on the sidewalls of the insulating layers 60, recessed horizontal surfaces of the insulating layers 60, and recessed sidewalls of the spacer material layers 30 by a conformal deposition process such as atomic layer deposition or chemical vapor deposition. The resistivity switching memory material layer 82 can include a resistivity switching memory material selected from a filament-forming dielectric material providing a reduced resistivity upon formation of conductive filaments therein (such as hafnium oxide) and a vacancy modulated conductive oxide material providing an increased resistivity upon reduction of oxygen vacancy therein (such as titanium oxide). The thickness of the resistivity switching memory material layer 82 can be in a range from 3 nm to 15 nm, although lesser and greater thicknesses can also be employed.

An optional barrier material layer 83 can be deposited on the resistivity switching memory material layer 82 by a conformal deposition. The barrier material layer 83 includes a barrier material that has a suitable combination of a band gap and thickness in order to limit electrical current therethrough at low electrical fields, while allowing a significant amount of electrical current to pass through at high electrical fields. For example, the barrier material layer 83 can include silicon nitride, amorphous silicon, amorphous germanium, an amorphous silicon germanium alloy, or aluminum oxide. The barrier material layer 83 can have a lateral thickness in a range from 3 nm to 15 nm, although lesser and greater thicknesses can also be employed. As an optional structure, the optional barrier material layer 83 may be omitted.

Figure 17B:
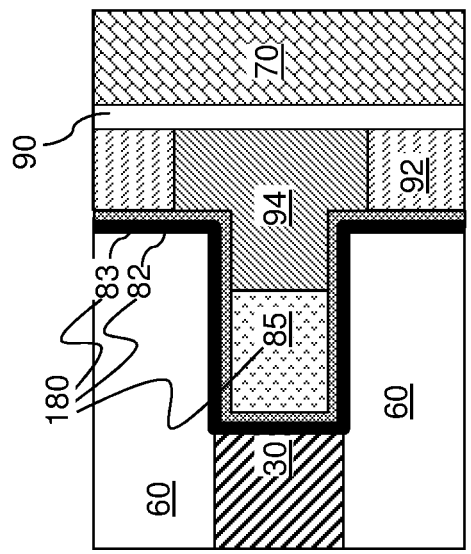

Referring to FIG. 17B, a second-conductivity-type doped semiconductor portion 85 can be formed within each lateral recess located at the levels of the spacer material layers 30. The second-conductivity-type doped semiconductor portions 85 include a doped semiconductor material having a doping of the second conductivity type, which is the opposite of the first conductivity type (e.g., p-type polysilicon). For example, if the first conductivity type is n-type, the second conductivity type is p-type, and vice versa. The second-conductivity-type doped semiconductor portions 85 can be formed by deposition of a doped semiconductor material having a doping of the second conductivity type by a conformal deposition process, and by a lateral recess etch that etches the doped semiconductor material from the sidewalls of the barrier material layer 83, while leaving a portion of the deposited doped semiconductor material within each lateral recess. Each remaining portion of the doped semiconductor material constitutes a second-conductivity-type doped semiconductor portion 85. The combination of the resistivity switching memory material layer 82, the barrier material layer 83, and the set of all second-conductivity-type doped semiconductor portions 85 constitutes a memory-material-containing stack 180.

Figure 17C:
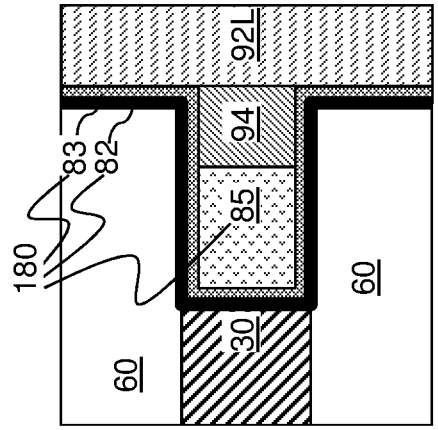

Referring to FIG. 17C, a doped semiconductor layer 94L of the first conductivity type can be deposited employing the processing steps of FIGS. 6A-6C. The processing steps of FIGS. 7A-7C can be performed to form a drain region 94 on each second-conductivity-type doped semiconductor portion 85, i.e., by patterning the doped semiconductor layer 94. Horizontal portions of the memory-material-containing stack 180 overlying the insulating cap layers 62 or the global bit lines 10 can be removed, for example, by an anisotropic etch or an isotropic etch. In case an isotropic etch is employed, vertical portions of the memory-material-containing stack 180 over the sidewalls of the insulating layers 60 may be removed as illustrated in FIGS. 8A-8C. A semiconductor channel layer 92L can be formed directly on the drain regions 94 employing the processing steps of FIGS. 9A-9C.

Each combination of the second-conductivity-type doped semiconductor portion 85 and the drain region 94 in physical contact with each other constitutes a diode, which is a selector element (85, 94). While a p-n junction diode is illustrated herein, a p-i-n junction diode may be employed in lieu of a p-n junction diode. A selector element (85, 94) can be formed in each lateral recess. Thus, a plurality of selector elements (85, 94) can be formed at each level of the spacer material layers 30. Thus, the drain region 94 is part of the selector in this embodiment.

Figure 17D:
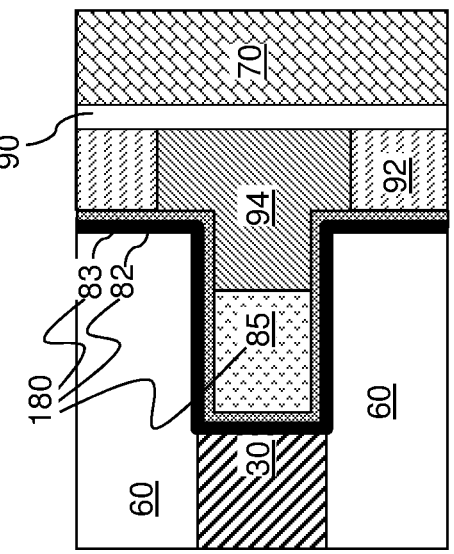

Referring to FIG. 17D, the processing steps of FIGS. 10A-10C can be performed to increase the size of each drain region 94. The processing steps of FIGS. 11A-11C can be performed to pattern the semiconductor channel layer 92, thereby forming a plurality of semiconductor channels 92. A gate dielectric 90 and a gate electrode 70 can be formed on each semiconductor channel 92.

FIGS. 18A-18D illustrate a portion of the first or second exemplary structure during formation of a fourth exemplary memory-material-containing stack 180, a drain region 94, a semiconductor channel 92, a gate dielectric 90, and a gate electrode 70 according to an embodiment of the present disclosure.

Figure 18B:
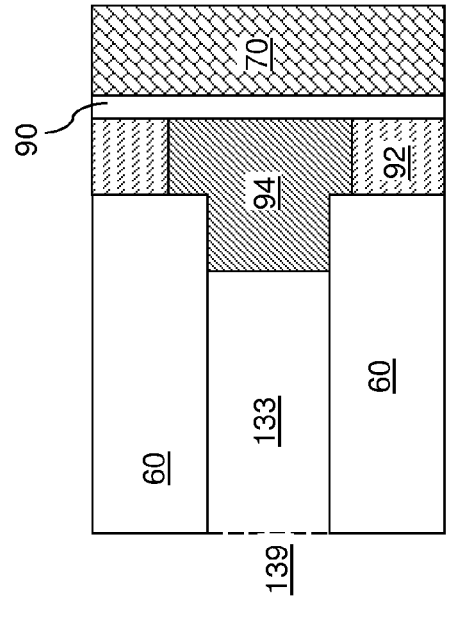
FIGS. 18A-18D are sequential vertical cross-sectional views of a portion of the first or second exemplary structure during formation of a fourth exemplary memory-material-containing stack, a drain region, a semiconductor channel layer, a gate dielectric, and a gate electrode according to an embodiment of the present disclosure.
Figure 18A:
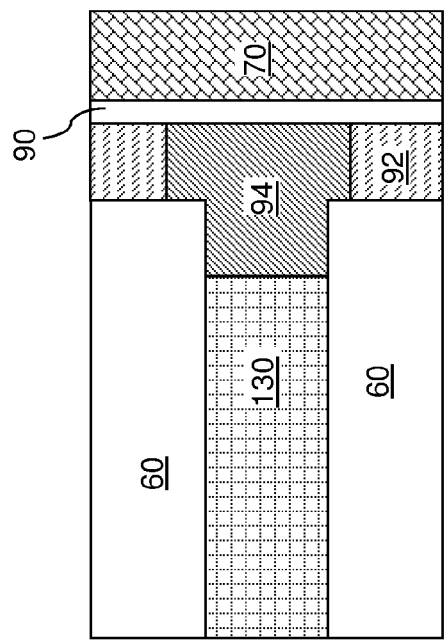

Referring to FIG. 18A, a modification of the first exemplary structure is employed in which the spacer material layers 30 at the processing steps of FIGS. 2A-2C are formed as sacrificial material layers 130. For example, the sacrificial material layers 130 can include silicon nitride, a porous organosilicate glass, germanium, a silicon-germanium alloy, amorphous carbon, or diamond-like carbon (DLC). Formation of the exemplary memory-material-containing stack 180 at the processing steps of FIGS. 6A-6C is omitted. The doped semiconductor layer 94L is formed directly on the sidewalls of the insulating layers 60, the recessed horizontal surfaces of the insulating layers 60 and the recessed sidewalls of the sacrificial material layers 130 employing the same processing steps as the processing steps of FIGS. 6A-6C employed to form the doped semiconductor layer 94L.

Subsequently, the processing steps of FIGS. 7A-7C are performed to form drain regions 94. For example, an anisotropic etch can be performed to remove portions of the doped semiconductor layer 94L from outside the lateral recesses, i.e., to remove portions of the doped semiconductor layer 94L that do not underlie an insulating layer 60. The processing steps of FIGS. 9A-9C can be performed to form a semiconductor channel layer 92L. The processing steps of FIGS. 10A-10C can be performed to anneal the drain regions 94 and the semiconductor channel layer 92L, thereby increasing the size of the drain regions 94. The processing steps of FIGS. 11A-11C can be performed to pattern the semiconductor channel layer 92L into semiconductor channels 92, and to form a gate dielectric 90 and a gate electrode 70 within each vertical cavity.

Figure 18D:
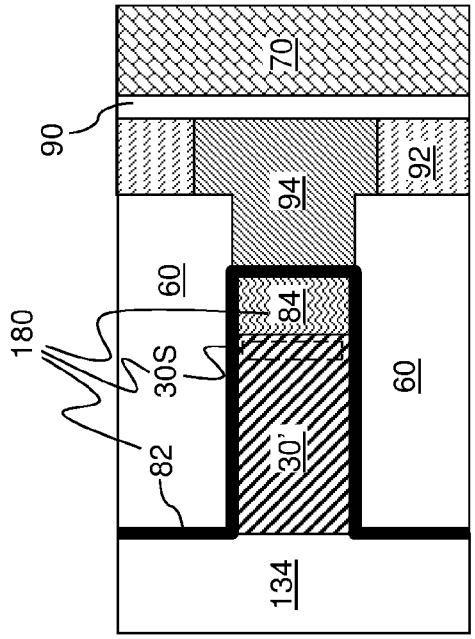
Figure 18C:
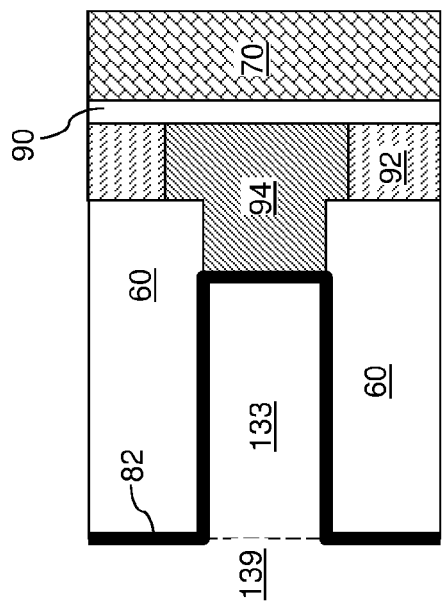

Referring to FIG. 18C, a backside trench 139 can be formed through a portion of each alternating stack (130, 60) and each insulating cap layer 62. The backside trench 139 extends at least to the bottommost sacrificial material layer 130 within each alternating stack (130, 60). The backside trench 139 can be formed, for example, by applying and patterning a photoresist layer over the insulating cap layers 62 to form line trenches extending along the second horizontal direction hd2 and laterally offset from the global bit lines 10 in the patterned photoresist layer, and by transferring the pattern of the line trenches through the insulating cap layer 62 (that overlies the alternating stacks (130, 60)) and through each of the alternating stacks (130, 60).

An etchant that removes the sacrificial material of the sacrificial material layers 130 selective to the materials of the insulating layers 60 and the drain regions 94 can be introduced into the backside trench 139. Backside cavities 133 are formed in the volumes from which the sacrificial material layers 130 are removed. In one embodiment, each backside cavity 133 can laterally extend along the first horizontal direction hd1 and can have laterally modulated widths.

Referring to FIG. 18D, a resistivity switching memory material layer 82 is deposited the backside trench 139 and the backside cavities 133 connected to the backside trench 139. The resistivity switching memory material layer 82 can be deposited as a continuous material layer having a uniform thickness. In one embodiment, the resistivity switching memory material layer 82 can include a filament-forming dielectric material providing a reduced resistivity upon formation of conductive filaments therein (such as a hafnium oxide layer), a vacancy modulated conductive oxide material providing an increased resistivity upon reduction of oxygen vacancy therein (such as a sub-stoichiometric titanium oxide layer) or a phase change chalcogenide material. The resistivity switching memory material layer 82 can be formed by a conformal deposition process such as atomic layer deposition or chemical vapor deposition. The resistivity switching memory material layer 82 can have a thickness in a range from 3 nm to 15 nm, although lesser and greater thicknesses can also be employed.

A barrier material portion 84 can be formed on the resistivity switching memory material layer 82 through the back side trenches 139. The barrier material portion 84 includes a barrier material that has a suitable combination of a band gap and thickness in order to limit electrical current therethrough at low electrical fields, while allowing a significant amount of electrical current to pass through at high electrical fields. For example, the barrier material portion 84 can include amorphous silicon, amorphous germanium, an amorphous silicon germanium alloy, or aluminum oxide. The barrier material portion 84 can be formed, for example, by deposition of a barrier material by a conformal deposition process and a lateral recess etch that etches the barrier material from the sidewalls of the resistivity switching memory material layer 82, while leaving a portion of the deposited barrier material within each lateral recess. The barrier material portion 84 can have a lateral thickness in a range from 3 nm to 15 nm, although lesser and greater thicknesses can also be employed.

An electrically conductive layer 30' can be deposited within each remaining volume of the backside cavities 133 back side trenches 139. The electrically conductive layer 30' can include a conductive metallic nitride such as TiN, TaN, WN, or a combination thereof with a metal layer including a metal such as W, Co, Ru, Mo, Cu, Al, or an intermetallic alloy thereof. The electrically conductive layers 30' can be deposited by at least one conformal deposition process such as atomic layer deposition or chemical vapor deposition.

Each combination of a barrier material portion 84 and an interior surface portion 30S of the electrically conductive layer 30' in contact with the barrier material portion 84 constitutes a selector element (84, 30S). The combination of the resistivity switching memory material layer 82 and the set of all selector elements (84, 30S) constitute a memory-material-containing stack 180. The electrically conductive layers 30' function as the word lines of the memory device. A dielectric trench fill structure 134 can be formed in the backside trench 139 by depositing a dielectric material in the backside trench 139. In this exemplary structure, vertical portion of the resistivity switching memory material layer 82 can contact distal sidewalls of the insulating layers 60 that do not contact a semiconductor channel 92. Each proximal sidewall of the insulating layer 60 can contact a semiconductor channel 92 and a base portion of a drain region 94 (i.e., the portion of the drain region 94 that does not protrude into a lateral recess).

FIGS. 19A-19D illustrate a portion of the first or second exemplary structure during formation of a fifth exemplary memory-material-containing stack 180, a drain region 94, a semiconductor channel 92, a gate dielectric 90, and a gate electrode 70 according to an embodiment of the present disclosure.

Figure 19B:
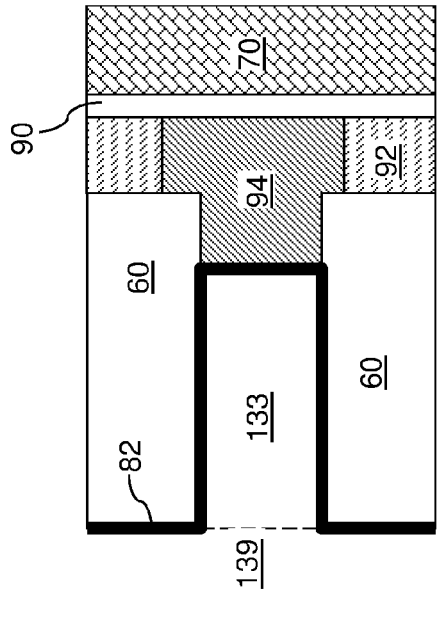
FIGS. 19A-19D are sequential vertical cross-sectional views of a portion of the first or second exemplary structure during formation of a fifth exemplary memory-materialcontaining stack, a drain region, a semiconductor channel layer, a gate dielectric, and a gate electrode according to an embodiment of the present disclosure.
Figure 19A:
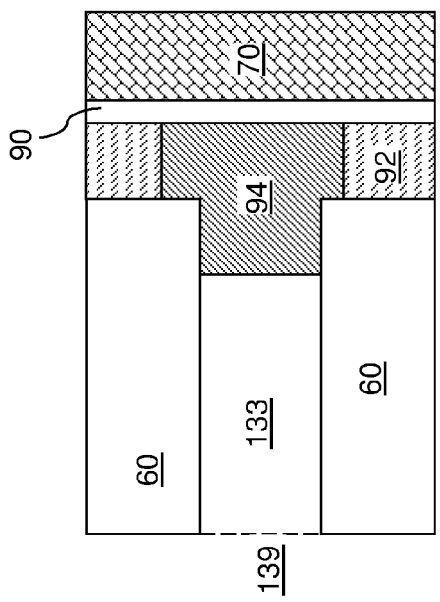

Referring to FIG. 19A, the structure illustrated in FIG. 18B can be provided.

Referring to FIG. 19B, the processing steps of FIG. 18C can be performed to provide the structure illustrated in FIG. 18C.

Figure 19D:
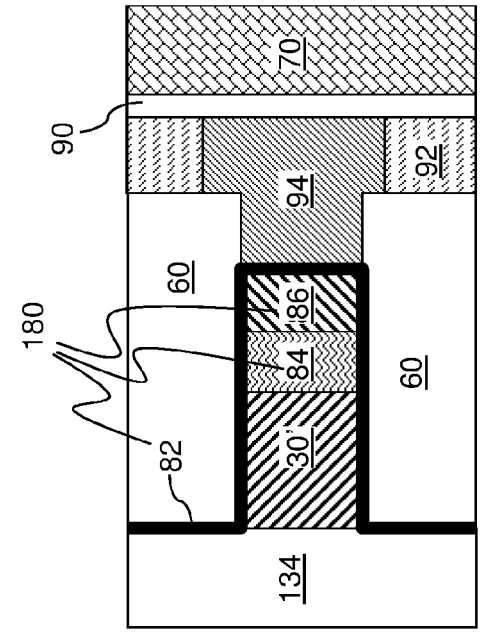
Figure 19C:
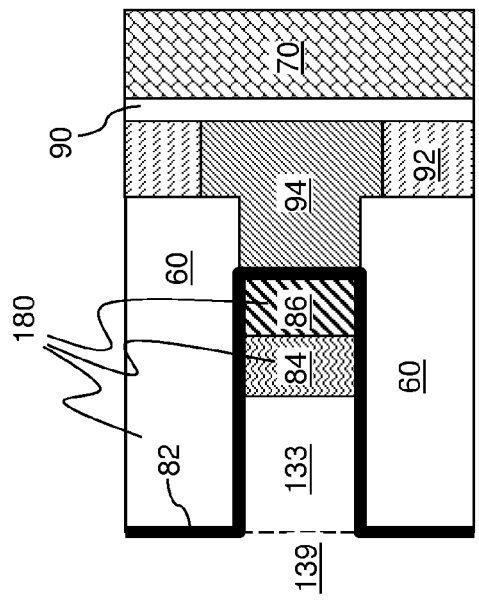

Referring to FIG. 19C, a conductive material portion 86 includes a conductive material such as a metallic nitride (e.g., TiN, TaN, or WN) can be formed within each backside cavity 133 prior to forming a barrier material portion 84. The conductive material portion 86 can be formed by deposition of a conductive material by a conformal deposition process and a lateral recess etch that etches the conductive material from the sidewalls of the resistivity switching memory material layer 82, while leaving a portion of the deposited conductive material within each lateral recess. Subsequently, a barrier material portion 84 is formed directly on the sidewall of a respective conductive material portion 86 within each backside cavity 133. Each combination of a conductive material portion 86 and the barrier material portion 84 constitutes a selector element (84, 86). The combination of the resistivity switching memory material layer 82 and the set of all selector elements (84, 86) constitutes a memory-material-containing stack 180.

Referring to FIG. 19D, the processing steps of FIG. 18D can be performed to form electrically conductive layers 30' and the dielectric trench fill structure 134.

While the present disclosure is described employing embodiments in which the spacer material layers 30 are formed as electrically conductive layers, embodiments are expressly contemplated herein in which the spacer material layers 30 are formed as sacrificial material layers 130 including a sacrificial material, and is subsequently replaced with electrically conductive layers. Thus, the exemplary structures illustrated in FIGS. 12A-12C or in FIGS. 14A-14C include the spacer material layers 30 as electrically conductive layers that function as word lines. As such, the spacer material layers 30 in FIGS. 12A-12C and in FIGS. 14A-14C, and the electrically conductive layers 30' in FIGS. 18D and 19D are referred to as electrically conductive layers 30 or word lines 30 in subsequent portions of the present disclosure for the purpose of describing the present disclosure with brevity.

Figure 12A:
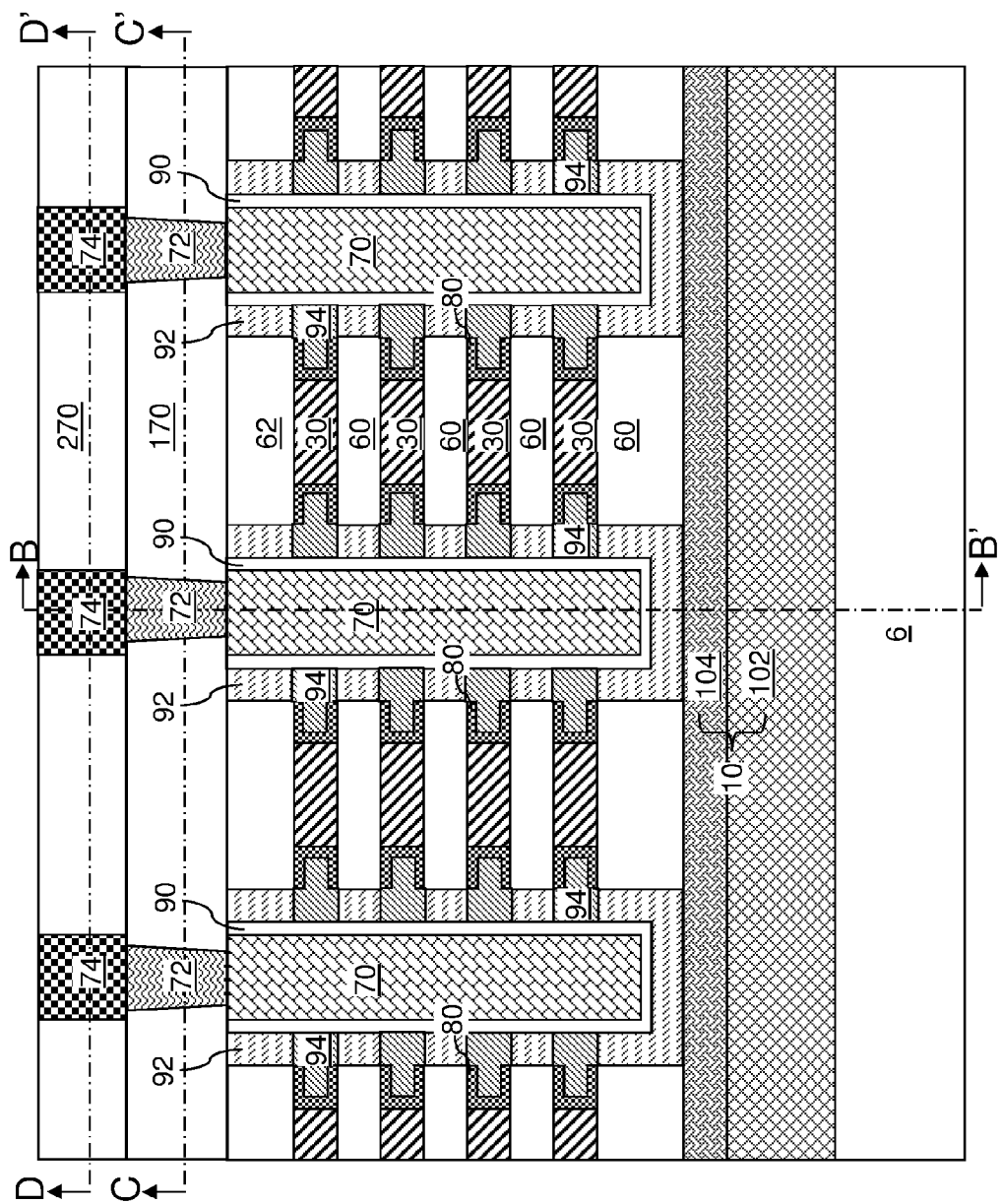
FIG. 12A is a first vertical cross-sectional view of the first exemplary structure after forming contact via structures and gate lines according to the first embodiment of the present disclosure.
Figure 12B:
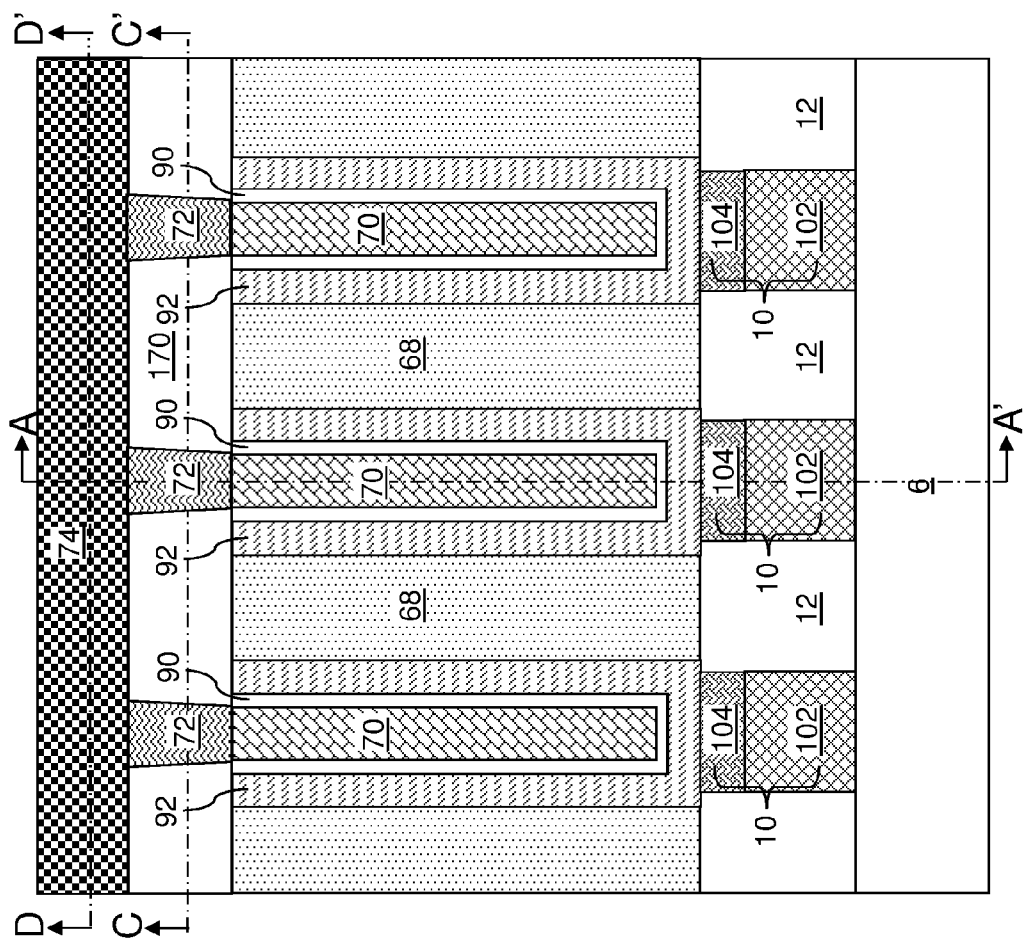
FIG. 12B is a second vertical cross-sectional view of the first exemplary structure of FIG. 12A along the vertical plane B-B'.
Figure 12C:
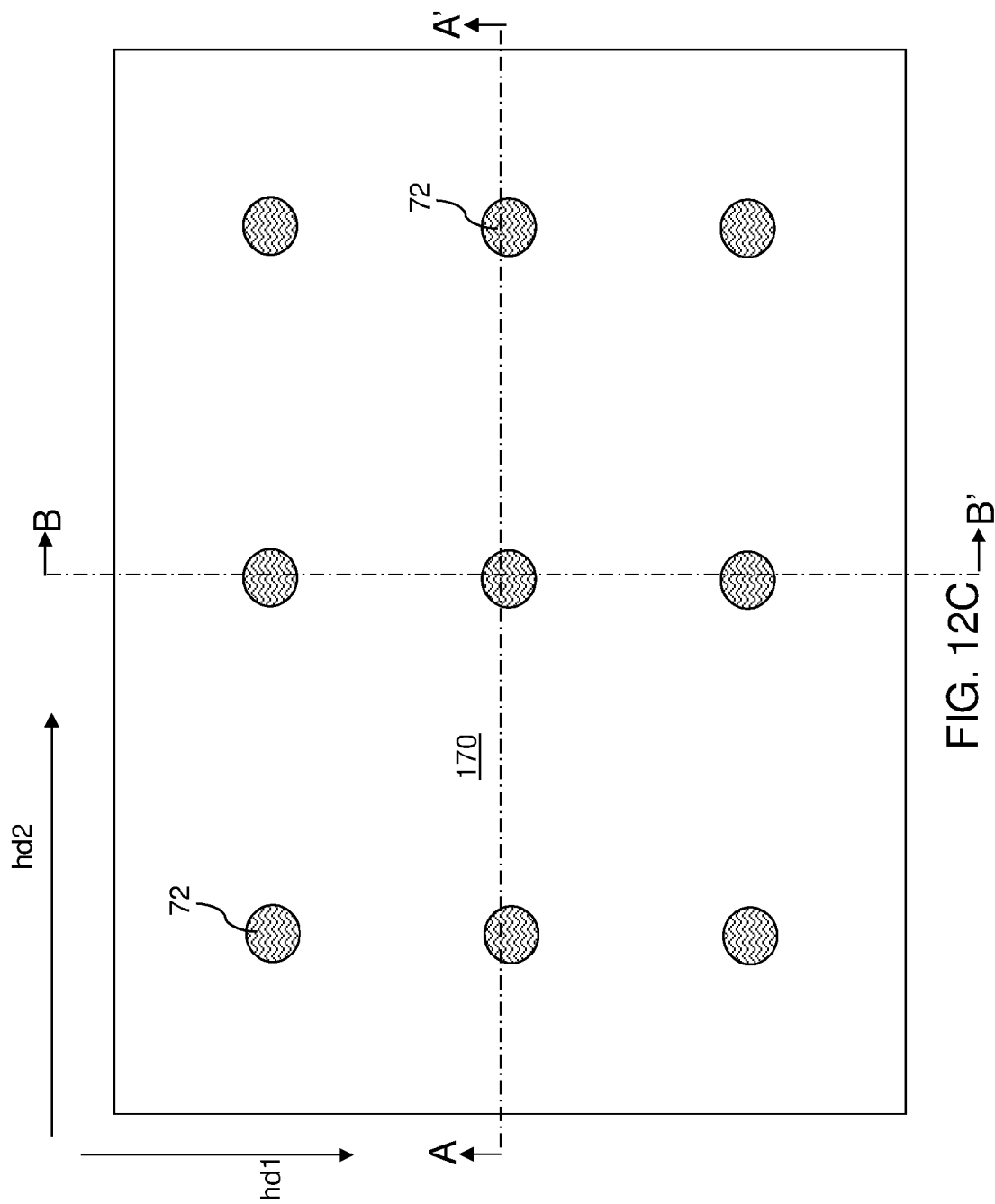
FIG. 12C is a horizontal cross-sectional view of the first exemplary structure of FIGS. 12A and 12B along the horizontal plane C-C'.
Figure 12D:
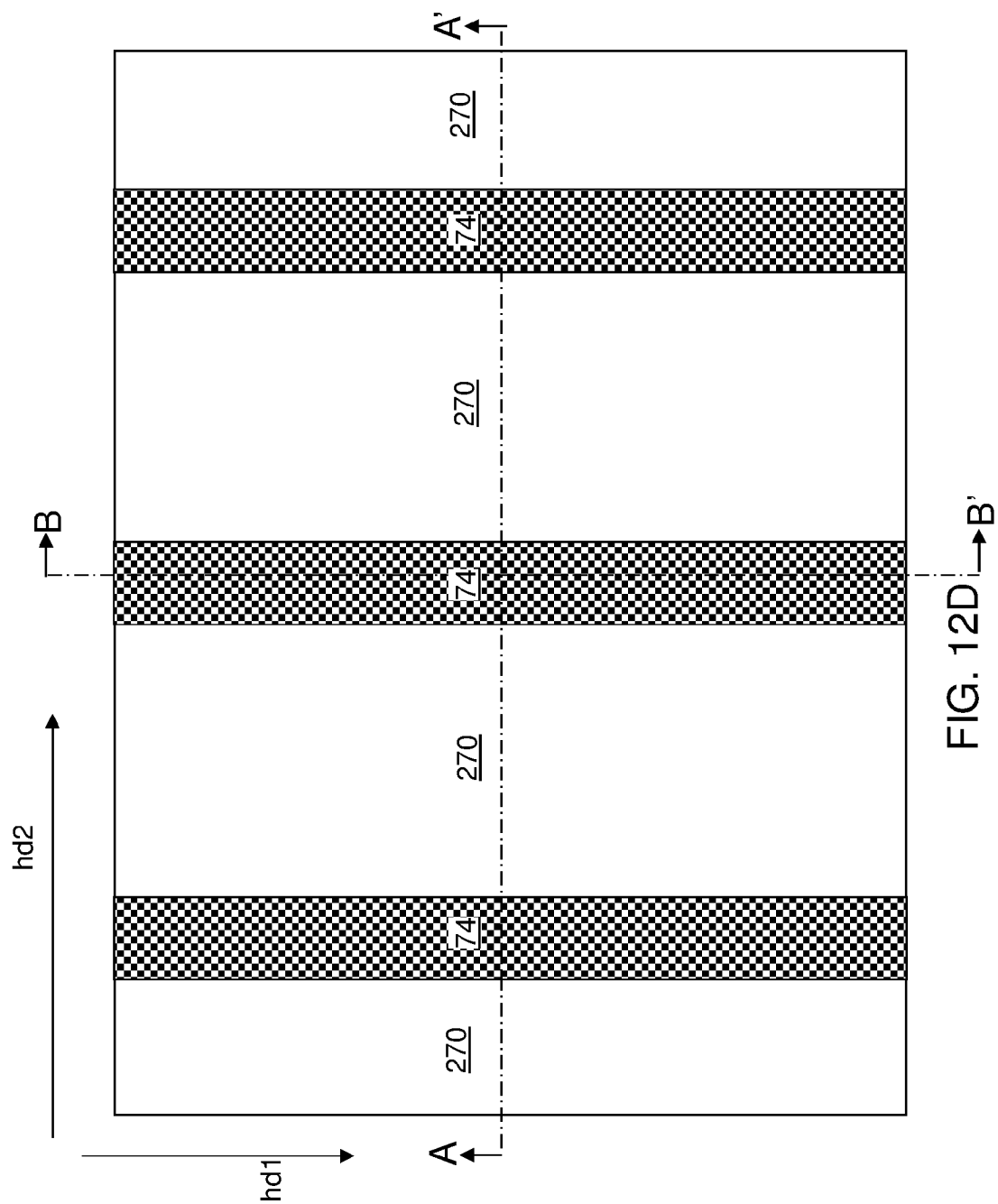
FIG. 12D is a horizontal cross-sectional view of the first exemplary structure of FIGS. 12A and 12B along the horizontal plane D-D'.

Each of the exemplary structures illustrated in FIGS. 15D, 16D, 17D, 18D, and 19D can be incorporated into each exemplary structure illustrated in FIGS. 12A-12C or in FIGS. 14A-14C to provide a three-dimensional memory device. The three-dimensional memory device cam include an alternating stack of electrically conductive layers 30 and insulating layers 60 over the top surface of the substrate 6, where each layer in the alternating stack (30, 60) laterally extends along a first horizontal direction hd1. Semiconductor local bit lines (92, 94) extend perpendicular to the top surface of the substrate 6. The local bit lines may contact sidewalls of the insulating layers 60 within the alternating stack (30, 60) in embodiments where the sidewalls of the insulating layers 60 are exposed in the bit line cavity 47. Resistivity switching memory elements (as embodied as components of the memory-material-containing discrete structure 80 or equivalent portions of a memory-material-containing layer stack 180 in case the memory-material-containing layer stack 180 is not patterned into physically disconnected discrete portions) are located at each overlap region between the electrically conductive layers 30 and the semiconductor local bit lines (92, 94). Each of the semiconductor local bit lines (92, 94) comprises: a plurality of drain regions 94 located at each level of the electrically conductive layers 30, and having a doping of a first conductivity type; and a semiconductor channel 92 vertically extending (e.g., continuously extending in some embodiments) from a level of a bottommost electrically conductive layer 30 within the alternating stack (30, 60) to a level of a topmost electrically conductive layer 30 within the alternating stack (30, 60), and contacting the plurality of drain regions 94 within the semiconductor local bit line (92, 94).

In one embodiment, the three-dimensional memory device can further comprise a plurality of selector elements (as embodied as components of the memory-material-containing discrete structure 80 or equivalent portions of a memory-material-containing layer stack 180 in case the memory-material-containing layer stack 180 is not patterned into physically disconnected discrete portions) located at each level of the electrically conductive layers 30 and contacting a respective resistive memory element (as embodied as a portion of the resistivity switching memory material layer 82 in the first exemplary structure of FIGS. 12A-12D or remaining discrete portions of the resistivity switching memory material layer 82 in the second exemplary structure of FIGS. 14A-14C). Each selector elements can be embodied in different configurations as illustrated in FIGS. 15D, 16D, 17D, 18D, and 19D.

In one embodiment, a combination of a resistive memory element among the resistivity switching memory elements and a selector element among the plurality of selector elements is located at each level of the electrically conductive layers 30. In one embodiment, one of the resistive memory element and the selector element in the combination contacts a respective electrically conductive layer 30, and another of the resistive memory element and the selector element in the combination contacts a respective drain region 94.

In one embodiment, a predominant portion (more than 50% in volume) of each of the drain regions 94 can include first-type electrical dopants at a dopant concentration greater than $1.0 \times 10^{19}/cm^3$, the semiconductor channels 92 can be intrinsic, undoped or includes second-type electrical dopants at a dopant concentration less than $1.0 \times 10^{18}/cm^3$, and the three-dimensional memory device can further comprises global bit lines 10 contacting a horizontal surface of a respective semiconductor local bit line (92, 94) and laterally extending along a second horizontal direction hd2 that is different from the first horizontal direction hd1. Each of the global bit lines 10 can comprise a respective doped semiconductor rail 104 having a doping of the first conductivity type at a dopant concentration greater than $1.0 \times 10^{19}/cm^3$.

In one embodiment, the three-dimensional memory device can further comprise gate dielectrics 90 continuously contacting a respective semiconductor channel 92 from the level of the bottommost electrically conductive layer 30 within the alternating stack (30, 60) to the level of the topmost electrically conductive layer 30 within the alternating stack (30, 60); and gate electrodes 70 laterally surrounded by a respective gate dielectric 90.

In one embodiment, each combination of global bit line 10 comprising a doped semiconductor rail 104, a semiconductor channel 92, a drain region 94, a gate dielectric 90, and a gate electrode 70 constitutes a vertical field effect transistor. The vertical field effect transistor can be a pnp transistor or an npn transistor. Alternatively, the channels can be intrinsic to provide a pip transistor (including p-doped active regions and an intrinsic channel) or an nin transistor (including n-doped active regions and an intrinsic channel). In one embodiment, each of the drain regions 94 can contact respective portions of an outer sidewall of a respective gate dielectric 90.

In one embodiment, a plurality of selector elements can be located at each level of the electrically conductive layers 30 and can contact a respective resistive memory element. Proximal sidewalls of the insulating layers 30 can be more proximal to the gate dielectric 90 than the plurality of selector elements are to the gate dielectric 90. In one embodiment, the resistivity switching memory elements are portions of a continuous dielectric material layer, i.e., the resistivity switching memory material layer 82) that provides a reduced resistivity upon formation of conductive filaments therein. In this case, the continuous dielectric material layer extends from the level of the bottommost electrically conductive layer 30 to the level of the topmost electrically conductive layer 30. In one embodiment, the continuous dielectric material layer physically contacts portions of each drain region.

In one embodiment, an interface between a gate dielectric 90 and a gate electrode 70 can generally extend vertically from the level of the bottommost electrically conductive layer 30 to the level of the topmost electrically conductive layer 30, and can have a laterally undulating profile as illustrated in FIG. 14A. As used herein, an element "generally extends" along a direction if the direction connecting a first distal end of the element and a second distal end of the element are separated along the direction.

In one embodiment, an interface between a gate dielectric 90 and a gate electrode 70 extends along a vertical direction from the level of the bottommost electrically conductive layer 30 to the level of the topmost electrically conductive layer 30 as illustrated in FIGS. 12A, 12B, and 14B.

In one embodiment, the memory elements can comprise a resistivity switching memory material selected from a filament-forming dielectric material providing a reduced resistivity upon formation of conductive filaments therein and vacancy modulated conductive oxide material providing an increased resistivity upon reduction of oxygen vacancy therein.

In one embodiment, each drain region 94 can have a base portion and a laterally protruding portion. An overlying insulating layer 60 can contact a top surface of the laterally protruding portion, and an underlying insulating layer 60 can contact a bottom surface of the laterally protruding portion. The base portion of each drain region 94 can extend above a horizontal surface including a bottom surface of the overlying insulating layer 60, and can extend below a horizontal surface including a top surface of an underlying insulating layer 60. Each drain region 94 can have a greater width at a level of a respective electrically conductive layer 30 than at levels of the overlying insulating layer 60 and the underlying insulating layer 60.

According to another aspect of the present disclosure, the three-dimensional memory device comprises an alternating stack of electrically conductive word line layers 30 and insulating layers 60 located over a top surface of a substrate 6, an adjustable resistance semiconductor local vertical bit line (92, 94) extending perpendicular to the top surface of the substrate 6, resistivity switching memory elements 82 located at each overlap region between the electrically conductive word line layers 30 and the adjustable resistance semiconductor local vertical bit line (92, 94), a gate dielectric 90 located on the adjustable resistance semiconductor local vertical bit line, and a gate electrode 70 located on the gate dielectric. First portions (e.g., drain regions) 94 of the adjustable resistance semiconductor local vertical bit line (92, 94) are located in lateral recesses between adjacent insulating layers 60 in the alternating stack (30, 60). The first portions (e.g., drain regions) 94 of the adjustable resistance semiconductor local vertical bit line that are located in lateral recesses comprise doped semiconductor regions of a first conductivity type, while second portions (e.g., semiconductor channel 92 portions) of the adjustable resistance semiconductor local vertical bit line that are not located in lateral recesses comprise intrinsic, undoped or second conductivity type semiconductor material which contact the gate dielectric 90.

The presence of the drain regions 94 in the structures of the present disclosure has the advantageous effect of increasing the on-current through the semiconductor channels 92 compared to reference structures that do not employ drain regions 94. A doped semiconductor rail 10 functions as a first active region including a doped semiconductor material. Presence of a second active region including a doped semiconductor material as embodied as a drain region provides an increase in the on-current for a vertical field effect transistor than a comparative exemplary switching device in which a non-semiconductor element (such as a memory element or a selector element) is employed as a second active region of a field effect transistor. Without wishing to be bound by any particular theory, it is expected that on-current for the structures of the present disclosure can increase over comparative exemplary structures having similar dimensions and not employing drain regions by at least a factor of about 2~3. The increase in the on-current may be employed to increase the operational speed of the three-dimensional memory device of the present disclosure, or may be traded to scale down the size of the three-dimensional memory device of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
an alternating stack of electrically conductive layers and insulating layers located over a top surface of a substrate;
semiconductor local bit lines extending perpendicular to the top surface of the substrate; and
resistivity switching memory elements located at each overlap region between the electrically conductive layers and the semiconductor local bit lines,
wherein each of the semiconductor local bit lines comprises:
a plurality of drain regions located at each level of the electrically conductive layers, and having a doping of a first conductivity type; and
a semiconductor channel vertically extending from a level of a bottommost electrically conductive layer within the alternating stack to a level of a topmost electrically conductive layer within the alternating stack, and contacting the plurality of drain regions within the semiconductor local bit line.

2. The three-dimensional memory device of claim 1, further comprising a plurality of selector elements located at each level of the electrically conductive layers and contacting a respective resistive memory element.

3. The three-dimensional memory device of claim 2, wherein:
a combination of a resistive memory element among the resistivity switching memory elements and a selector element among the plurality of selector elements is located at each level of the electrically conductive layers;
one of the resistive memory element and the selector element in the combination contacts a respective electrically conductive layer; and
another of the resistive memory element and the selector element in the combination contacts a respective drain region.

4. The three-dimensional memory device of claim 1, wherein:
a predominant portion of each of the drain regions includes first-type electrical dopants at a dopant concentration greater than $1.0 \times 10^{19}/cm^3$;

the semiconductor channel is intrinsic, undoped or includes second-type electrical dopants at a dopant concentration less than $1.0 \times 10^{18}/cm^3$; and the three-dimensional memory device further comprises global bit lines contacting a horizontal surface of a respective semiconductor channel and laterally extending along a second horizontal direction that is different from the first horizontal direction, wherein each of the global bit lines comprises a respective doped semiconductor rail having a doping of the first conductivity type at a dopant concentration greater than $1.0 \times 10^{19}/cm^3$.

5. The three-dimensional memory device of claim 1, further comprising:

a gate dielectric continuously contacting a respective semiconductor channel from the level of the bottommost electrically conductive layer within the alternating stack to the level of the topmost electrically conductive layer within the alternating stack; and a gate electrode laterally surrounded by a respective gate dielectric.

6. The three-dimensional memory device of claim 5, wherein each combination of a global bit line comprising a doped semiconductor rail, the semiconductor channel, the drain region, the gate dielectric, and the gate electrode comprises a vertical field effect transistor.

7. The three-dimensional memory device of claim 6, further comprising a plurality of selector elements located at each level of the electrically conductive layers and contacting a respective resistive memory element, wherein proximal sidewalls of the insulating layers are more proximal to the gate dielectric than the plurality of selector elements are to the gate dielectric.

8. The three-dimensional memory device of claim 7, wherein the resistivity switching memory element is selected from a filament-forming dielectric material providing a reduced resistivity upon formation of conductive filaments, a vacancy modulated conductive oxide material providing an increased resistivity upon reduction of oxygen vacancy therein, or a phase change chalcogenide material.

9. The three-dimensional memory device of claim 5, wherein each of the drain regions contacts respective portions of an outer sidewall of a respective gate dielectric.

10. The three-dimensional memory device of claim 5, wherein portions of the drain regions of the semiconductor vertical bit lines are located in lateral recesses between adjacent insulating layers in the alternating stack.

11. The three-dimensional memory device of claim 10, wherein an interface between a gate dielectric and a gate electrode generally extends vertically from the level of the bottommost electrically conductive layer to the level of the topmost electrically conductive layer, and has a laterally undulating profile, such that at least protruding portions of the semiconductor channel extend into lateral recesses in the gate dielectric and gate electrode.

12. The three-dimensional memory device of claim 5, wherein an interface between a gate dielectric and a gate electrode extends along a vertical direction from the level of the bottommost electrically conductive layer to the level of the topmost electrically conductive layer.

13. The three-dimensional memory device of claim 1, wherein the memory elements comprise a resistivity switching memory material selected from a filament-forming dielectric material providing a reduced resistivity upon formation of conductive filaments therein and a vacancy modulated conductive oxide material providing an increased resistivity upon reduction of oxygen vacancy therein.

14. The three-dimensional memory device of claim 1, wherein each drain region extends above a horizontal surface including a bottom surface of an overlying insulating layer and extends below a horizontal surface including a top surface of an underlying insulating layer, and has a greater width at a level of a respective electrically conductive layer than at levels of the overlying insulating layer and the underlying insulating layer.

15. A method of making a three-dimensional memory device, comprising:

forming an alternating stack of insulating layers and spacer material layers over a substrate;

patterning the alternating stack to form bit line cavities extending through the alternating stack;

laterally recessing sidewalls of the spacer material layers in the bit line cavities with respect to sidewalls of the insulating layers to form lateral recesses;

forming drain regions in the lateral recesses, each of the drain regions being a doped semiconductor region having a doping of a first conductivity type; and forming a semiconductor channel layer in the bit line cavities over the drain regions and over the sidewalls of the insulating layers.

16. The method of claim 15, wherein the spacer material layers are formed as, or are replaced with, electrically conductive layers which comprise word lines.

17. The method of claim 15, further comprising expanding the drain regions by diffusing electrical dopants from the drain region as provided prior to formation of the semiconductor channel layer into adjacent portions of the semiconductor channel layer to convert the adjacent portions into additional doped semiconductor regions having a doping of the first conductivity type, wherein the expanded drain regions are spaced from one another by remaining portions of the semiconductor channel layer.

18. The method of claim 15, further comprising forming a plurality of selector elements at each level of the spacer material layers, wherein each of the plurality of selector elements contacts a respective resistive memory element.

19. The method of claim 18, wherein:

a combination of a resistive memory element among the resistivity switching memory elements and a selector element among the plurality of selector elements is formed at each level of the spacer material layers;

one of the resistive memory element and the selector element in the combination contacts a respective spacer material layer; and another of the resistive memory element and the selector element in the combination contacts a respective drain region.

20. The method of claim 18, wherein:

the semiconductor channel layer is intrinsic, undoped or has a doping of a second conductivity type at a dopant concentration less than $1.0 \times 10^{18}/cm^3$; and a predominant portion of each of the drain regions includes first-type electrical dopants at a dopant concentration greater than $1.0 \times 10^{19}/cm^3$.

21. The method of claim 20, further comprising forming global bit lines laterally extending along a horizontal direction, wherein each of the global bit lines comprises a respective doped semiconductor rail having a doping of the first conductivity type at a dopant concentration greater than $1.0 \times 10^{19}/cm^3$, and the semiconductor channel layer contacts horizontal surfaces of the doped semiconductor rails.

22. The method of claim 15, further comprising:

forming a gate dielectric layer on the semiconductor channel layer in the bit line cavities; and forming gate electrodes gate dielectric layer in the bit line cavities such that each of the gate electrodes is laterally surrounded by a portion of the gate dielectric layer.

23. The method of claim 22, further comprising:
forming global bit lines including a respective doped semiconductor rail over the substrate;
patterning the gate dielectric layer into discrete gate dielectrics; and
patterning the semiconductor channel layer into discrete semiconductor channels,
wherein each contiguous combination of a doped semiconductor rail, a drain region, a semiconductor channel, a gate dielectric, and a gate electrode constitutes a vertical field effect transistor.

24. The method of claim 22, wherein the gate dielectrics are formed directly on surfaces of the drain regions.

25. The method of claim 22, further comprising laterally recessing the sidewalls of the insulating layer selective to the drain regions prior to formation of the semiconductor channel layer such that at least portions of the drain regions protrude into the bit line cavity.

26. The method of claim 25, wherein:
forming the semiconductor channel layer over the protruding portions of the drain regions forms protruding channel portions which protrude into the bit line cavity; and
the protruding channel portions of the semiconductor channel layer extend into lateral recesses in the gate dielectric layer and the gate electrode after forming the gate dielectric layer and forming the gate electrode.

27. A three-dimensional memory device comprising:
an alternating stack of electrically conductive word line layers and insulating layers located over a top surface of a substrate;
an adjustable resistance semiconductor local vertical bit line extending perpendicular to the top surface of the substrate;
resistivity switching memory elements located at each overlap region between the electrically conductive word line layers and the adjustable resistance semiconductor local vertical bit line;
a gate dielectric located on the adjustable resistance semiconductor local vertical bit line; and
a gate electrode located on the gate dielectric;
wherein first portions of the adjustable resistance semiconductor local vertical bit line are located in lateral recesses between adjacent insulating layers in the alternating stack.

28. The three-dimensional memory device of claim 27, wherein:
the first portions of the adjustable resistance semiconductor local vertical bit line that are located in lateral recesses comprise doped semiconductor regions of a first conductivity type; and
second portions of the adjustable resistance semiconductor local vertical bit line that are not located in lateral recesses comprise intrinsic, undoped or second conductivity type semiconductor material which contact the gate dielectric.

* * * * *